United States Patent
Schwartz et al.

(10) Patent No.: US 10,852,341 B2
(45) Date of Patent: Dec. 1, 2020

(54) COMPOSITE FAULT MAPPING

(71) Applicant: Florida Power & Light Company, Juno Beach, FL (US)

(72) Inventors: Eric D. Schwartz, Palm Beach Gardens, FL (US); Ronald A. Capute, Palm Beach Gardens, FL (US)

(73) Assignee: FLORIDA POWER & LIGHT COMPANY, Juno Beach, FL (US)

( * ) Notice: Subject to any disclaimer, the term of this patent is extended or adjusted under 35 U.S.C. 154(b) by 396 days.

(21) Appl. No.: 15/873,122

(22) Filed: Jan. 17, 2018

(65) Prior Publication Data

US 2018/0364295 A1  Dec. 20, 2018

Related U.S. Application Data

(63) Continuation-in-part of application No. 15/625,500, filed on Jun. 16, 2017.

(51) Int. Cl.
*G01R 31/08* (2020.01)
*G01W 1/00* (2006.01)
(Continued)

(52) U.S. Cl.
CPC ....... *G01R 31/088* (2013.01); *G01R 19/2513* (2013.01); *G01R 31/085* (2013.01);
(Continued)

(58) Field of Classification Search
None
See application file for complete search history.

(56) References Cited

U.S. PATENT DOCUMENTS

| 4,839,823 A | 6/1989 | Matsumoto |
| 5,181,026 A | 1/1993 | Granville |

(Continued)

FOREIGN PATENT DOCUMENTS

| AU | 2004205141 | 3/2005 |
| AU | 2010202911 | 7/2010 |

(Continued)

OTHER PUBLICATIONS

Mallikarjun Shankar, John Stovall, Alexandre Sorokine, Budhendra Bhaduri, and Thomas King Jr; Visualizing Energy Resources Dynamically on Earth, 2008, IEEE (Year: 2008).*

(Continued)

*Primary Examiner* — Gregory J Toatley, Jr.
*Assistant Examiner* — Brandon J Becker
(74) *Attorney, Agent, or Firm* — Tarolli, Sundheim, Covell & Tummino LLP

(57) ABSTRACT

Systems and methods to combine line fault location probabilities. A first and second location probability distribution are received for a location of an line fault along an electrical line based upon at least electrical current measurements reported by a first electrical current monitor at a first location and at least a second electrical current measurements reported by a second electrical current monitor at a second location. The second electrical current measurements being made within a time interval of the first electrical current measurements. A composite location probability distribution is determined for the location of the line fault along the electrical line based on an algorithm processing the first location probability distribution and the second location probability distribution. The composite location probability distribution is provided.

19 Claims, 17 Drawing Sheets

(51) Int. Cl.
  *G06T 11/60* (2006.01)
  *G06F 3/0484* (2013.01)
  *G06Q 10/00* (2012.01)
  *G01R 19/25* (2006.01)

(52) U.S. Cl.
  CPC ............ *G01R 31/086* (2013.01); *G01W 1/00* (2013.01); *G06F 3/0484* (2013.01); *G06Q 10/20* (2013.01); *G06T 11/60* (2013.01); *G06T 2200/24* (2013.01)

(56) References Cited

U.S. PATENT DOCUMENTS

| | | | |
|---|---|---|---|
| 5,568,399 | A | 10/1996 | Sumic |
| 5,608,646 | A | 3/1997 | Pomatto |
| 5,712,796 | A | 1/1998 | Ohura et al. |
| 6,477,475 | B1 | 11/2002 | Takaoka et al. |
| 6,549,880 | B1 | 4/2003 | Willoughby et al. |
| 7,180,517 | B2 | 2/2007 | Haynes |
| 7,391,299 | B2 | 6/2008 | Bender et al. |
| 7,529,974 | B2 | 5/2009 | Thibaux et al. |
| 7,627,453 | B2 | 12/2009 | Keefe et al. |
| 7,684,441 | B2 | 3/2010 | Bickel et al. |
| 7,965,195 | B2 | 6/2011 | Deaver, Sr. et al. |
| 8,090,556 | B2 | 1/2012 | Keefe et al. |
| 8,260,489 | B2 * | 9/2012 | Nielsen ............. B60R 1/00 701/32.2 |
| 8,898,278 | B2 | 11/2014 | Bridges et al. |
| 8,972,066 | B2 | 3/2015 | Anderson et al. |
| 9,092,593 | B2 | 7/2015 | Nasle |
| 9,164,663 | B1 | 10/2015 | Berard |
| 9,558,672 | B2 * | 1/2017 | McCann ............. G01W 1/00 |
| 9,939,485 | B1 * | 4/2018 | Johnson ............ G08B 21/182 |
| 10,127,810 | B2 * | 11/2018 | Durie, Jr. ............ G06K 9/00832 |
| 2003/0067881 | A1 * | 4/2003 | Lunt .................. H04M 3/30 370/242 |
| 2003/0158677 | A1 | 8/2003 | Swarztrauber et al. |
| 2004/0158417 | A1 | 8/2004 | Bonet |
| 2006/0161270 | A1 | 7/2006 | Luskin et al. |
| 2008/0125984 | A1 | 5/2008 | Skendzic et al. |
| 2009/0287949 | A1 | 11/2009 | Bradicich et al. |
| 2010/0250440 | A1 | 9/2010 | Wang et al. |
| 2011/0196546 | A1 | 8/2011 | Muller et al. |
| 2012/0004869 | A1 | 1/2012 | Saarinen et al. |
| 2012/0109545 | A1 | 5/2012 | Meynardi et al. |
| 2012/0265502 | A1 * | 10/2012 | Omitaomu ......... H02J 13/0006 703/2 |
| 2012/0310559 | A1 | 12/2012 | Taft |
| 2013/0261829 | A1 | 10/2013 | Liu et al. |
| 2014/0129000 | A1 | 5/2014 | Block et al. |
| 2014/0278162 | A1 | 9/2014 | Riley, Jr. et al. |
| 2014/0343744 | A1 | 11/2014 | Mansfield et al. |
| 2014/0358315 | A1 | 12/2014 | Liu et al. |
| 2015/0094965 | A1 | 4/2015 | Schneider et al. |
| 2015/0160296 | A1 | 6/2015 | Saarinen et al. |
| 2015/0213364 | A1 * | 7/2015 | Bai ..................... G06Q 10/04 706/52 |
| 2015/0276825 | A1 * | 10/2015 | Curt ................... G06F 11/3058 702/58 |
| 2015/0331035 | A1 | 11/2015 | Li et al. |
| 2015/0339930 | A1 * | 11/2015 | McCann ............. G08G 5/006 701/528 |
| 2016/0041216 | A1 | 2/2016 | Tang et al. |
| 2016/0239034 | A1 | 8/2016 | Chan |
| 2016/0291076 | A1 | 10/2016 | Rieken |
| 2016/0349296 | A1 * | 12/2016 | Tsunedomi ........ G01R 21/1331 |
| 2016/0357895 | A1 * | 12/2016 | Hyde ..................... G06F 30/20 |

FOREIGN PATENT DOCUMENTS

| | | |
|---|---|---|
| CA | 2412744 | 12/2001 |
| CA | 2878655 | 7/2009 |
| CA | 2916454 | 7/2016 |
| CN | 101551432 | 10/2009 |
| CN | 104198884 | 12/2014 |
| CN | 104505948 | 4/2015 |
| EP | 2764597 | 8/2014 |
| GB | 2514415 | 11/2014 |
| JP | 01231629 | 9/1989 |
| WO | 2010077830 | 7/2010 |
| WO | 2011056144 | 5/2011 |
| WO | 2013169903 | 11/2013 |
| WO | 2015022501 | 2/2015 |
| WO | 2015120141 | 8/2015 |
| WO | 2016005048 | 1/2016 |
| WO | 2016046996 | 3/2016 |
| WO | 2016070139 | 5/2016 |

OTHER PUBLICATIONS

The U.S. National Lightning Detection Network TM and Applications of Cloud-to-Ground Lightning Data by Electric Power Utilities by Cummins, et. al published in IEEE Transactions on Electromagnetic Compatibility, Nov. 4, 1998.

Cheverst, K., et al., "Developing Interfaces for Collaborative Mobile Systems", Proceedings of the First Workshop on Human Computer Interaction with Mobile Devices, May 1998, pp. 1-15.

Deb, S., et al., "Remote Diagnosis Server", Proceedings of the 19th Digital Avionics Systems Conference, Oct. 7-13, 2000, pp. 1-8.

Lee, J., et al., "Power line communication network trial and management in Korea", International Journal of Network Management, Nov. 2006, pp. 1-15, vol. 16, No. 6.

Ying, M., et al., "3D City Model Supporting for CCTV Monitoring System", International Archives of Photogrammetry Remote Sensing and Spacial Information Sciences, Jul. 2002, pp. 1-4, vol. 34, No. 4.

Zhang, X., et al., "The Design of High-Voltage Cable Partial Discharge On-line Monitoring System Software", Applied Mechanics and Materials, Oct. 2014, pp. 1-4, vol. 672.

Atalik, T., et al., "Multipurpose Platform for Power System Monitoring and Analysis with Sample Grid Applications", IEEE Transactions on Instrumentation and Measurement, Mar. 2014, pp. 566-582, vol. 63, No. 3.

Demirci, T., et al. "Nationwide real-time monitoring system for electrical quantities and power quality of the electricity transmission system", IET Generation, Transmission & Distribution, May 2011, pp. 540-550, vol. 5, Issue 5.

Eren, S., et al., "A Web-based Dispatcher Information System for Electricity Transmission Grid Monitoring and Analysis", Proceedings of the 9th International Conference on Electrical and Electronics Engineering, Nov. 2015, pp. 1-5.

Klump, R., et al., "An Advanced Visualization Platform for Real-Time Power System Operations", Proceedings of the 14th Power Systems Computation Conference, Jun. 24-28, 2002, pp. 1-8.

Zaballos, A., et al., "Heterogeneous Communication Architecture for the Smart Grid", IEEE Network, Sep. and Oct. 2011, pp. 1-8, vol. 25, No. 5.

* cited by examiner

FIG. 8    800

COMPOSITE FAULT MAPPING

RELATED APPLICATIONS

The present is a Continuation-in-Part (CIP) application of U.S. patent application Ser. No. 15/625,500, entitled, "Composite Fault Mapping", filed on Jun. 16, 2017, the entirety of which is incorporated herein by reference.

FIELD OF THE DISCLOSURE

The present disclosure generally relates to monitoring electrical power distribution system operations, and more particularly to locating locations of line faults within an electrical power distribution system.

BACKGROUND

Electrical power distribution systems generally include high voltage electrical conductors that span a geographic area to distribute electrical power to various customers in that geographic area. These electrical power distribution systems also include various monitoring devices and event reporting systems to report occurrences of various events that may affect the operation of the electrical distribution system. Reported events include, for example, indications of power outage in various portions of the electrical distribution system, occurrences of events, such as lightning, in the environment in an area served by the electrical distribution system, other events, or combinations of these. In general, indications of these various different types of events are reported by different systems.

Some types of reported events include events that are likely to have resulted from occurrences of excessive electrical current flow in the conductors of the electrical power distribution system. In some examples, the excess electrical current is caused by a line fault in the electrical conductors. Examples of such line faults include a short circuit or lower impedance path between two electrical phases at a point in the electrical distribution system, or a short circuit or lower impedance path between a conductor and ground at a point in the electrical distribution system.

In order to protect the electrical distribution system and maintain electrical service to as many customers as possible in the event of a line fault, protection devices such as relays or other circuit interruption devices operate when excessive electric current flow is detected to disconnect the conductors in which the excessive electrical current flow was detected. Some of the various monitoring devices perform and report electrical current measurements when an excessive electrical current flow is detected. Different processing of these reported electrical current measurements made by different monitoring devices in some examples is able to provide different estimates of the location of a line fault that caused the excessive electrical current flow. The estimated location of the line fault is generally specified as a probability that a line fault exists at a particular location on a conductor of the electrical distribution system. In general, the different location estimates produced by the different processing of different measurements provide indicate that there is a substantial probability that the line fault occurred over a relatively large portion of electrical conductors of the electrical distribution systems. Due to the uncertainty of the location of the line fault, a physical inspection by service personnel is generally performed over the entire relatively large portion of the electrical conductors to find the exact location of the line fault.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
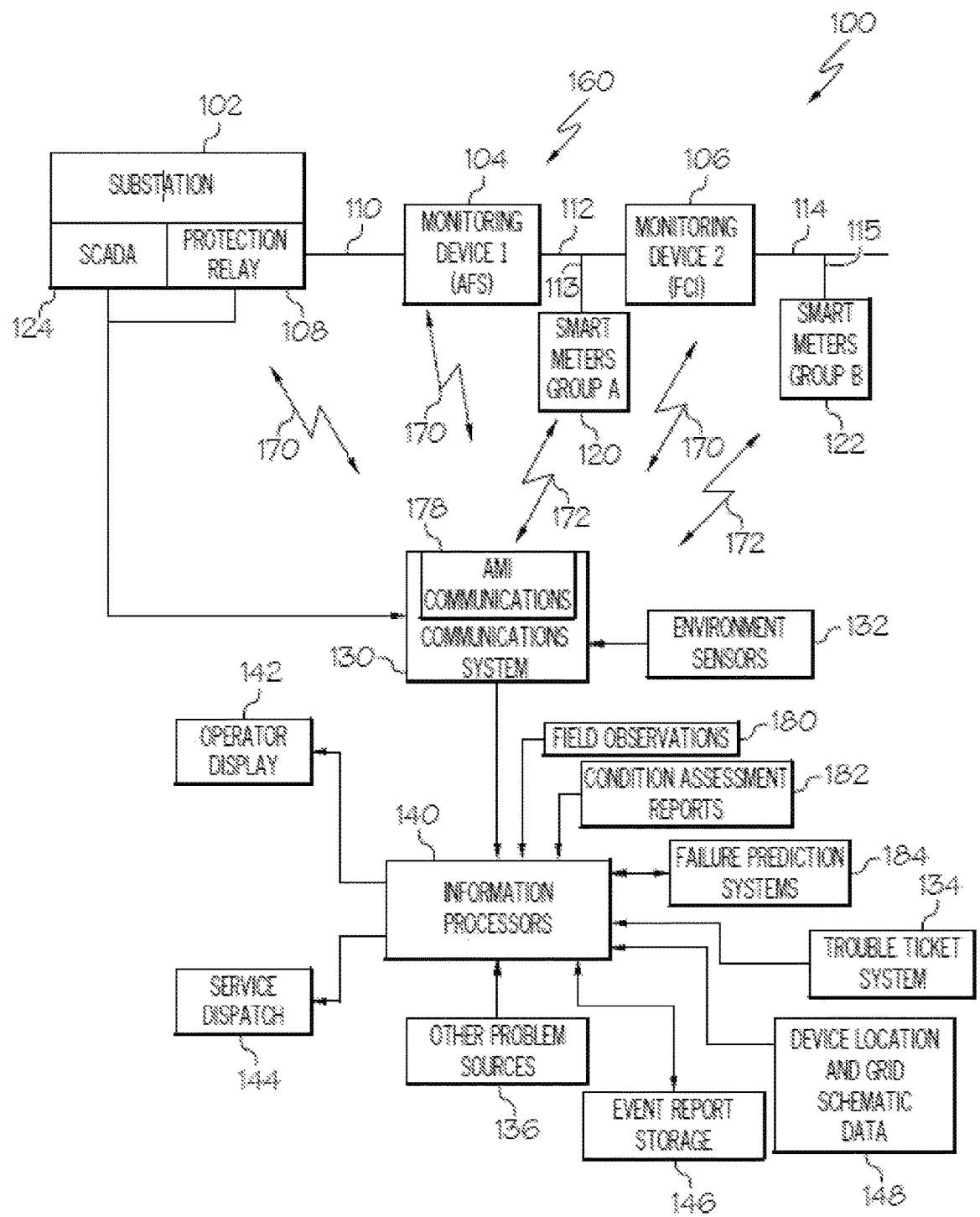
FIG. 1 illustrates an electrical distribution system event processing system, according to an example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The below described systems and methods describe an automated process to receive indications of various monitored events that may affect the operation of an electrical power distribution system, identify events that are associated with one another, and create a unified presentation of those associated events to clearly present relevant information to operations personnel. These systems and methods in an example receive event reports indicating events that occur in an electrical distribution system, and identify associated events indicated by those event reports based upon various criteria. In an example, associated events are able to be identified based upon one or both of a location associated with the event or a time that the event occurred.

In some examples, events are able to be determined to be related with one another by one or more distances between locations associated with each of those events. Such distances between events are able to be distances along various paths between locations associated with the events. In some examples, a distance between events is able to be a straight-line physical geographic path between the geographic locations of the events. In other examples, a distance between two events is defined as a distance along one or more electrical conductor lines of an electrical distribution system that are connecting equipment reporting the two events, which is sometimes referred to as a "schematic distance."

Schematic distances between two electrical distribution components in some examples are able to be further evaluated based upon the characteristics of the electrical conductor lines. For example, schematic distances between two components that are supplied electrical power from different feeder lines may be determined to be greater than schematic distances between two components that are supplied electrical power from the same feeder line, even though the distance along electrical conductors between those two components is the same or less than distances along electrical conductors between components supplied power from different feeder lines.

In some examples, a schematic distance and a geographic distance between two points can be different. In an example, two components of an electrical distribution grid may have a short schematic distance but a relatively long geographic distance compared to differences between geographic distance and schematic distance that are observed between other points in the electrical distribution system. In another example, two such components are able to have a short geographic distance and a long schematic distance. The below described systems and methods in some examples are able to accurately and efficiently processes either or both types of distances to determine, for example, whether events involving two such components are associated with one another.

A geographic location associated with an event is able to be any relevant geographic location that pertains to the event. For example, in the case of an event related to a loss of electrical power along a lateral power distribution line, geographic locations associated with that event may be a location of a device reporting the loss of electrical power on the lateral power distribution line, any location that has the loss of power as determined by any technique, a range of geographic locations that has the loss of power, geographic locations of a loss of power determined by processing performed by devices that monitor and identify power line conditions that indicate a loss of power, other geographic locations pertinent to the loss of power, or combinations of these.

Events are also able to be determined to be related based upon a time interval between occurrences of each event. In some examples, events that occur within a determined time interval are determined to be related, while events that are separated in time by more than that interval are determined to not be related to one another. Various time intervals are able to be used based on various criteria. In an example, two or more events that may indicate an occurrence of a high electrical current fault in the electrical distribution system may be determined to be related if they occur within a relatively short time interval, such as five (5) minutes. In other examples, events may be determined to be related if they occur within relatively long time intervals, such as one day, one week, or longer. In various examples, any time interval is able to be used to determine whether events are related or not. In some examples, an operator is able to specify a particular time interval and all events that occur within that specified time interval are determined to be related and presented to the operator.

In an example, one event is able to be determined to be a selected event. Determination of a selected event is able to be based on any suitable criteria. In various examples, a selected event is able to be based on one or more of an operator selection of a previously reported event, one or more specified sets of criteria that allow automatic selection of a reported event satisfying those criteria as a selected event, other techniques may be used to determine a selected event, or any combination of these. In an example, other reported events are analyzed relative to the selected event to determine which of the other events that are related to the selected event. For example, an operator is able to select one reported event and characteristics of other reported events are compared to that selected event to determine events that are related to the selected event. In various examples, any criteria is able to be used to determine events that are related to the selected event, such as one or more distances between each reported event and the selected event, time intervals between each reported event and the selected event, any other criteria, or combinations of these.

In some examples, characteristics of some or all reported events are able to be analyzed to determine events that are related to one another without regard to a particular selected event. In such examples, a specification of interrelationships between reported events is able to be determined and maintained for some or all reported events. Determining interrelationships between some or all reported events is able to be performed as reports of events are received, based upon processing of stored data associated with event data that had been previously received, or combinations of these.

Identifying events that are determined to be associated with one another allows excluding other events from further processing. In an example, processing of received indications of events is able to determine which events are associated with a particular event and create a presentation that only includes indications of events that are determined to be related to an that particular event. By including only events that are related to a particular event, unrelated events, which may be considered as extraneous information or "noise" in evaluating and analyzing events that affect the operations of an electrical distribution system, are able to be specially marked or excluded from further processing in some examples. In some examples, unrelated events are able to be excluded from presentations of reported events, marked to allow for different weighting in further analyses, handled in any suitable manner, or combinations of these. Various actions are able to be taken based on the set of associated events that are produced by the below described systems and methods, such as more effectively and efficiently identifying problems with particular components of the electrical distribution system, more quickly, effectively and efficiently dispatching service personnel to repair problems, other actions, or combinations of these.

Determining events that are related to each other or to a selected event assists in more effectively and efficiently analyzing patterns of events that indicate problems in an electrical distribution system. In a particular example of reported events indicating momentary power outages in a utilities' electrical distribution system that serves over four million (4 million) customers, more than twelve (12) event data reporting systems report approximately fifteen thousand (15,000) momentary power interruptions in a particular year. Manual identification of reported events within the twelve (12) disparate reporting systems is very time consuming, manpower intensive, and error prone process. Identification and repair of underlying problems with an electrical power grid often requires analysis of reported events that at best indirectly indicate underlying problems. In addition to reported events that reflect or otherwise provide information about a particular underlying problem, the reported events include a large number of unrelated and sometimes distracting reports that an operator must manually evaluate and assess with regards to the underlying problem that personnel are trying to resolve and repair. Rapid restoration and repair of electrical distribution systems is often imperative due to the sometimes dangerous or life threatening conditions that can arise during an electric power outage. A comprehensive determination of related events from among the fifteen thousand (15,000) momentary power interruptions each year is often impractical in the relatively short time span in which underlying problems with an electrical distribution system must be addressed. Allowing personnel to quickly and automatically identify related events in order to focus their analysis on those related events is able to greatly reduce the time required to address underlying problems in a distribution system and improve the efficiency of the operations of an electrical system distribution system by reducing the effort and time required to properly analyze, identify, mitigate, dispatch repair or service crews, otherwise address indicated problems, or combinations of these.

In some examples, many types of events, reports of events, or both, are able to be processed and analyzed to determine associated events. In some examples, one or more systems or various types of equipment report events by sending one or more event reports by various techniques. The various events or event reports are each able to have a particular type that is one of a status event of a piece of equipment of the electrical distribution system, an environmental event, a power distribution system related event, any type, or combinations of these. In some examples, two events are able to be determined to be associated based, at least in part, on the two events having different types, the two events having the same types, the two events having specified types, based on any combination of types, or combinations of these.

In various examples, events are able to be reported via a number of different reporting systems that include monitoring equipment that is part of the electrical distribution grid and also systems that are not connected to the electrical distribution grid. For example, events associated with electrical power delivery to customer premises are able to be detected and reported by elements of a smart grid, or Advanced Metering Infrastructure, system. Some electrical distribution system components are remotely monitored via Supervisory Control and Data Acquisition (SCADA) systems. Some electrical distribution systems include monitoring equipment referred to as Fault Current Indicators (FCI) that automatically detect and estimate the location of electrical faults within the electrical distribution system. Other devices, such as automatic reclosers or Automated Feeder Switches (AFS) detect overcurrent conditions and operate to open electrical circuits to protect the electrical distribution system.

Reported events in some examples include events that are not directly connected with the electrical distribution systems. For example, weather related events are able to be received from various sources and included in the received events to determine if they are related to other events. In some examples, weather events include, but are not limited to, data associated with: lighting, wind measurements; occurrences, warnings, or both, of tornadoes, hurricanes; data forecasting, observing, measuring, or otherwise associated with any one or more of rain, hail, flooding, ice, temperature extremes, earthquakes, or fires. Further, in some examples, events that are analyzed to determined related events are able to include reports of manmade events such as car or aircraft crashes, fire, or other manmade events.

Event reports from various reporting systems are able to be received by any suitable technique. For example, systems and components that are part of a smart grid or Advanced Metering Infrastructure (AMI) system are able to include a communications infrastructure to support efficient communications of event reports for detected events. Fault Current indicators (FCIs) in some examples are able to wirelessly communicate via a smart grid infrastructure or via any suitable communication system or combination of systems. In some examples, Automated Feeder Switches (AFS) communicate via a hardwired communications channel. SCADA systems are able to communicate event reports over any suitable system, such as any combination of dedicated or shared communications systems that are able to include any combination of one or both of wired or wireless communications links.

In one example, the systems and methods described herein are able to receive event reports for various events, identify events that are determined to be associated with one another, exclude events that are determined to not be associated with one another, and support analysis of the associated events to more efficiently identify problems, resolve issues, perform other tasks, or combination of these. In an example scenario of multiple events that may include events, a substation relay is tripped in close time proximity to a lightning strike that hits a tree. The lighting strike causes the tree to fall and the tree shorts a feeder line coupled to and receiving power through the tripped relay, but the tree is located some miles away from the tripped relay. At about that time as the lightning strike, one house that is geographically close to the substation but receiving power through a different feeder line experiences and reports a power outage while a neighboring house does not report a power outage.

In the above example, distant lightning strikes do not typically trip substation relays, but vegetation overgrowth is one of a multitude of expected possible causes for a relay being tripped. In this example, reports for all of these events and also a multitude of other events are received by the processing system. The tripped relay is a status event of a piece of equipment of the electrical distribution system and reported via the utility's SCADA system. The power outage at the house is an event reported via received the utility's AMI system, which is independent of the SCADA system. While the reported power outage at the house occurred at about the same time as the reported relay trip and may be geographically close to the tripped relay, the house is schematically distant from the tripped relay and the processing thus determines that the power outage at the house is not associated with the tripped relay. In this example, the observation that the house reporting the power outage has a neighboring house that still has power may validate the determination that report of the power outage at the house is not associated with the tripped relay.

To continue with the above example, vegetation overgrowth was detected over a week prior to the report of the relay tripping. The detected vegetation overgrowth in this example corresponds to a power distribution system related event reported by one of several other event report systems and corresponds to a report filed by a manned crew visually inspecting for vegetation overgrowth. Even though the vegetation event was reported over a week prior to the relay trip, it is considered close in time because of the nature of the event. Even though the reported vegetation was some miles away from the tripped relay it is considered sufficiently close because schematically it has a distance that is close to the switch. In this scenario, the lightning strike is an example of an environmental event reported by a lightning detection service, such as the National Weather Service, that is independent of the event reporting systems operated by the utility. While the distance between the lightning and the tripped relay is far, the lighting was detected close to the reported vegetation overgrowth, which was determined to be associated with the tripped relay. In this example, the lighting strike is determined to be associated with the tripped relay due to the proximity in time with the relay trip and its geographically close distance to the vegetation. Consequently when analyzing the tripped relay, the information processor may facilitate quickly communicating a presentation to a service dispatcher to check the reported overgrowth vegetation which may have experienced a lightning strike some distance from the relay, while ignoring the outage at the house close in time and geographically close to the relay because the power outage at the house was determined not be associated with the tripped relay. Thus the process is able to analyze a large volume of event reports generated by disparate systems and processes are able to be analyzed more quickly than humanly possible in order to effectively and efficiently associate related events and minimize the duration of power outages experienced by electric utility customers.

In some examples, associated events are able to include event reports received from multiple systems that monitor the operation of electrical distribution systems in order to estimate likely locations of detected line faults in an electrical distribution system. Examples of line faults include, but are not limited to, one conductor for one electrical phase having a short circuit or low impedance path to ground or to a conductor to another electrical phase. In some examples, these multiple systems each determine an estimate of location of a line fault based on measurements made by different types of monitoring equipment and report. Each of these different monitoring and reporting systems in an example determines a probability estimation of the location of a detected line fault at various positions along portions of the conductors of an electrical distribution system. In an example, these multiple systems each report events that include indications of a detected line fault as well as their determined probability estimations at various positions along portions of the conductors of the electrical distribution system.

In an example, the below described systems and methods are able to include an automated process that receives event reports from various monitoring systems that each indicate detected line faults and that each also include location probabilities distributions along conductors of the electrical distribution system, determines that these multiple reports are associated with one another, and combines the locations probabilities in those multiple reports to determine a composite likely location probability of a detected line fault at various positions along the electrical power distribution system. In an example, an electrical distribution system includes a number of processing systems that each provides a "fault map" that indicates probabilities along portions of the conductors of the electrical distribution system that indicate estimates of the location of detected line faults. Each of the systems providing the event reports in an example provides a fault map, either as part of the event report or as data available to the central processing system, that specifies a respective location probability distribution for a location of the detected line fault at each location along some conductors, or lines, in the electrical distribution system. Various fault maps in some examples are produced based upon measured electrical current surge measurements reported by different electrical current monitoring devices. In an example, event reports that include fault maps provided by different monitoring systems are determined to be associated based upon any suitable bases, such as one or more of indicating faults that occurred at about the same time, indicating likely fault locations that overlap locations in the electrical distribution systems, other criteria, or combinations of these.

In some examples, several ranges of probability values are defined and assigned an indicator for the probability of the location of a detected fault at a particular location in the electrical distribution system. For example, probability values between eighty percent (80%) and one hundred percent (100%) are assigned the color "red" as an indicator. In such an example, probability values between sixty percent (60%) and eighty percent (80%) are assigned the color "yellow" as an indicator and probability values below sixty percent (60%) are assigned the color "green" as an indicator. In such a system, a visual map of an electrical distribution system is able to be presented with these three (3) colors superimposed at the respective locations corresponding to the probability that the detected line fault occurred at that location. Such a presentation is able to provide a ready indication of the likely location of a detected line fault.

Different estimated locations for a particular line fault are able to be produced by the various systems used to estimate the locations of detected line faults. Various factors can lead to the different location estimates produced by these different systems. For example, different location estimation systems may receive electrical current measurement data from different devices that are located at different locations of the electrical distribution system. These different measurement devices may also produce different types of electrical current measurement data that support estimating line fault locations with different levels of accuracy. Due to many reasons, a particular line fault occurrence may result in the determination of a number fault maps that provide different probability values of a detected line fault occurring at each location along a conductor.

In some examples, the below systems and methods operate to create a composite fault map for a particular detected line fault. In an example, the composite fault map is based on a combination of fault maps for that particular detected line fault that were produced by various line fault location estimation systems. The composite fault map produced by the below described systems and methods is based on a composite location probability distribution that is produced by those systems and methods and that provides a more refined estimated location of a detected line fault, and thus support reducing the area of the electrical distribution system that has to be physically inspected to find the actual location of the line fault.

Some examples are to a system that overlays weather information onto a map output in a graphical user interface (GUI) to visually associate a weather event with a fault in a power distribution system (e.g., a power grid). Moreover, multiple weather events can be recorded over time, such that after a predetermined period of time (e.g., one year), device performance in inclement weather can be evaluated.

The system receives radar weather reports for radar weather events (e.g., precipitation, hurricanes, tornadoes, etc.), and environmental event reports for other environmental events such as lightning strikes and/or high winds. In some examples, the reports may be provided from an external weather system (e.g., the National Weather Service and/or Schneider Electric). Additionally, the system generates a fault event in response to each detected fault on the power distribution system. The fault event includes a timestamp and a device identifier (e.g., a feeder or lateral) associated with the fault. The system analyzes the radar weather reports and environmental event reports to identify environmental events that are close in time with the fault event. Moreover, the system creates visual indicators of environmental events (e.g., graphic patterns representing high winds, cloud patterns, etc.) that occurred around the same time as the fault. The system overlays the visual indicators on the map in the GUI which includes visual indicators of a portion of the power distribution system (e.g., grid equipment). In this manner, a trouble area for the fault may be reduced to a zone with inclement weather and/or weather events. The reduced area (the zone) can be employed to augment a trouble ticket generated by a ticket system to investigate the fault.

For instance, a feeder may be configured to provide power to a region that is about 20 kilometers (12 miles) long. In such a situation, a fault event for the feeder includes a timestamp of 7 Jul. 2017 at 10:30 a.m. The system can (e.g., in response to user input) identify environmental events occurring at or near 7 Jul. 2017 at 10:30 a.m. The map system overlays visual indicators of the environmental events on a map. In this instance, if precipitation occurred along the feeder, the system can provide information to the ticket system indicating the location of the precipitation. In response, the system can augment (or generate) a trouble ticket for the feeder that includes a location of the precipitation. In this manner, the area of service for the trouble ticket can be reduced from the length of the feeder (20 km/12 miles) to a relatively small zone (e.g., less than about 2 kilometers). Accordingly, a service crew can be dispatched to service the trouble ticket, and the zone of investigation is relatively small, thereby improving the efficiency (and response time) of the service crew.

Additionally, an event report storage can store a fault history for each electrical device in the power grid. The fault history for a given electrical device includes a list of fault events and weather data associated with each of the fault events. In this manner, the system can display multiple maps with different weather events for different faults. From such a view, a user of the map system could see how the electrical device reacts to particular environmental events.

FIG. 1 illustrates an electrical distribution system event processing system 100, according to an example. The electrical distribution system event processing system 100 is an example of a system that performs various methods to receive indications of events, determine events that are associated with one another, and produces sets of indications of associated events that have occurred.

The electrical distribution system event processing system 100 depicts an example electrical distribution system 160. The example electrical distribution system 160 is a simplified illustration of some of the components of electrical distribution systems that are used to support the operations of the below described systems and methods. This simplified illustration is used to provide a more clear and concise description of the relevant aspects of the below described systems and methods. It is clear that the principles and techniques described herein are applicable to any electrical distribution system or other similar systems. As is described in further detail below, some components of the example electrical distribution system 160 detect events and report those events to various information processors 140 via various components of a communications system 130.

The electrical distribution system 160 includes a substation 102 that has a protection relay 108 and Supervisory Control and Data Acquisition (SCADA) equipment. As is generally understood, substation 102 in an example receives electrical power from an electrical transmission or distribution system (not shown) and provides electrical power to distribution system. In the simplified illustration, the substation 102 provides electrical power through the protection relay 108, which in an example is a feeder breaker. The electrical distribution system 160 in this simplified example includes a first feeder line 110 that receives power through the protection relay 108 and provides power to a monitoring device 1 104. The monitoring device 1 104 in this simplified example is an Automated Feeder Switch (AFS) that provides electrical power to a second feeder line 112. In the illustrated example, the second feeder line 112 provides electrical power to a first lateral line 113 and is also connected to a third feeder line 114 through a monitoring device 2 106, which in this example is a Fault Current Indicator (FCI). The illustrated example depicts that the third feeder line 114 provides electrical power to a second lateral line 115 and continues on to provide electrical power to other elements (not shown). As is generally understood, substations in various distribution systems are able to provide electrical power to any number of feeder lines, which in turn are able to be connected to and provide electrical power to any number of lateral distribution lines.

In various examples, the monitoring device 1 104 and monitoring device 2 106 in further examples are able to be any device that monitors events that occur on the electrical distribution lines to which they are connected. In some examples, such monitoring devices are part of, or operate in association with, protection devices for the electrical distribution system 160. Such protection devices are able to include, for example, any one or more of reclosers, Automated Feeder Switches (AFSs), Automated Lateral Switches (ALSs), any protection device, or combinations of these. Further, monitoring devices are able to include any type of monitoring device, such as Fault Current Indicators, various SCADA monitoring and data acquisition equipment, any other type of monitoring device, or combinations of these. In some examples, such monitoring devices are able to be any device that monitors any type of condition associated with an electrical transmission line it is monitoring. In some examples, monitoring devices do not monitor conditions on the electrical transmission lines but rather monitor conditions associated with all or part of the electrical distribution system 160. In some examples, the various monitoring devices send reports of events that indicate their status, such as whether a protection device has opened due to a detected over-current condition. An event report that indicates the status of such a device is an example of a status event of a piece of equipment in an electrical distribution system.

The electrical distribution system 160 includes smart meters group A 120 connected to the first lateral line 113 and smart meters group B 122 connected to the second lateral line 115. As is generally understood, each of these smart meter groups in an example contain a number of smart meters that are each located at various customer facilities. Each smart meter in each of these smart meter groups operate to measure electrical consumption by those customer facilities and to also monitor and automatically report various other conditions, such as loss of electrical power, voltage abnormalities, other events, or combinations of these.

In the present description, the term "upstream" and "downstream" refer to directions along electrical conductors relative to a point in electrical distribution system 160. The term "upstream" refers to a direction along an electrical conductor that is towards a source of electrical power being carried by that electrical conductor. The term "downstream" refers to generally the opposite direction, which is a direction along the electrical conductor that is away from the source of electrical power being carried by that electrical conductor. With reference to the electrical distribution system 160 described above, with regards to the monitoring device 2 106, the second feeder line 112 is upstream of monitoring device 2 106, and the third feeder line 114 is downstream of the monitoring device 2 106. Further, the monitoring device 1 104, the first feeder line 110, and the substation 102, with protection relay 108, are all upstream of the monitoring device 2 106. In that example, the second feeder line 112, monitoring device 2 106, and the third feeder line 114 are all downstream of the monitoring device 1 104, while the first feeder line 110 and substation 102 with protection relay 108 are upstream of the monitoring device 1 104.

The various monitoring devices, such as the above described substation SCADA equipment 124, protection relay 108, monitoring device 1 104, which is an Automated Feeder Switch (AFS), monitoring device 2 106, which is a Fault Current Indicator, and smart meters group A 120 and smart meters group B 122, communicate via various components of the communication system 130 and onto the information processors 140. In the illustrated example, smart meters group A 120 and smart meters group B 122 communicate via Advanced Metering Infrastructure (AMI) communications elements 178. In particular, the substation SCADA equipment 124 and protection relay 108 communicate via a hard wired substation communications link 164 to the communication system 130 and onto the information processors 140. Monitoring device 1 104, which is an AFS, and monitoring device 2 160, which is a Fault Current Indicator (FCI), communicate via a first AMI communications link 170 with the AMI communications elements 178 which are part of the communications system 130 in this example, and onto the information processors 140. In the illustrated example, smart meters group A 120 and smart meter group B 122 communicate via a second AMI communications link 172 with the AMI communications elements 178.

The electrical distribution system event processing system 100 further includes environment sensors 132. In an example, a number of environment sensors 132 are able to be located around the geographical area of the electrical distribution system 160. In general, the environment sensors 132 are able to detect and report occurrences of any type of environmental event, such as any type of weather event or weather related event. In an example, environment sensors 132 are able to detect occurrences of lightning and report occurrences to a central processing system. A lightning strike detected by environment sensors 132 is an example of an environmental event. Measurements of precipitation or other weather phenomena are also able to be sensed by suitable environment sensors 132. In some examples, environmental events are able to be sensed, processed, and reported by various service providers that are independent of a company operating the electrical distribution system 160, the information processors 140, or combinations of those.

The various event monitoring devices in the electrical distribution system 160 are able to report events to a processing system via any one or more communications systems, subsystems components, or other elements of the communications system 130. In various examples, the communication system 130 is able to include one or more communications technologies that allow the various monitors to communicate data with remote devices. In various examples, the communications system 130 is able to include any combination of one or more of wired communications circuits, wireless communications circuits, other communications circuits, or any combination of these. In an example, the communications system 130 is able to include cellular data communications links, wired data communications links, Advanced Metering Infrastructure (AMI) communications elements 178, other elements or links, or any combination of these. In general, the components or elements of communications system 130 are able to be arranged, connected, interconnected, operated in concert with or separately from each other according to any suitable design.

As illustrated for the electrical distribution system event processing system 100, equipment within substation 102, including protection relay 108, monitoring device 1 104, monitoring device 2 106, the smart meters in both smart meter group A 120 and smart meter group B 122, and the environment sensors 132 all communicate via the communications system 130. Although wireless communications links are shown in the illustrated example, such communications lines are able to be implemented in various examples via, for example, any combinations of wired links, wireless links, other links, or combinations of these.

The electrical distribution system event processing system 100 includes information processors 140. The information processors 140 in an example include various processors that perform various processing of data. By way of example and without limitation, the information processors 140 in various examples are able to include any combination of multiple processes execution within one or more physical processors, a number of physical processors that are able to be located at one or more physical locations, any distribution of processing functions, or any combination of these.

The communications system 130 in an example provides data received from the various monitors and other systems to information processors 140. In an example, all reports of events received from any monitor associated with the electrical distribution system 160 are stored in an event report storage 146. In an example, the event report storage 146 stores event histories for various events that occur within the electrical distribution system, such as event histories of known electrical power outages that have occurred. In an example, processing performed by the information processors 140 accesses and processes previously received reports of events that are stored in the event report storage 146 in order to determine events that are associated with each other.

In an example, a device location and grid schematic data storage 148 stores geographical locations of all devices that report events to the information processors 140. In various examples, the device location and grid schematic data storage 148 stores the geographical location, such as in the form of latitude and longitude values, of each device that is able to report events. The device location and grid schematic data storage 148 in some examples further stores descriptions of electrical lines that interconnect each device to other devices in the electrical distribution system. Such interconnection data supports integrating the topology of electrical power interconnections of devices within the electrical distribution grid into analyses of whether events are related to one another. In an example, the device location and grid schematic data storage stores data describing the lengths of conductors connecting various reporting devices in order to support determining the distance along conductors between two devices that report events.

A trouble ticket system 134 creates and manages service trouble tickets used to support and manage operations and repairs of the electrical distribution system 160. As is generally known, trouble tickets are able to be created based upon various inputs, such as customer complaints of a lack of electrical power or of electrical power service irregularities. The information processors 140 in an example receive information regarding trouble tickets, such as listings of open trouble tickets, trouble tickets that indicate occurrences of various events, other information within trouble tickets, or combinations of these. The information processors 140 in an example determine events indicated by various trouble tickets and determines whether such events are related to other events reported by other sources to the information processors 140. In some systems, the information processors 140 are able to include processing to modify, create, or perform other actions with trouble tickets maintained by the trouble ticket system 134. In an example, processing by the information processors 140 is able to determine events associated with a trouble ticket maintained by the trouble ticket system 134 and modify that trouble ticket to indicate that the event or events determined to be associated with the trouble ticket are the cause of the event indicated by that trouble ticket.

A field observations reporting system 180 communicates information regarding observations reported by, for example, field work crews or customers regarding various conditions related to electrical distribution equipment. In an example, the field observations reporting system 180 includes reports received from work crews, other persons such as customers, or other sources, regarding growth of vegetation such as palm trees, bamboo shoots, vines, other growths, or combinations of these.

Other event reporting systems 136 includes other systems that report events associated with the operation, maintenance, other aspects, or combinations of these, of the electrical distribution system 160. The information processors 140 receive or access data associated with events reported by or available via the other event reporting systems 136. The data associated with events reported by or available via the other event reporting systems 136 is processed by the information processors 140 in an example to determine which of those events are associated with each other, are associated with other events reported by various systems, to support other processing, or combinations of these. Events reported by the other event reporting systems are examples of power distribution system related events.

In some examples, related events are able to be determined from events and other data stored in any number of suitable systems. In various examples, data regarding events and other conditions is able to be obtained from one or more systems and presented to an operator for analysis or other purposes. Manual review and evaluation of the large number of data items that are stored in each of a large number of event storage systems is often very time consuming and not practical when working under strict time constraints to restore electrical power or resolve other underlying problems in an electrical distribution system. Examples of systems from which data is able to be obtained include, but are not limited to:

1) Fault maps data from automated fault map generation systems that estimate locations of detected line faults based on device readings, in an example this is an automatic process that is performed whenever such events occur.

2) Lightning or other environmental data organized by various time durations, such as by each day, year, or by other durations, obtained from various sources, including external weather data sources.

3) Lightning or other environmental data indicating lightning activities or other environmental data over a particular time duration, such as year-to-date, obtained from various sources, including external weather data sources.

4) Information gathered in the field regarding vegetation conditions in the field, which is able to be emailed in from users in the field and stored in a database.

5) Vegetation data that is able to be obtained from various sources such as aerial photography, street/ground based photography, other sources, or combinations of these.

6) Open condition assessments from condition assessment data maintenance systems with data obtained from, for example, users in the field that note conditions that need attention.

7) Customer complaint data is gathered through customer service systems and stored in various databases. Such complaints are able to originate from actual logged customer complaints.

8) FCI (Fault Current Indicator) Fault data is retrieved from operations related databases that contain, for example, recordings from the smart devices in the field.

9) AFS (Automated Feeder Switch) Fault data is retrieved from operations related databases that contain, for example, recordings from smart devices in the field.

10) Trouble ticket data is sourced from the operations related trouble ticket systems.

11) The open equipment log data is sourced from, for example, operations related databases and represents equipment that is in need of replacement or repair.

12) Information regarding known momentary power outages or feeder outages is obtained from a various databases and based on actual feeder outage events; or any combination of these.

The condition assessment reports system 182 stores and provides reports indicating condition assessments that are reported by various sources from the field, such as field inspection crews. Condition assessment reports in an example are received and stored in the condition assessment reports system 182 in order to support operations of an electrical distribution system. In some examples, the information processors 140 receive the condition assessment reports from the condition assessment reports system 182 and process those reports to determine events that the condition assessment reports may indicate. The events indicated by these received condition assessment reports are then evaluated by the information processors 140 relative to other received events in order to determine whether they are related to other reported events.

A failure prediction system 184 in an example provides estimations of predicted future times of failure for presently operating equipment. In some examples, the failure prediction system 184 receives reports of equipment operations, such as automatic recloser operations, protection relay operations, other operations, or combinations of these, and estimates when a particular piece of equipment is likely to fail. In an example, the failure prediction system 184 tracks and analyzes the Mean Time Between Failure (MTBF) of various electrical distribution system components or system component health, such as by tracking amount of high $I^2T$ exposure for a particular device. In such an example, the failure prediction system 184 may generate a failure prediction system report that, for example, identifies a device that is statistically close to failing and send that predication as an event to the information processors 140. The predicted failure of that device may then be determined to be associated with other reported events and may serve as an indication that failure of that device is a cause of the other reported events. An example of systems and methods that use various techniques to perform electrical power distribution grid monitoring and failure prediction is described in U.S. patent application Ser. No. 15/002,180, filed Jan. 20, 2016, entitled "Outage Prevention in an Electric Power Distribution Grid using Smart Meter Messaging." The entire contents and teaching of U.S. patent application Ser. No. 15/002,180 is hereby incorporated herein by reference. In one example, in addition to determining associated events among reported event, further processing is able to evaluate reported events along with predicted failures of one or more components of an electrical distribution system in order to more completely provide an operator or other processor with a more complete set of information. In such an example the component predicted to fail may be an underlying cause of other events being reported by monitors within the electrical distribution system.

An operator display 142 in an example presents presentations of data depicting events that are determined to be associated with one another. In various examples, the operator display 142 is able to present lists of indications of events that are determined to be associated with each other, present graphical presentations that indicate relative geographical locations of events that are determined to be associated with one another, present any other type of display of relevant information to support analyses of multiple events that may be associated with one another, or combinations of these. In some examples, the operator display 142 includes various user interface facilities that present information to a user, receive inputs from a user, or both. In an example, the operator display 142 includes user input facilities that allows a user to specify a selection of a particular event to be used as a selected event. In an example, as is described in further detail below, other reported events that are related to that selected event are determined based on various processing. In an example, receiving an input from a user, via the user input facilities of the operator display 142, initiates processing to determine reported events that are related to the selected event specified by the received user's input.

A service dispatch component 144 in an example allows processing within the information processors to initiate service operations on the electrical distribution system. In some examples, at least some of the operations of a service dispatch component 144 are able to be performed via the trouble ticket system 134. In other examples, the service dispatch component is able to support different or additional exchanges of information with service personnel than are supported by the trouble ticket system 134.

Figure 2:
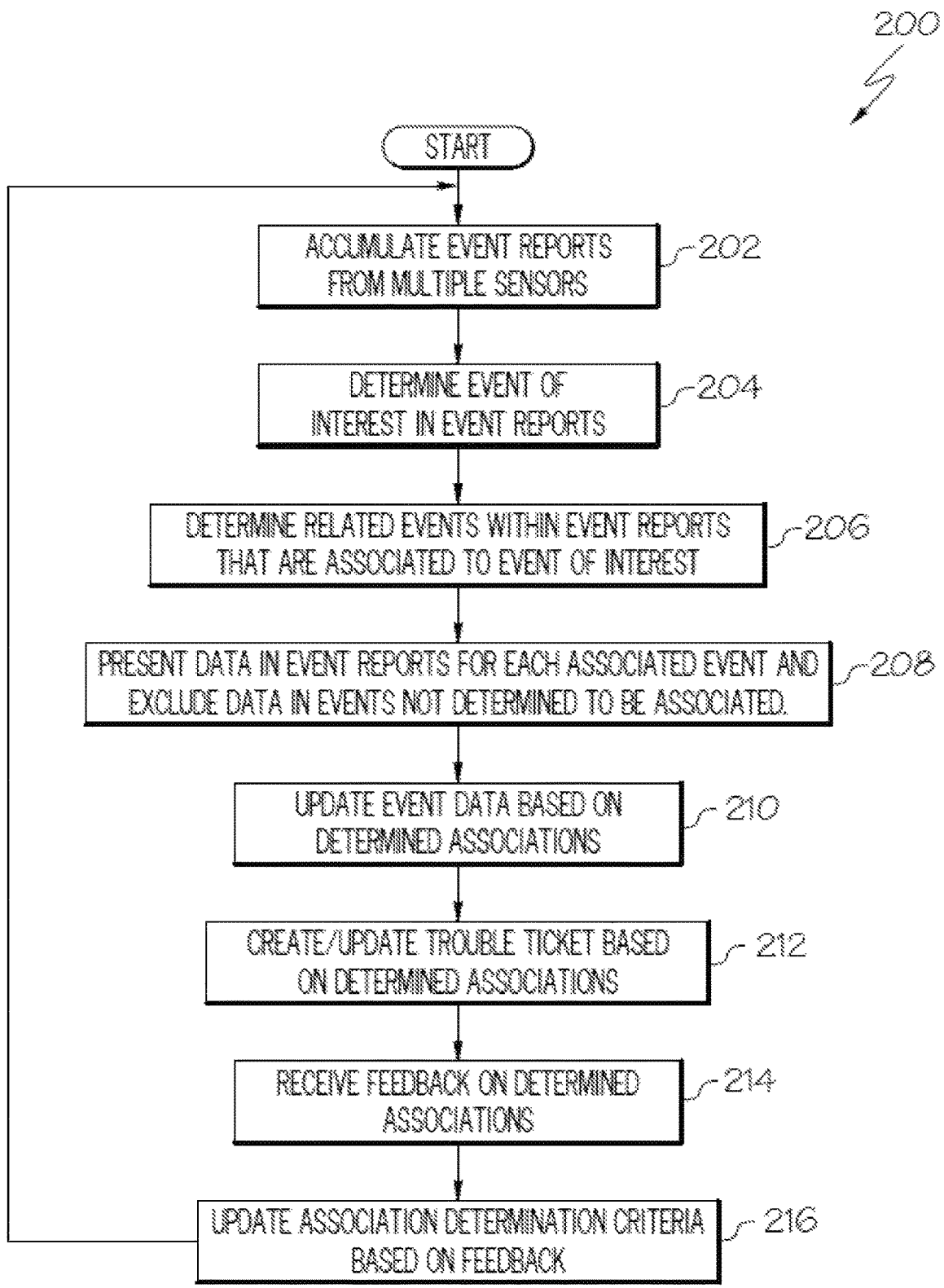
FIG. 2 illustrates an associated event determination process, according to an example.

FIG. 2 illustrates an associated event determination process 200, according to an example. The associated event determination process 200 is an example of a process that determines and identifies events are associated with one another. In the illustrated example, the associated event determination process 200 depicts determining events that are associated with an event of interest. The illustrated processing depicts determining events that are associated with one event of interest in order to simplify the description of relevant aspects of this processing. In further examples, similar processing is able to determine associated events for any number of reported events, including determining associated events for all events.

The following description of the associated event determination process 200 refers to the components described above with regards to the electrical distribution system event processing system 100. The associated event determination process 200 is an example of a process that is performed on the information processor 140 based upon data received from multiple sources, such as by reporting devices sending reports via the communication system, from other systems such as from the trouble ticket system 134, from other systems or sources, or combinations of these.

The associated event determination process 200 begins by accumulating event reports from multiple sources, at 202. In various examples, reports indicating various events are received from various sources through the communication system 130 discussed above. These received reports in an example are stored in the event report storage 146. In various examples, accumulating event reports is able to include retrieving event reports from the event reports stored in the event report storage, include processing event reports as they are received from various devices, any other receiving or retrieving of event reports, or combinations of these. Additionally, indications of events in various examples are able to be received from any source. Accumulating event reports is an example of receiving a first event report indicating a first event, a second event report indicating a second event that is different from the first event, and receiving a third event report indicating a third event that is different from the first event and the second event. In some examples, at least one of the events indicated by an event report is able be at least one of a status event of a piece of equipment of the electrical distribution system, an environmental event; or a power distribution system related event.

An event of interest in one example is determined, at 204. Determining an event of interest is able to be performed by any suitable technique. For example, an operator is able to select one event as an event of interest from among various events that are reported. Receiving a selection from an operator of an event and using that selected event as an event of interest is an example of receiving a selection of a selected event from within a plurality of events indicated by a respective plurality of event reports, and defining, based on the selection, the selected event as the first event.

In some examples, an event of interest is able to be determined based upon a type of an event that was received. For example, a process may be configured to determine that certain types of reports are indications of events of interest. In an example, a report that a protection relay opened due to an over-current at a substation is able to be defined as an indication of an event of interest. When a report that a protection relay has opened, the associated event determination process 200 responds by determining that the opening of the protection relay is an event of interest.

The associated event determination process 200 continues by determining, at 206, events within the received event reports that are associated with the event of interest. Determining which events are associated with the event of interest is able to be performed by any one or by any number of suitable techniques or criteria. In some examples, events associated to the event of interest are determined by comparing data describing events that are described in received reports to data describing the event of interest.

The comparisons in various examples are able to be based on various criteria. In some examples, associated events are able to be defined as any event that occurred within a specified time period of the event of interest and that are also within a certain distance of the event of interest based on a geographic location associated with the event of interest and associated with the event being evaluated. In some examples, events are determined to be associated with one another if they are within a certain distance along electrical distribution lines, i.e., schematic distances, that connect the devices that are reporting the events. In some examples, events are able to be determined to be associated with one another based upon combinations of relationships, such as proximity between the two events in one or more of either time, distance, or combinations of these. In an example, a first event and second event may be determined to be associated with one another based on both time differences and distances between the two events both being below respective thresholds. In that same example, the first event may be determined to not be associated with a third event where the time differences between the first event and third event is below a time difference threshold, but the distance between the first event and third event is greater than a distance threshold.

In some examples, the associated event determination process 200 is able to determine whether events are associated with one another, at 206, based on different criteria. In an example, events are determined to be associated with one another if they are within a certain geographic area and occur within one minute of each other. In another example, events are determined to be associated with one another if they are within a certain geographic area and occur within one hour or other specified time interval of each other. In some examples, determining events associated with an event of interest determines only events that occur within a specified time interval before the event of interest. In an alternative example, determining events associated with an event of interest determines only events that occur within a specified time interval after the event of interest.

In some examples, a first event and a third event are able to be determined to be associated with one another based upon relationships between those two events and a second event that is separate from those two. Such an association is able to be determined in an instance where an analysis of the data associated with the first event and the third event would indicate that the first event and the third event are not associated with one another. In an example, a first event is associated with a third event based upon a determination of an association between the first event and the second event, and further based upon a determination of an association between the second event and the third event.

Data in events reports for each of the determined associated events is presented, at 208, while the presentation excludes data in events that were determined to not be associated. The presentation in various examples includes visual presentations, providing data to another process for further processing, assembling statistics, providing the data to any data recipient process or display, any other type of presentation, or combinations of these. In some examples, data is graphically presented in a manner that indicates a geographical relationship between and among the event of interest and the determined associated events. In an example this grouping allows a visual analysis of the interrelationships among the events that are determined to be associated with the event of interest.

In an example, data about the reported events is updated, at 210. In various examples, further data about a particular event is able to be determined based upon characteristics of events that are determined to be associated with that particular event. For example, multiple reports of power outages, such as are reported by smart meters, that occur within a specified time interval of a report of a line fault on a feeder line that is upstream of the smart meters reporting the power outage allows data concerning the reported power outages to be updated to indicate that the cause of the power outage is the reported upstream line fault.

In another example, analysis of data within a report of an occurrence of a lightning strike that occurs within a time interval before and geographically near a reported power outage event supports an inference that the lightning strike likely caused the reported power outage. In such an example, a report of the power outage, such as a trouble ticket that reported the power outage, is able to be updated to reflect that the lightning strike was the cause of the reported power outage.

In an example, a trouble ticket is able to be created or updated based on the determined associations, at 212. In an example as described above of multiple reports of power outages that occur within a specified time interval of a report of a line fault on a feeder line that is upstream of the smart meters reporting the power outage, a trouble ticket for the line fault is able to be created to repair the line fault. In an example, trouble tickets created for the power outages reported by the smart meters are able to be updated to indicate that the line fault is the cause of those power outages and repair of the line fault is likely to resolve those trouble tickets.

In an example, feedback is received, at 214, on the determined associations. In some examples, feedback is able to be received in various forms. In some examples, an operator is able to provide feedback that specifies whether an event that was determined to be associated with the event of interest is not really associated, or whether an event that was determined to not be associated should have been determined to be associated with the event of interest. In another example, a user of the presented data is able to, for example, associate some events as being more closely related to the event of interest. In some examples, an operator is able to identify that the event of interest was at least a partial cause of another reported event. For example, an event of interest may be a detected lightning strike, and associated events may be loss of electrical power in the geographical area of the lightning strike. In such an example, an operator may judge that the lightning strike is at least partially a cause for the nearby loss of electrical power.

Based upon this received feedback in some examples, criteria for determining associated events are updated, at 216. For example, criteria such as the maximum geographical distance between two associated events is able to be adjusted based on the geographic distance between two events that received feedback indicates are associated with each other. Similarly, the maximum time differences between events that are to be determined to be associated with one another are able to be adjusted based on time differences between events that feedback indicates are associated with one another.

In an example, the associated event determination process 200 returns to accumulating event report from multiple sources, at 202. The above described processing is then re-iterated. In various examples, iterations of the associated event determination process 200 are able to be executed where different events of interest are able to be determined, such as being selected by an operator, and events associated with those different events of interest are then identified.

Figure 3:
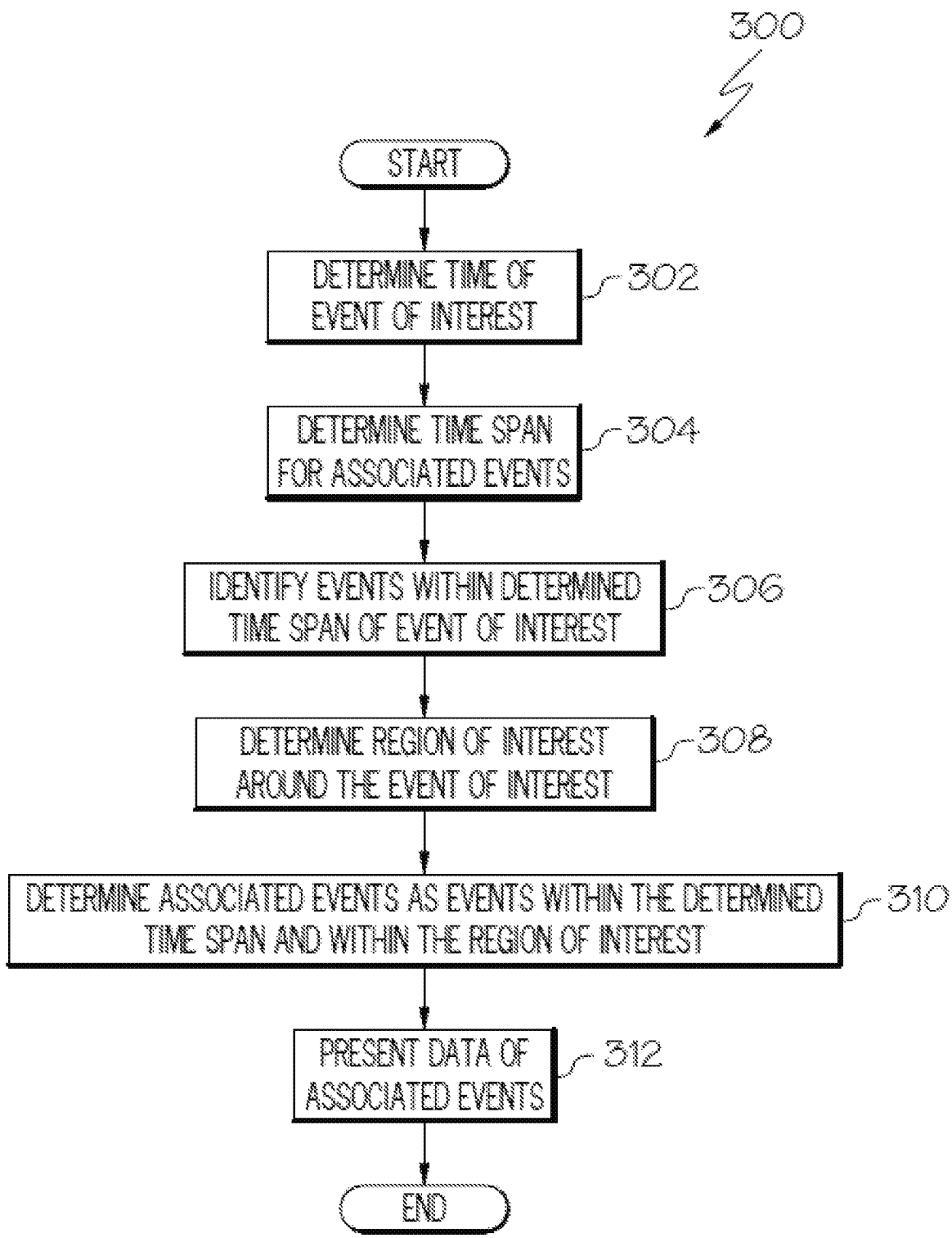
FIG. 3 illustrates a time and location associated event determination process, according to an example.

FIG. 3 illustrates a time and location associated event determination process 300, according to an example. The time and location associated event determination process 300 is an example of a process performed as part of the above described associated event determination process 200. With reference to the above description, the time and location associated event determination process 300 is an example of processing included in determining related events within event reports that are associated with events of interest 206.

The time and location associated event determination process 300 determines, at 302, a time associated with the event of interest. As described above, the event of interest is able to be determined by any suitable technique. In some examples, the event of interest is specified by an operator or by another automated process controlling the operation of processes that determine associated events. In various examples, a report of an event that is determined to be the event of interest specifies a time associated with the event. In some examples, this time is a time at which the event occurred. In further examples, this time is a time during which the event occurred, a time at which the event stopped, any other time associated with the event of interest, or combinations of these. In some examples, a time of an event of interest is able to specify a time span over which the event of interest occurred, a time span over which the event of interest affected operations of any system, other time spans, or combinations of these.

A time span for related events is determined, at 304. The time span for associated events in an example is the time span over which to search for events that may be associated with the event of interest. In some examples, a determined time span is able to be one minute, one hour, one day, another interval of time, or any combination of these. In an example, events occurring outside this time span are determined to be not associated with the event of interest. In some examples, the time span is determined based upon a specification by an operator of the time span of interest around the determined event of interest that may contain events of interest. In some examples, this time span is able to be based upon the type of event that is determined to be an event of interest. For example, time spans for events associated with an event of interest such as a lightning strike may be one minute, while time spans for events associated with an event of interest such as a particular trouble ticket that indicates a facility does not have power may be longer, such as ten (10) minutes, one hour, other intervals, or combinations of these. In some examples, the time span is able to be a time interval of the determined duration that occurs before the above determined time associated with the event of interest, a time interval of the determined duration that occurs after the above determined time associated with the event of interest, a time interval that spans both before and after the above determined time associated with the event of interest, a time interval that has any temporal relationship to the above determined time associated with the event of interest, or any combination of these.

Events that occur within the determined time span (e.g., a threshold time difference) of the event of interest are identified, at 306. In an example, such events are identified by examining received reports of events and identifying each event that occurred within the determined time span. In some examples, times associated with events are specified or otherwise indicated within the received reports for various events.

A region of interest around a location associated with the event of interest is determined, at 308. The size of a region of interest around locations associated with an event of interest (e.g., a threshold distance) is able to be determined based on any criteria. In some examples, the region of interest is specified as a geographic area around the event of interest. In some examples, that geographic area is able to have its boundaries specified by any suitable technique, such as by the latitude and longitude values of those boundaries. In some examples, the region of interest is specified according to distances along electrical distribution lines, i.e., schematic distances, that connect to the device reporting the event of interest by less than a specified length.

In an example, associated events are determined, at 310, where the associated events are events that occur within the determined time span and within the region of interest. In some examples, events are determined to be associated or not associated based on proximities of the events to one another, where the proximity is able to be one or more of a time difference, schematic distance, a geographic distance, or combinations of these. In an example, determining associated events consists of processing each report of events that are received from all reporting systems and excluding events that occurred outside of the determined time span (e.g., a threshold time difference) and outside of the determined geographic area. In some examples, events that are within the determined geographic area are determined based upon identifying a location within the electrical distribution system of the device that reported the event of interest, and then identifying reports of candidate events that are received from devices connected along electrical distribution lines to the device that reported the event of interest by less than a specified distance (e.g., a threshold distance). In various examples, the specified distance is able to be specified by any suitable technique, which may include a number and/or type of intervening devices or grid elements, or the length of the conductors of the electrical distribution system that connect the device reporting the candidate event to the device reporting the event of interest. Distances along conductors connecting devices in the electrical distribution system are referred to herein as distances according to the electrical power line routings. In an example, these conductors are also able to connect with other devices that also report events. In an example, events that are reported by devices that are in either direction along the conductors of the electrical distribution systems, i.e., devices that are either upstream or downstream of the device reporting the event of interest, are considered. In further examples, devices that are only upstream, or only downstream, of the device reporting the event of interest are considered. In various examples, the determined geographic area is a maximum length of conductors connecting devices reporting candidate events to the device reporting the event of interest, the determined geographic area is a geographical boundary specified by, for example, latitude and longitude values, the determined geographic is any suitable geographic boundary, or the determined geographic boundary is able to be any combination of these.

The data of the associated events is then presented, at 312. This presentation is an example of the presenting data event reports, at 208, as described above. This presentation is able to include any action conveying any data associated with the determined associated events, including visual presentation, electronic communication of any data associated with determined associated events to another process or device, any other communications of any data associated with determined events, or any combination of these. The time and location associated event determination process 300 then ends.

Figure 4:
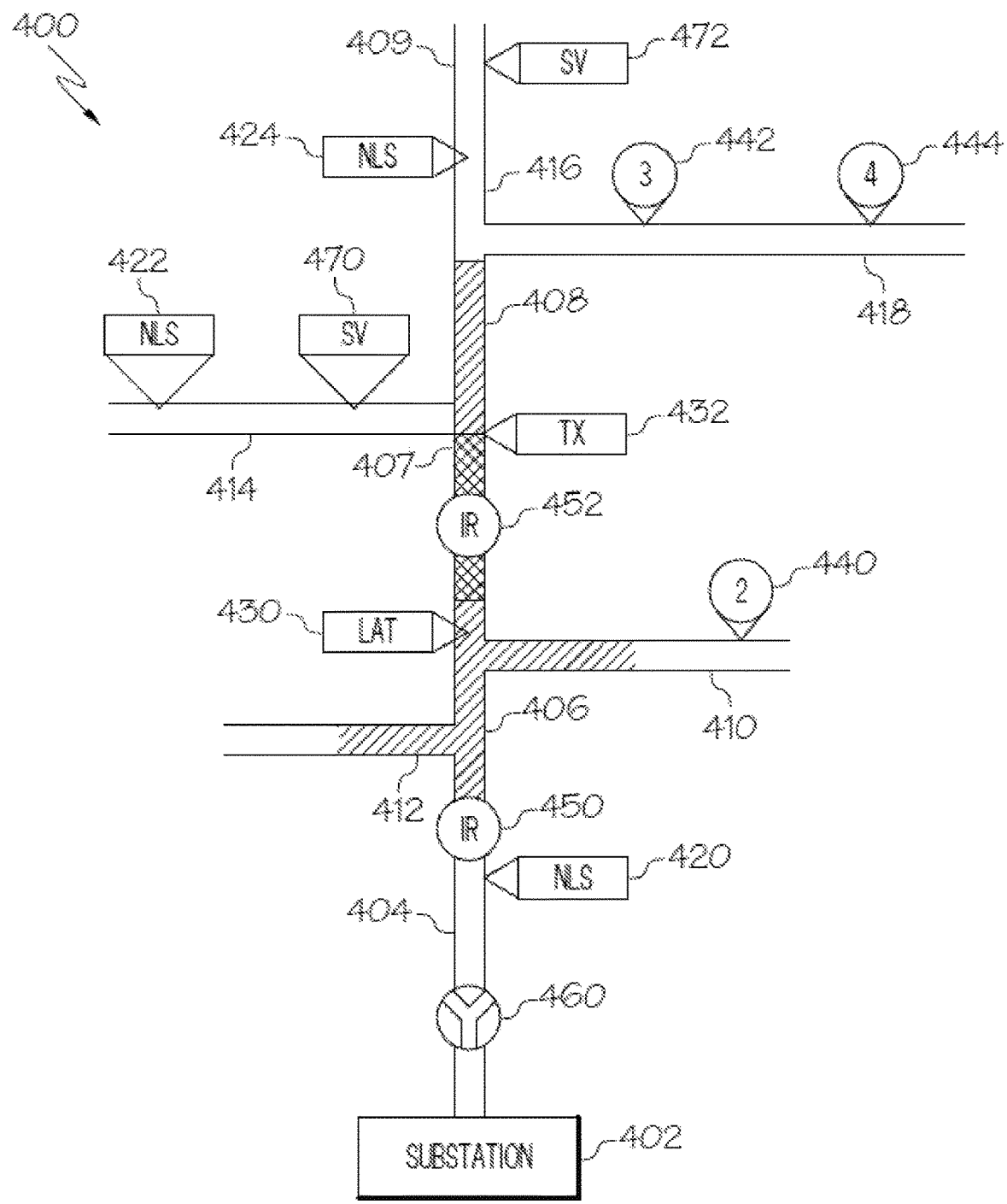
FIG. 4 illustrates an example user interface, according to an example.

FIG. 4 illustrates an example user interface 400, according to an example. The example user interface 400 illustrates portions of a simplified electrical distribution system and reported events that have been determined to be associated with one another. The example user interface 400 depicts associated reported events and components of the portion of the electrical distribution system that are within the geographic bounds at the edges of the example user interface 400. The example user interface 400 is an example of a display presented to, for example, a user on a workstation such as the above described operator display 142. The example user interface in an example is produced by the above described information processor 140 based on various reported events that are obtained from any of a variety of sources. The example user interface 400 depicts a subset of those reported events that have been filtered based on various criteria to determine which events are related to one another. As described above, such filtering is able to be based on a time frame of when the events occurred, distances between the events, other criteria, or combination of these.

The example user interface 400 depicts a simplified electrical distribution network that includes a substation 402, various portions or segments of a single feeder line that receives electrical power from the substation, and several lateral lines that are connected to and that receive power from that feeder line. In further examples, a similar user interface is able to present all of the relevant elements of the electrical distribution system being monitored or analyzed, which often include multiple feeder lines and many lateral lines.

The example user interface 400 includes indications of likelihoods that a detected fault condition is located at various portions of the depicted feeder line and lateral lines. In an example, the detected fault may be a reason why an operator would choose to view related events. In an example, a particular event within all reported events, such as the operation of an Automated Feeder Switch ("AFS") that indicates a line fault, is able to be selected by an operator and all events related to that selected event are depicted on the user interface. In general, analysis of occurrences and causes of any condition, such as any type of line fault, any type of distribution system abnormality, other condition, or combinations of these, is able to be facilitated by use of a user interface similar to the depicted example user interface 400.

The substation 402 in this example provides electrical power to a first feeder line segment 404. The first feeder line segment 404 has a first fault current indicator 460. A Fault Current Indicator (FCI) 460 monitors the electrical current that flows through that device and processes data measured during detected overcurrent events to estimate a location of an electrical fault that may have caused the detected overcurrent event. The first feeder line segment 404 further has a first trouble ticket indication 420, which reads "NLS" to indicate it is a "No Loss of Service" trouble ticket. A first "Automated Feeder Switch" ("AFS") or "IntelliRupter" ("IR") 450 is depicted as connecting the first feeder line segment 404 to a second feeder line segment 406.

In this example, automated processing of overcurrent events processes data contained in event reports that was collected in association with detected faults to estimate the location of that detected fault. Estimated fault location data in some examples provide probability values that indicate, at various points along conductors of an electrical distribution system, whether the detected fault had occurred at that particular point. The example user interface 400 depicts, as is described in further detail below, a composite fault map for the portion of the electrical distribution system that it depicts. In an example, the depicted composite fault map indicates a respective composite line fault likelihood value for each displayed point or line segment. In the example user interface 400, displayed portions of the electrical distribution system include single crosshatched portions to indicate segments with a medium likelihood of being the location of a detected line fault. The example user interface 400 also includes double crosshatched portions to indicate segments with a high likelihood of being the location of a detected line fault. Areas without crosshatching indicate segments with a low likelihood of being the location of a detected line fault.

In various examples, as is also described in further detail below, such portions of the fault maps, including composite fault maps, of an electrical distribution system are able to be depicted with different colors, such as portions of distribution lines in red indicating an extremely high likelihood of a fault, portions in orange indicating a very high likelihood of a fault, portions in yellow indicating medium high likelihood of a fault, and lines with a low likelihood of being a location of a fault being depicted in different colors. In some examples, different portions of distribution lines that are determined to have a low likelihood of being a location of a detected fault are depicted in various different colors to allow a viewer to easily visualize and distinguish different lines, such as different feeder line segments or lateral lines, according to the geographical layout and design and of the particular electrical distribution system.

The second feeder line segment 406 depicted in the example user interface 400 is depicted as having a single cross hatch pattern and is show to be connected to, and thus able to provide electrical current to, a first lateral line 412 and a second lateral line 410. The first lateral line 412 is also depicted with a single crosshatch to indicate that there is a medium likelihood that a detected fault is located on the first lateral line 412. The first lateral line 412 further includes a second AFS 462.

A portion of the second lateral line 410 is depicted with a single crosshatch to also indicate that there is a medium likelihood that a detected fault is located on the second lateral line 410. A second trouble ticket 430, which reads "LAT" to indicate it is a "lateral" trouble ticket, is depicted near the junction of the second feeder line segment 406 and the second lateral line 410. The second lateral line 410 also includes a first condition assessment 440, which indicates that an inspection of the second lateral line 410 produced an assessed condition severity of "2."

A third feeder line segment 407 is depicted with a double crosshatch to indicate that there is a high likelihood that a detected fault occurred in this portion of the feeder line. The third feeder line segment 407 further includes a second AFS or "IntelliRupter" 452, which operates in a manner similar to that of a recloser. The third feeder line segment 407 in this example extends to a junction of a third lateral line 414, where the feeder line continues as a fourth feeder line segment 408.

The fourth feeder line segment 408 is depicted with a single crosshatch to indicate a medium likelihood that a detected fault has occurred in this segment of the feeder line. A third lateral line 414 is depicted as having no crosshatching, thus indicating that there is a low likelihood of the detected fault having occurred in the third lateral line 414.

In the illustrated example user interface 400, a depiction of a composite fault map that shows medium or high likelihood that a line fault occurred in the second feeder line segment 406, the first lateral line 412, the second lateral line 410, the third feeder line segment 407, and the fourth line feeder segment. These segments are depicted in this example with crosshatching indicating either a medium or high likelihood that a detected fault has occurred those segments. In some examples, the other depicted segments that are not shown with crosshatching are also part of a composite fault map but are depicted to indicate a low, but not necessarily zero, probability that a detected line fault has occurred in those segments.

A third trouble ticket 432 near the intersection of the third lateral line 414 and the feeder line. The third trouble ticket 432 reads "TX," which indicates it is a transformer trouble ticket. The third lateral line 414 also has a fourth trouble ticket 470 which reads "SV," indicating that it is a "Service" ticket, and an fifth trouble ticket 422 which reads "NLS" indicating it is a "No Loss of Service" trouble ticket.

A fifth feeder line segment 409 is depicted without crosshatching to indicate a low likelihood that the detected fault occurred in this segment of the feeder line. The fifth feeder line segment 409 includes a fifth trouble ticket 424 that reads "NLS" to indicate it is a "No Loss of Service" trouble ticket, and also has a sixth trouble ticket 472 that reads "SV" indicating it is a "Service" ticket. A fourth lateral line 418 is connected to, and thus received electrical power from, the fifth feeder line segment 409. The fourth lateral line 418 has a second condition assessment 442, which indicates a severity of "3," and a third condition assessment 444, which indicates a severity of "4."

Figure 5:
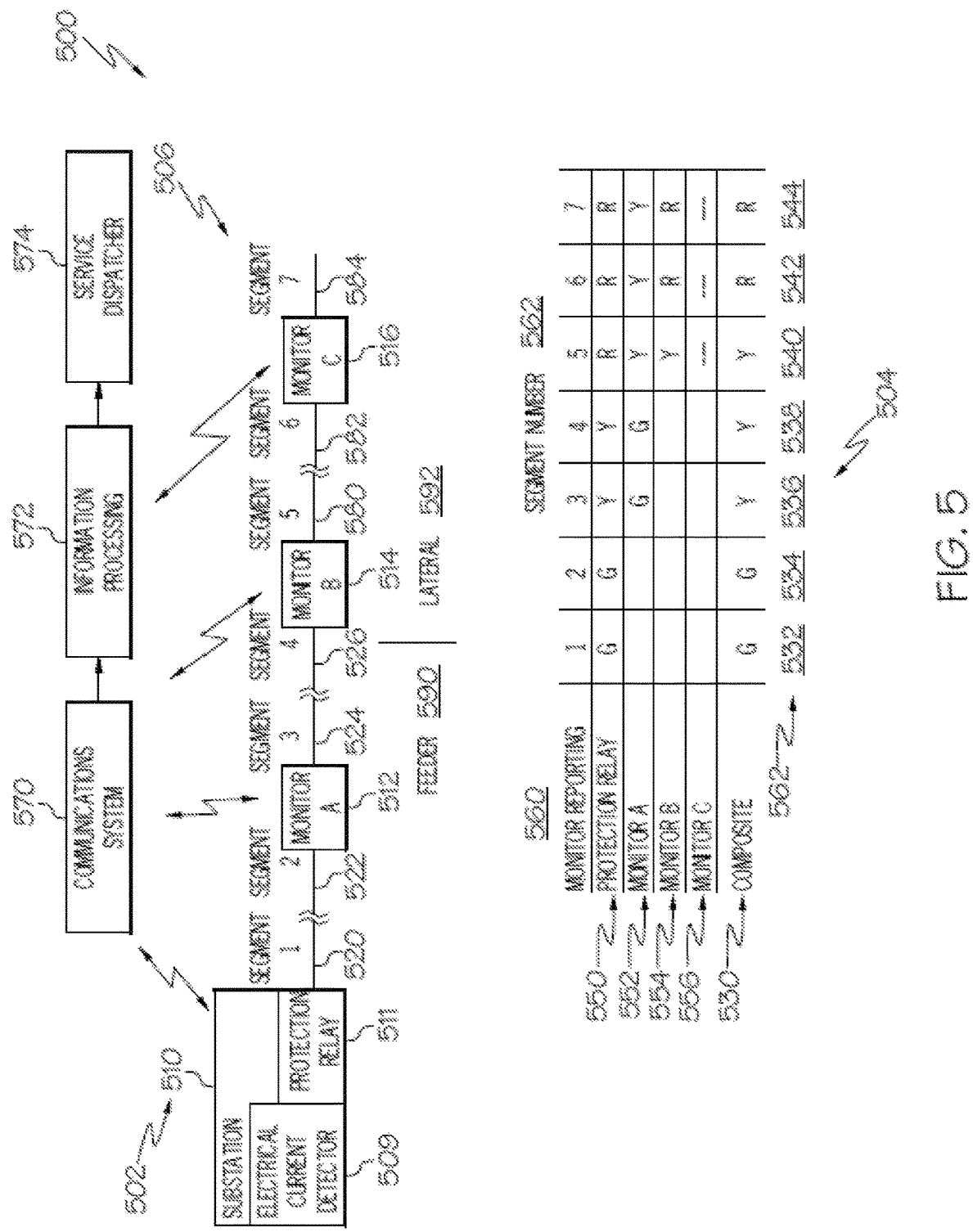
FIG. 5 illustrates an electrical distribution system and line fault location estimation table, according to an example.

FIG. 5 illustrates an electrical distribution system and line fault location estimation table 500, according to an example. The electrical distribution system and line fault location estimation table 500 depicts a simplified electrical distribution system 502 and a line fault location estimation table 504. The present description uses a simplified electrical distribution system 502 is similar to the above described example electrical distribution system 160 and includes components to help more clearly and concisely describe the relevant aspects of the below described examples associated with creating composite fault maps based on a number of event reports that each provide estimated locations of fault locations along electrical conductors of an electrical distribution system. Some components of the simplified electrical distribution system 502 correspond to similar components of the example electrical distribution system 160 described above. It is clear that the principles and concepts described below can be readily applied to electrical distribution systems of any complexity.

The simplified electrical distribution system 502 depicts a substation 510 and an electrical distribution line 506 with a number of monitors distributed along that electrical distribution line 506. In an example, the substation 510 is able to be similar to the above described substation 102. The illustrated electrical distribution line 506 is an example of an electrical line that has a number of electrical current monitors along its length. In general, a substation 510 receives electrical power from an electrical transmission system (not shown) and in turn provides electrical power to a number of feeder lines for distribution over a geographic area. These feeder lines in general each provide electrical power to a number of lateral lines that are connected to various points on the feeder line in order to further distribute electrical power over that geographical area. It is to be understood that the principles described below with regards to the electrical distribution line 506 are able to be easily and directly applied to an electrical distribution system that includes a number of substations that each provide power to a number of parallel feeder lines and where each feeder line provides power to a number of lateral lines connected to various points along those feeder lines.

The illustrated electrical distribution line 506 includes a number of monitors distributed along its path. These monitors, as are described below, in general contain electrical current monitors that perform various measurements of the electrical power conveyed along the electrical distribution line 506 and communicate those measurements via a communication system 570. In various examples, the communication system 570 is able to include one or more communications technologies that allow the various monitors to communicate data with remote devices. In various examples, the communications system 570 is able to include any combination of one or more of wired communications circuits, wireless communications circuits, other communications circuits, or any combination of these. In an example, the communications system 570 is able to include cellular data communications links, wired data communications links, Advanced Metering Infrastructure (AMI) communications elements, other elements or links, or any combination of these. The communications system 570 in some examples is similar to or has components similar to those included in the communications systems 130 described above.

The communications system 570 in an example provides data received from the various monitors and other systems to an information processing component 572. As is described in further detail below, the information processing component 572 includes various processors that perform various processing of data. In an example, the information processing component 572 is able to receive data reported via the communications system 570 to estimate locations of detected lines faults. In an example, the information processing component 572 includes a composite fault map processor that is able create a composite fault map as is described below. In an example, the information processing component 572 is similar to or part of the above described information processors 140. The information processing component 572 is then able to, in an example, coordinate service operations with a service dispatch component 574 to dispatch service personnel to inspect locations that are determined to be likely locations of a detected line fault in order to locate and repair the detected line fault. In an example, the service dispatch component is similar to or part of the above described service dispatch component 144.

The substation 510 in this example has a protection relay 511 that connects the substation 510 to a first end of segment 1 520 of the electrical distribution line 506. The protection relay 511 in this example operates with an electrical current detector 509 that performs measurements of the electrical current provided to segment 1 520 and the other segments connected to segment 1 520. The electrical current detector 509 is able to, for example, detect an incidence of excessive electrical current being drawn by a load connected to the substation through the segment 1 520. An occurrence of an excessive amount of electrical current flowing through a conductor, which is generally defined as an amount of electrical current that exceeds a threshold, is referred to herein as an "over-current condition." Such an over-current condition is able to be associated with a line fault on the electrical circuit being provided with electrical power via segment 1 520. The electrical current detector 509 in an example records measurements of the electrical current surge associated with an over-current condition and commands the protection relay 511 to open and disconnect electrical power from segment 1 520 when an over-current condition is detected.

In some examples, electrical current detector 509 is able to include further processing or measurement equipment to produce various types of data to characterize the electrical current during an over-current condition. Examples of these different data that are able to be produced by the electrical current detector 509 include, but are not limited to, a detailed description of the electrical current peak transient during the over-current condition, alternating current (AC) electrical current phase shifts relative to the AC voltage waveform during the over-current condition, other measurements, or combinations of these. Such various types of data in some examples are able to support different line fault location estimation processing that may have different accuracies, reliability, other characteristics, or combinations of these.

The illustrated electrical distribution line 506 is a simplified depiction of an electrical line that includes a feeder line section 590 and a lateral line section 592. As is understood by practitioners of ordinary skill in the relevant arts, a substation 510 is able to provide electrical power to number of feeder lines, and each feeder line is able to provide electrical power to a number of lateral lines that are connected at various locations along the feeder line. The illustrated electrical distribution line 506 is presented with this simplified structure in order to more concisely and clearly present the below described processing.

The illustrated feeder line section 590 includes segment 1 520, segment 2 522, segment 3 524 and segment 4 526. A monitor A 512 in this example connects segment 2 522 to segment 3 524. The illustrated lateral line 592 includes segment 5 580, segment 6 582 and segment 7 594. In this example, monitor B 514 connects segment 4 526 of the feeder line section 590 to segment 5 580 of the lateral line 592. Monitor C 516 connects segment 6 582 to segment 7 584 of the lateral line 592. Each segment in this context is a portion of an electrical line that is located at a particular location on the electrical line. In some examples, line fault location estimation processing assigns to each segment a likelihood, or probability, that a detected line fault occurred in that particular segment.

In the following discussion, segments, monitors, or other devices in an electrical line are referred to as being beyond or after one another, or as being before, preceding, or ahead of one another. These terms in general refer to the relative locations of an element to another element in a relative to the power source providing power to the electoral line. For example, with reference to the electrical distribution line 506, because of their relative locations to the substation 510 providing power to the electrical distribution line 506, monitor B 514 is referred to as being beyond or after monitor A 512, and preceding or ahead of monitor C 516.

The electrical distribution line 506 includes a number of monitors that perform electrical current measurements to support line fault location estimation. In the illustrated example, the electrical current detector 509 performs measurements that support location estimation of detected line faults anywhere on the electrical distribution line 506. Monitor A 512 performs measurements that support location estimation of detected line faults that occur beyond monitor A 512, such as within segment 3 524, segment 4, 526, segment 5 580, segment 6 582 or segment 7 584. Monitor B 514 performs measurements that support location estimation of detected line faults that occur beyond monitor B 514, such as within segment 5 580, segment 6 582 or segment 7 584. Monitor C 516 performs measurements that support location estimation of detected line faults that occur beyond monitor C 516, which includes segment 7 584 in this example. The electrical current detector 509, monitor A 512, monitor B 514, and monitor C 516 in the illustrated electrical distribution line 506 are examples of electrical current meters.

Electrical current monitors, such as are included in the electrical current detector 509, monitor A 512, monitor B 514, and monitor C 516, are able to include any electrical monitoring device that produces measurements of electrical current flow and reports such measurements via the communication system 570. In various examples, electrical current monitors are able to include various circuits that produce various measurements of electric current. In some examples, electrical current monitors are able to produce and report various types of measurements that support different processes to estimate locations of detected line faults. In some examples, without limitation, electrical current monitors are able to produce a detailed description of the electrical current peak transient during the over-current condition, alternating current (AC) electrical current phase shifts relative to the AC voltage waveform during the over-current condition, other measurements, or combinations of these.

In various examples, electrical current monitors are able to be any suitable device that is able to measure and report electrical current flowing through the device. By way of example and not limitation, monitors such as monitor A 512, monitor B 514, monitor C 516, other monitors, or combinations of these, are each able to include one or more of an Automated Feeder Switch (AFS), an Automated Lateral Switch (ALS), a Fault Current Indicator (FCI), other devices, or combinations of these.

The line fault location estimation table 504 depicts data contained in fault maps determined by a number of processing techniques along with a composite fault map that is based on a combination of those other fault maps. The line fault location estimation table 504 presents likelihood, or probability, values for each segment that indicates the likelihood that a detected line fault is located in that particular segment. In this illustrated example, ranges of likelihood values are indicted by color. Probabilities, or likelihood values, for locations of detected line faults are presented in this example due to inaccuracies in estimating line fault locations based on electrical current measurements. Due to such inaccuracies and unknowns, using a color to present a range of values provides more useful data when evaluating the location estimates of a line fault.

In the line fault location estimation table 504, the color "green" is indicated by a letter "G," the color "yellow" is indicated by a letter "Y," and the color "red" is indicated by a letter "R." In this example, a color "red" indicated by an "R" for a particular segment indicates that the line fault is more likely to be located in that segment. A color "yellow" indicated by a "Y" for a particular segment indicates that the line fault is less likely to be located in that segment. A color "green" indicated by a "G" for a particular segment indicates the line fault is unlikely to be located in that segment. In an example, these colors are able to indicate probability ranges as is described above.

The line fault location estimation table 504 includes a monitor reporting column 560 and a segment field 562 that has a number of columns each labeled with a segment number. The line fault location estimation table 504 has a number of rows with one row for each monitor described above for the simplified electrical distribution system 502, and a composite row 530 that depicts composite likelihood values for each segment in the segment field 562. The line fault location estimation table 504 further has a number of columns that include indications of a likelihood that a line fault occurred in a particular line segment. The line fault location estimation table 504 includes a segment 1 column 532 that has an indication for each row that indicates a likelihood value that a line fault is located in segment 1 520. Similarly, indications of likelihood values of a line fault being located in other segments of the feeder line section 590 are in a segment 2 column 534 that has indications of a likelihood value that a line fault is located in segment 2 522, a segment 3 column 536 that has indications of a likelihood value that a line fault is located in segment 3 524, and a segment 4 column 538 that has indications of a likelihood value that a line fault is located in segment 4 526. Likelihood values for line faults in the lateral line 592 are shown in a segment 5 column 540 that has indications of a likelihood value that a line fault is located in segment 5 580, a segment 6 column 542 which has indications of a likelihood value that a line fault is located in segment 6 582, and a segment 7 column 544 has indications of a likelihood value that a line fault is located in segment 3 524. In each column, the likelihood value in each row is based upon a value of a location probability distribution estimating that a line fault's location is in the segment associated with that column, where the location probability distribution is determined based measurements made by the electrical current monitor associated with that row.

A current detector row 550 has "current detector" in the monitor reporting column 560 and indications of likelihood values that a detected line fault occurred in each segment, as determined based on measurements reported by the electrical current detector 509, are listed in the columns of the segment field 562. A monitor A row 552 has "monitor A" in the monitor reporting column 560 and indications of likelihood values that a detected line fault occurred in each segment are listed in the columns of the segment field 562. The likelihood values that a detected line fault occurred in each segment are determined in an example by processing measurements received from monitor A 512. A monitor B row 554 and monitor C row 556 have "monitor B" and "monitor C" in the monitor reporting column 560, respectively, and also have indications of likelihood values that a detected line fault occurred in each segment in the columns of the segment field 562 as are determined by processing measurements received from monitor B 514 and monitor C 516, respectively.

The likelihood values in the illustrated line fault location estimation table 504 are based on an example of a line fault to ground having occurred in segment 6 582 of the electrical distribution line 506 described above. Because a line fault to ground occurred in segment 6 582, a surge current associated the line fault flows from the substation through the electrical current detector 509, monitor A 512, and monitor B 514. Because there is a line fault to ground in segment 6 582, the electrical current surge associated with the line fault does not reach monitor C 516 and thus no measurement data indicating a line fault is reported by monitor C 516.

The current detector row 550 presents line fault likelihood values for each segment following the electrical current detector 509. In an example, surge electrical current measurements made by the electrical current detector 509 are reported to the information processing segment via the communications system. The electrical current measurements reported by the electrical current detector 509 are processed in an example to determine a fault map that indicates a likelihood value that a detected line fault occurs in a particular segment of the electrical distribution line 506. Because all of the electrical current supplied to the electrical distribution line 506 in this example flows through the electrical current detector 509, the current detector row 550 is able to provide likelihood of a line fault having occurred in each segment of the electrical distribution line 506. Although likelihood values are able to be determined for each segment, a number of uncertainties may result in less accuracies being associated with the determined likelihood values for more remote segments. The current detector row 550 indicates "green" in segment 1 column 532, "yellow" in each of segment 2 column 534 through the segment 4 column 538, and "red" in the segment 5 column 540 through the segment 7 column 544.

The monitor A row 552 presents line fault likelihood values for each segment following the monitor A 512. In an example, surge electrical current measurements made by the current monitor A 512 are reported to the information processing segment via the communications system and processed in an example to determine a fault map that indicates a likelihood value that a detected line fault occurs in a particular segment of the electrical distribution line 506. Because monitor A 512 is located between segment 2 522 and segment 3 524, the monitor A row 552 is able to provide likelihood of a line fault having occurred in segments that received power through monitor A 512, such as segment 3 524 and the segments following it. The monitor A row 552 in this example indicates "green" for segment 3 524 and segment 4 526, and "yellow" for each of segment 5 580 through segment 7 584.

Monitor B row 554 presents line fault likelihood values for each segment following the monitor B 514 in manner similar to that described above with regards to monitor row A 552 and monitor A 512. Because monitor B 514 is located between segment 6 582 and segment 7 584, the monitor B row 554 is able to provide likelihood of a line fault having occurred in segments that received power through monitor B 514, which are segment 5 580, segment 6 582 and segment 7 584. The monitor B row 554 in this example indicates "yellow" for segment 5 580 and "red" for both segment 6 582 and segment 7 584.

Monitor C row 556 presents determined line fault likelihood values for each segment following monitor C 516. In this example, as mentioned above, a line fault to ground occurred in segment 6 582 so no line fault related current surge would flow through monitor C 516 because it is located downstream of segment 6 582 at the connection between segment 6 582 and segment 7 584. Because no line fault related current surge is measured by monitor C 516, no data is available to process to determine a likelihood that a line fault occurred in a segment receiving electrical power through monitor C 516. Thus, the monitor C row 556 in this example contains no data.

The composite row 530 depicts a composite fault map that contains composite likelihood values for each segment. The values in the composite row 530 are determined in an example by an algorithm that processes data contained in two or more fault maps, such as the fault map data presented in the current detector row 550, monitor A row 552, monitor B row 554, monitor C row 556, or combinations of those.

The composite fault map presented in the composite row 530 in this example is a combination of likelihood values contained in all of the fault maps that were determined based upon measurements made by at least one monitor. In the illustrated example, the value in each column of the composite row 530 is a weighted average that is calculated for all of the values in that column of the segment field 562. For example, the segment 1 column 532 and the segment 2 column 534 indicate "green," which reflects the value in the current detector row 550 of those columns, which is the only row of those columns with a value.

The segment 3 column 536 and the segment 4 column 538 both indicate "yellow" for the composite row 530, which in this example is a weighted average of the likelihood values in the current detector row 550 and monitor A row 552. The segment 5 column 540 indicates "yellow" for the composite row 530, which in this example is a weighted average of the likelihood values in the rows of that column. The segment 6 column 542 and the segment 7 column 544 both indicate "red" for the composite row 530, which in this example is a weighted average of the likelihood values in the other rows of that column.

In further examples, other algorithms are able to determine the composite likelihood values for the composite fault map. Examples of other processing and algorithms are described in further detail below.

Figure 6:
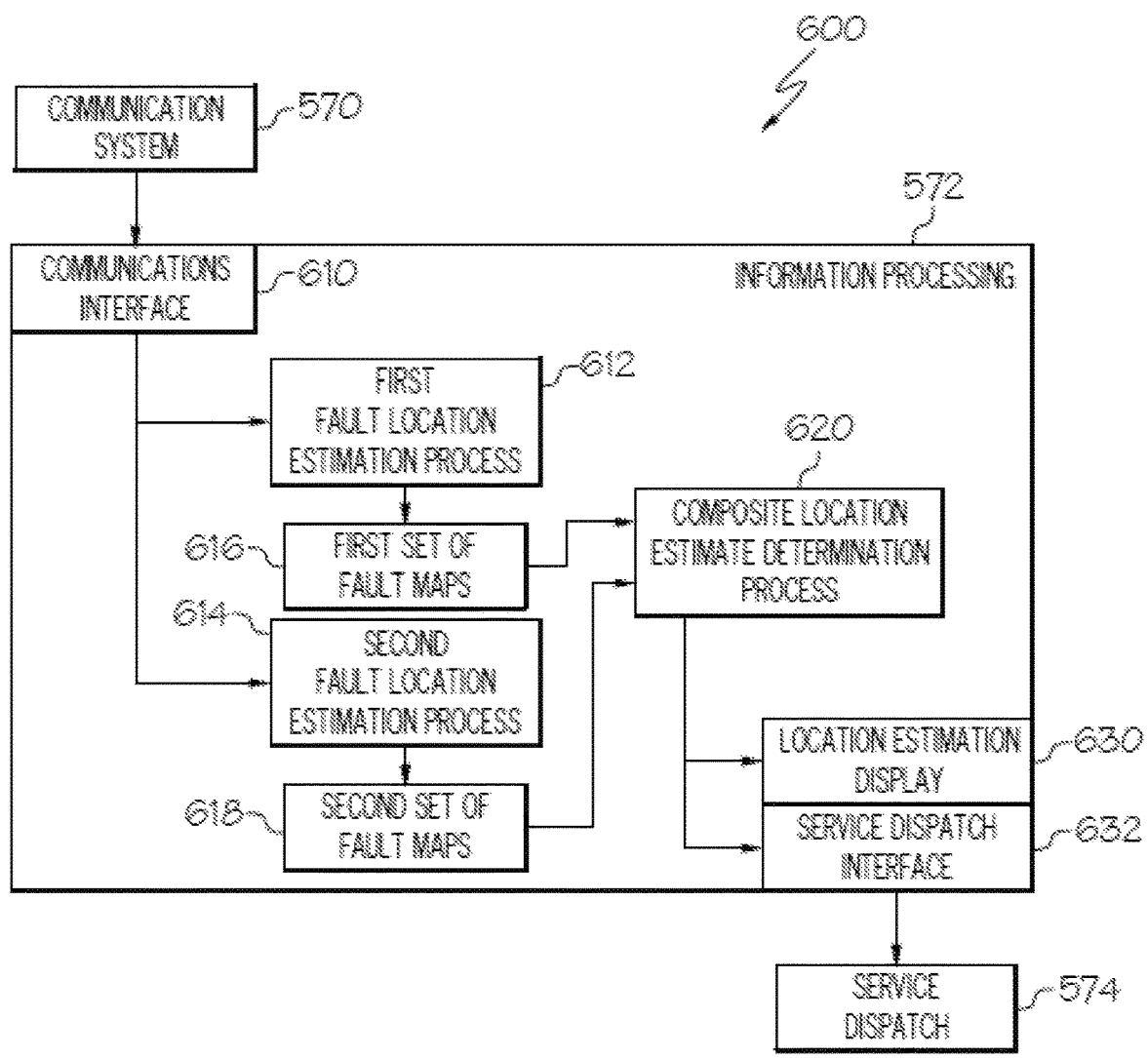
FIG. 6 illustrates an information processing block diagram, according to an example.

FIG. 6 illustrates an information processing block diagram 600, according to an example. With references to the electrical distribution system and line fault location estimation table 500 discussed above, the information processing block diagram 600 depicts a block diagram of components in the information processing component 572, discussed above, along with the communications system 570 and service dispatch component 574 discussed above.

The information processing component 572 includes a communications interface 610 that, in an example, receives data reported via the communications system 570 by various monitors in the electrical distribution line 506. The communications interface 610 in an example provides the received data to one or both of a first fault location estimation process 612 and a second fault location estimation process 614. The depicted example includes two fault location estimation processes in order to more concisely and clearly describe the relevant aspects of the described examples. In various examples, any number of fault location estimation processes that implement various types of processing are able to be included in an information processing component 572.

In the illustrated example, the first fault location estimation process 612 and the second fault location estimation process 614 produce fault maps that indicate probability values of the location of a detected line fault. The first fault location estimation process 612 produces a first set of fault maps 616 and the second fault location estimation process 614 produces a second set of fault maps 618. In an example, the first fault location estimation process 612 processes data determined by and received from the electrical current detector 509 that operates with the protection relay 511 discussed above to produce a fault map for each line fault detected based upon information from the electrical current detector 509. In an example, the second fault location estimation process 614 processes data produced by and received from other monitors located along feeder lines and lateral lines in order to produce fault maps indicating estimates of locations of detected line faults. In some examples, a separate fault map is generated based upon data produced by and received from each individual monitoring device along feeder lines, such as the illustrated feeder line section 590, and lateral lines, such as the illustrated lateral line 592. Fault maps may also be generated based upon the systems and sensors including those described with respect to FIG. 1.

The information processing component 572 further includes a composite location estimation determination process 620. The composite location estimation determination process 620 is an example of a process performed by a composite fault map processor. In an example, the composite location estimation determination process 620 receives fault maps from one or more sources, such as from either one or both of the illustrated first set of fault maps 616 and the second set of fault maps 618, and produces a composite location estimation for each determined line fault. An example of a process performed by the composite location estimation process to produce a composite location estimation from a number of fault maps is described in further detail below.

The composite location estimation determination process 620 produces information to present line fault locations estimates on a location estimation display 630. In an example, the location estimation display 630 is able to present a display similar to the above described example user interface 400, which presents the data defining a composite fault map. The composite location estimation determination process 620 in some examples also provides estimated line fault locations to a service dispatch interface 632. The service dispatch interface 632 in an example is then able to provide the estimated line fault location to the service dispatch component 574 to allow the service dispatch system to, for example, more efficiently direct physical inspection of feeder lines or lateral lines to determine the location of the line fault and perform needed repairs.

Figure 7:
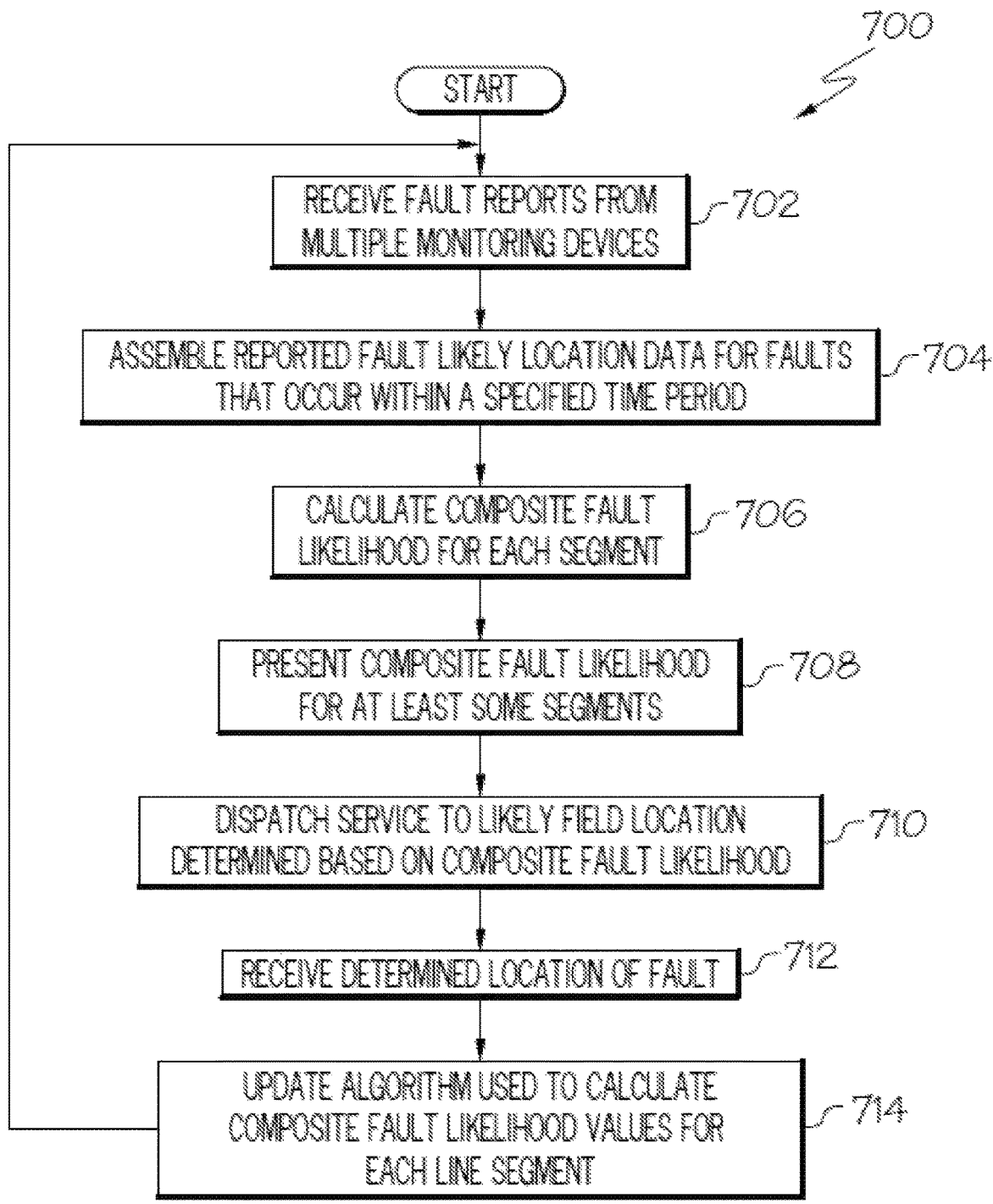
FIG. 7 illustrates a composite fault map determination process, according to an example.

FIG. 7 illustrates a composite fault map determination process 700, according to an example. The composite fault map determination process 700 is provided by way of illustration and not limitation as an example of a process performed by the above described composite location estimation determination process 620.

The composite fault map determination process 700 receives, at 702, fault maps based on measurements from multiple monitoring devices. With reference to the information processing component 572 described above, the composite fault map determination process 700 receives fault maps from the first set of fault maps 616 and the second set of fault maps 618. In general, the composite fault map determination process 700 has access to a number of fault maps for line faults that occurred at various times and at very locations.

The composite fault map determination process 700 assembles, at 704, likely line fault location data for line faults that occur within a specified time interval. In general, measurements associated with a line fault are made very shortly after the line fault occurs. Information about a particular line fault will generally be based upon measurements that are made at approximately the same time. The composite fault map determination process 700 assembles line fault location data for one particular line fault in order to have more likely assembled line fault location data that is associated with the same line fault.

The composite fault map determination process 700 determines, at 706, a composite line fault likelihood value for each segment. In an example, a composite fault map is generated that indicates a respective composite line fault likelihood value for each line segment being monitored. In an example, the respective composite line fault likelihood value for a particular line segment is determined based on a mathematical combination of a number of likelihood values that a line fault is located in that particular line segment as are indicated in a number of various fault maps. These various fault maps in an example are determined based upon measurements produced by one monitor or a subset of monitors that monitor the power distribution lines providing electrical power to a line that has a line fault.

In an example, determining a composite line fault likelihood value for a particular segment includes computing a weighted average of the likelihood values for that particular segment contained in two more fault maps. For example, a likelihood values in a fault map from the second set of fault maps 618 may be given more weight than likelihood values in a fault map from the first set of fault maps 616.

In another example, determining a composite line fault likelihood value for a particular segment is based on selecting the fault map that is determined based on measurements made by an electrical current monitor that is the farthest from a power source providing power to the electrical line containing substation and reporting the line fault. It is assumed in some examples that the electrical current monitor that is farthest from the power source is also closest to the line fault. In an example, determining the composite line fault likelihood value for a particular segment includes using the line fault likelihood value for that segment that was determined for that segment in the fault map that was created using data from the electrical current monitor that is farthest from the substation providing power to the electrical line since that electrical current monitor is likely to be closest to the line fault.

In another example, determining a composite fault likelihood value for a particular segment is based on selecting the fault map that is determined based on measurements made by an electrical current monitor that is closest to and before, or upstream of, an electrical current monitor that did not report measurements related to an overcurrent condition. In an example, a line fault prevents electrical energy from flowing past that fault, and electrical current monitors beyond the line fault will not experience excessive electrical current during the line fault. It is then assumed in some examples that the closest electrical current monitor to a line fault, and thus the electrical current monitor that produces the most relevant electrical current measurements related to that electrical line fault, is the electrical current monitor that reports electrical current measurements indicting a line fault that is closest to and before another electrical current monitor that did not report current measurements indicating a line fault. In such an example, determining the composite line fault likelihood value for a particular segment includes using the line fault likelihood value for that segment that was determined for that segment in the fault map that was created using data from the electrical current monitor that is closest to and before an electrical current monitor that did not report electrical current measurements indicating a line fault.

A composite line fault likelihood value for at least some line segments is presented, at 708. In an example, such a presentation includes a composite fault map that indicates composite line fault likelihood values for at least some line segments being monitored. In an example, presenting a composite line fault likelihood value for at least some line segments includes presenting a display similar to the above described example user interface 400, which presents the data defining a composite fault map.

In some examples, a service crew is dispatched, at 710, to a likely field location of the line fault based on the composite line fault likelihood value for a line segment at the likely field location. Dispatching a service crew to a likely field location of the line fault in this context is an example of directing a service inspection to a partition location to inspect the electrical line, where the particular location is based on a composite location probability distribution. Dispatching a service crew to a likely field location with one or more segments that have higher line fault likelihood values based on combining the fault likelihood values for those segments from a number of different fault maps in an example reduces the geographic area of line segments that have to be inspected to find the line fault.

In some examples, a determined location of the line fault is received, at 712. In an example, the determined location is reported by the service crew that is dispatched to find and repair the line fault. In further examples, the determined location is able to be received from any source or determined by any technique.

One or more algorithms that is used to calculate the composite line fault likelihood value for each line segment is then updated, at 714. In an example, the algorithm is updated based on a correspondence between the determined location of the line fault, such as is received at 712, and probabilities within the at least two of the location probability distributions indicted by at least two fault maps. Updating these algorithms in this way is able to improve the accuracy of locations estimates for line faults made in the future. Updating these algorithms by using the actual determined locations of line faults whose locations were estimated by the above processing will allow improving the accuracy of the algorithm. In an example, updating an algorithm that combines likelihood values from multiple fault maps may include changing weight values given to likelihood values from each of the models in order to produce more accurate location estimations. The composite fault map determination process 700 then returns to receiving, at 702, fault maps and follows with the processing described above.

Figure 8:
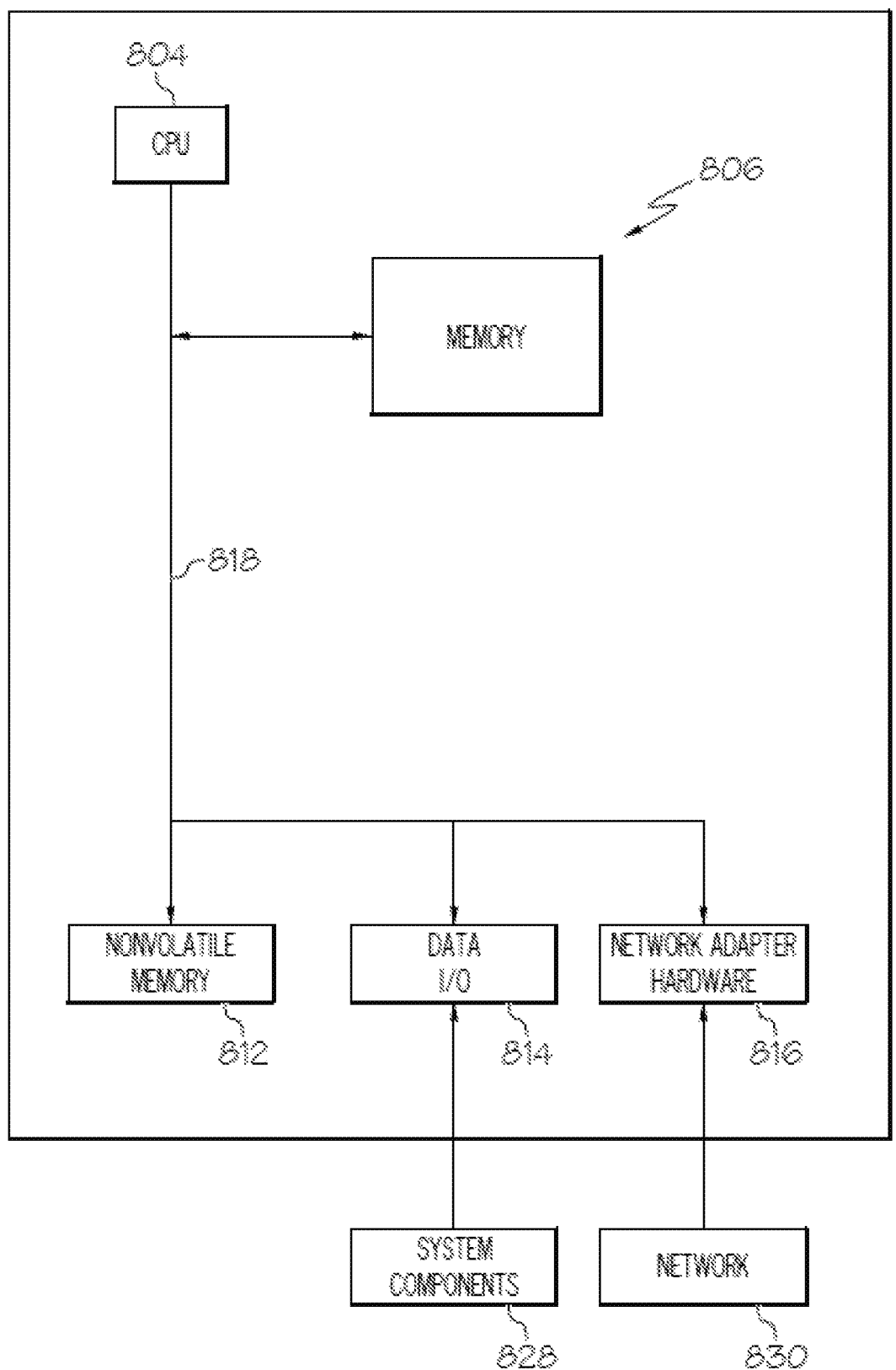
FIG. 8 illustrates a block diagram illustrating a processor, according to an example.

FIG. 8 illustrates a block diagram illustrating a processor 800 according to an example. The processor 800 is an example of a processing subsystem that is able to perform any of the above or below described processing operations, control operations, other operations, or combinations of these.

The processor 800 in this example includes a CPU 804 that is communicatively connected to a main memory 806 (e.g., volatile memory), a non-volatile memory 812 to support processing operations. The CPU is further communicatively coupled to a network adapter hardware 816 to support input and output communications with external computing systems such as through the illustrated network 830.

The processor 800 further includes a data input/output (I/O) processor 814 that is able to be adapted to communicate with any type of equipment, such as the illustrated system components 828. The data input/output (I/O) processor in various examples is able to be configured to support any type of data communications connections including present day analog and/or digital techniques or via a future communications mechanism. A system bus 818 interconnects these system components.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information. In general, the computer readable medium embodies a computer program product as a computer readable storage medium that embodies computer readable program code with instructions to control a machine to perform the above or below described methods and realize the above or below described systems.

In an example, the disclosed methods include a method for combining line fault location probabilities. The method in an example includes receiving a first location probability distribution for a location of an line fault along an electrical line based upon at least a first electrical current measurements reported by a first electrical current monitor at a first location along the electrical line, and receiving a second location probability distribution of the location of the line fault along the electrical line based upon at least a second electrical current measurements reported by a second electrical current monitor at a second location along the electrical line, the second electrical current measurements being made within a time interval of the first electrical current measurements. The method further includes determining a composite location probability distribution for the location of the line fault along the electrical line based on an algorithm processing the first location probability distribution and the second location probability distribution, and providing the composite location probability distribution.

In some further examples of these methods, the determining the composite location probability distribution is based on combining likelihood values according to an algorithm, the method further includes receiving a determined location of the line fault along the electrical line, and updating the algorithm based on a correspondence between the determined location and probabilities within the first location probability distribution and the second location probability distribution.

Other examples of these methods further include directing a service inspection to a particular location to inspect the electrical line, the particular location being based upon the composite location probability distribution.

In some examples, the electrical line receives power from a power source and the second electrical current monitor is electrically farther from the power source than the first electrical current monitor. In these examples, the determining the composite location probability distribution includes selecting the second location probability distribution as the composite location probability distribution based upon the second electrical current monitor being farther from the power source than the first electrical current monitor.

In some further examples, the electrical line receives power from a power source and the second electrical current monitor is electrically farther from the power source than the first electrical current monitor. In these examples, a third electrical current monitor is electrically farther from the power source than the first electrical current monitor and the second electrical current monitor and w the second electrical current monitor is upstream from and electrically closest to the third electrical current monitor. Further the third electrical current monitor does not report measurements indicating the line fault, and the determining the composite location probability distribution includes selecting the second location probability distribution as the composite location probability distribution based upon the second electrical current monitor being electrically closest to and upstream from the third electrical current monitor.

In some examples, the electrical line includes a plurality of line segments, the first location probability distribution includes a respective first likelihood value for each line segment in the plurality of line segments, and the second location probability distribution includes a respective second likelihood value for each line segment in the plurality of line segments. In these examples the determining the composite location probability distribution includes determining a respective composite likelihood value for each line segment based upon a combination of the respective first likelihood value and the respective second likelihood value for each line segment in the plurality of line segments. In some of these examples, each respective first likelihood value has a respective first color value and each respective second likelihood value has a respective second color value, and the respective composite likelihood value has a respective composite color value for each line segment where the respective composite color value for a respective particular line segment is determined based on a mapping of the respective first color value and the respective second color value for the respective particular line segment.

In an example, composite fault map processor includes a processor and a memory communicatively coupled to the processor where the processor, when operating, is configured to receive a first location probability distribution for a location of an line fault along an electrical line based upon at least a first electrical current measurements reported by a first electrical current monitor at a first location along the electrical line, and receive a second location probability distribution of the location of the line fault along the electrical line based upon at least a second electrical current measurements reported by a second electrical current monitor at a second location along the electrical line, the second electrical current measurements being made within a time interval of the first electrical current measurements. The processor is further configured to determine a composite location probability distribution for the location of the line fault along the electrical line based on an algorithm processing the first location probability distribution and the second location probability distribution, and provide the composite location probability distribution.

In some examples the processor is configured to determine the composite location probability distribution based on combining likelihood values according to an algorithm, and is further configured, when operating, to receive a determined location of the line fault along the electrical line, and update the algorithm based on a correspondence between the determined location and probabilities within the first location probability distribution and the second location probability distribution.

In some examples, the processor is further configured, when operating, to direct a service inspection to a particular location to inspect the electrical line, the particular location being based upon the composite location probability distribution.

In some examples of the composite fault map processor, the electrical line receives power from a power source, and the second electrical current monitor is electrically farther from the power source than the first electrical current monitor. The processor is also configured to determine the composite location probability distribution by at least selecting the second location probability distribution as the composite location probability distribution based upon the second electrical current monitor being farther from the power source than the first electrical current monitor.

In some examples of the composite fault map processor, the electrical line receives power from a power source, and the second electrical current monitor is electrically farther from the power source than the first electrical current monitor. In these examples, a third electrical current monitor is electrically farther from the power source than the first electrical current monitor and the second electrical current monitor and wherein the second electrical current monitor is upstream from and electrically closest to the third electrical current monitor, and the third electrical current monitor does not report measurements indicating the line fault. In these examples the processor is configured to determine the composite location probability distribution by at least selecting the second location probability distribution as the composite location probability distribution based upon the second electrical current monitor being electrically closest to and upstream from the third electrical current monitor.

In some examples of the composite fault map processor, the electrical line includes a plurality of line segments, the first location probability distribution includes a respective first likelihood value for each line segment in the plurality of line segments, and the second location probability distribution includes a respective second likelihood value for each line segment in the plurality of line segments. The processor in these examples is configured to determine the composite location probability distribution by at least determining a respective composite likelihood value for each line segment based upon a combination of the respective first likelihood value and the respective second likelihood value for each line segment in the plurality of line segments.

In some examples of the composite fault map processor, each respective first likelihood value includes a respective first color value and each respective second likelihood value includes a respective second color value, and the respective composite likelihood value has a respective composite color value for each line segment where the respective composite color value for a respective particular line segment is determined based on a mapping of the respective first color value and the respective second color value for the respective particular line segment.

In an example, a computer program product for determining a composite fault map includes a computer readable storage medium having computer readable program code embodied therewith, where the computer readable program code includes instructions for: receiving a first location probability distribution for a location of an line fault along an electrical line based upon at least a first electrical current measurements reported by a first electrical current monitor at a first location along the electrical line, and receiving a second location probability distribution of the location of the line fault along the electrical line based upon at least a second electrical current measurements reported by a second electrical current monitor at a second location along the electrical line, the second electrical current measurements being made within a time interval of the first electrical current measurements. The computer readable program code further includes instructions for determining a composite location probability distribution for the location of the line fault along the electrical line based on an algorithm processing the first location probability distribution and the second location probability distribution, and providing the composite location probability distribution.

In some examples of the computer program product, the instruction for determining the composite location probability distribution determine the composite location probability distribution based on combining likelihood values according to an algorithm. In these examples, the computer readable program code further includes instructions for receiving a determined location of the line fault along the electrical line, and updating the algorithm based on a correspondence between the determined location and probabilities within the first location probability distribution and the second location probability distribution.

In some examples of the computer program product, the computer readable program code further includes instructions for directing a service inspection to a particular location to inspect the electrical line, the particular location being based upon the composite location probability distribution.

In some examples of the computer program product, the electrical line receives power from a power source and the second electrical current monitor is electrically farther from the power source than the first electrical current monitor. In these examples, the instructions for determining the composite location probability distribution include instructions for selecting the second location probability distribution as the composite location probability distribution based upon the second electrical current monitor being farther from the power source than the first electrical current monitor.

In some examples, the computer program product, the electrical line receives power from a power source, and the second electrical current monitor is electrically farther from the power source than the first electrical current monitor. In these examples, a third electrical current monitor is electrically farther from the power source than the first electrical current monitor and the second electrical current monitor, the second electrical current monitor is upstream from and electrically closest to the third electrical current monitor, and the third electrical current monitor does not report measurements indicating the line fault. In these examples the instructions for determining the composite location probability distribution include instructions for selecting the second location probability distribution as the composite location probability distribution based upon the second electrical current monitor being electrically closest to and upstream from the third electrical current monitor.

In some examples of the computer program product, the electrical line includes a plurality of line segments, the first location probability distribution includes a respective first likelihood value for each line segment in the plurality of line segments, and the second location probability distribution includes a respective second likelihood value for each line segment in the plurality of line segments. In these examples, the instructions for determining the composite location probability distribution include instructions for determining a respective composite likelihood value for each line segment based upon a combination of the respective first likelihood value and the respective second likelihood value for each line segment in the plurality of line segments.

In an example, the disclosed methods include a method for determining events that are associated with one another. The method in an example includes receiving a first event report indicating a first event associated with an electrical distribution system, receiving a second event report indicating a second event different from the first event, the second event being associated with the electrical distribution system, receiving a third event report indicating a third event different from the first event and the second event, the third event being associated with the electrical distribution system, determining, based upon data associated with the first event and the second event, that the first event is associated with the second event, and also determining, based upon data associated with the first event and the third event, that the first event is not associated with the third event. The method further includes creating a presentation indicating that the first event is related to the second event and that the first event is not related to the third event, and providing the presentation to a different process.

In further examples, methods are also able to include the above method wherein at least one of the first event report, the second event report, or the third event report includes a report indicating at least one of a status event of a piece of equipment of the electrical distribution system, an environmental event, or a power distribution system related event. In some examples, at least one of the first event report, the second event report, or the third event report includes a failure prediction system report.

In further examples, methods are also able to include the above method and further include receiving, a selection of a selected event from within a plurality of events indicated by a respective plurality of event reports, and defining, based on the selection, the selected event as the first event. In some examples, the selection is received via a user interface.

In further examples, methods are also able to include the above methods wherein the determining the first event is associated with the second event is based upon a first proximity of the first event to the second event, and wherein the determining the first event is not associated with the third event is based upon a second proximity of the first event to third event. Additionally, in some examples the first event occurs at a first time, the second event occurs at a second time, and the third event occurs at a third time, wherein the first proximity is based upon a first time difference between the first time and the second time, wherein the second proximity is based upon a second time difference between the first time and the third time, wherein the determining the first event is associated with the second event is based upon the first time difference being below a threshold, and wherein the determining the first event is not associated with the third event is based upon the second time difference being above the threshold. In some examples, the first event report is sent by a first device, the second event report is sent by a second device different from the first device, and the third event report is sent by a third device separate from the first device and the second device, and wherein the first proximity is based upon a first distance between the first device and the second device, wherein the second proximity is based upon a second distance between the first device and the third device, wherein the determining the first event is associated with the second event is based upon the first distance being below a threshold, and wherein the determining the first event is not associated with the third event is based upon the second distance being above the threshold. Further, the first distance and the second distance are each a respective distance according to one or both of electrical power line routings or respective geographic locations associated with each respective event in the first event, the second event and the third event.

In an example, a processor is disclosed that includes a processor and a memory communicatively coupled to the processor where the processor, when operating, being configured to receive a first event report indicating a first event associated with an electrical distribution system, receive a second event report indicating a second event different from the first event, the second event being associated with the electrical distribution system, receive a third event report indicating a third event different from the first event and the second event, the third event being associated with the electrical distribution system, determine, based upon data associated with the first event and the second event, that the first event is associated with the second event, and to also determine, based upon data associated with the first event and the third event, that the first event is not associated with the third event. The processor, when operating is also configured to create a presentation indicating that the first event is related to the second event and that the first event is not related to the third event, and provide the presentation to a different process.

In further examples, at least one of the first event report, the second event report, or the third event report are able to include a report indicating at least one of: a status event of a piece of equipment of the electrical distribution system, an environmental event, or a power distribution system related event. In another example, a group including the first event report, the second event report, and the third event report includes three unique reports that include a status event of a piece of equipment of the electrical distribution system, an environmental event, or a power distribution system related event.

In further examples, the processor is able to also include a user interface, wherein the processor is further configured to: receive, via the user interface, a selection of a selected event from within a plurality of events indicated by a respective plurality of event reports, and define, based on the selection, the selected event as the first event.

In further examples, the processor is further configured to: receive a fourth event report indicating a fourth event that is different from the first event, the second event and the third event, the fourth event being associated with the electrical distribution system, determine, based upon data associated with the first event and data associated with the fourth event, that the first event is not associated with the fourth event, determine, based upon data associated with the second event and data associated with the fourth event, that the second event is associated with the fourth event. The processor further is configured to associate the first event with fourth event based upon a combination of: a determination that the first event is associated with the second event, and a determination that the second event is associated with the fourth event, wherein the processor is further configured to create the presentation to further indicate that the first event is related to the fourth event, wherein at least one of the first event report, the second event report, the third event report or the fourth event report comprises a report with a type indicating at least one of: a status event of a piece of equipment of the electrical distribution system, an environmental event, or a power distribution system related event, and wherein a type of the second event report is different from a type of the fourth event report.

In some examples, the processor is configured to determine the first event is associated with the second event is based upon a first proximity of the first event to the second event, and wherein a determination that the first event is not associated with the third event is based upon a second proximity of the first event to third event.

In some examples, the first event occurs at a first time and is associated with a first device, the second event occurs at a second time and is associated with a second device, and the third event occurs at a third time and is associated with a third device. In such examples, the first proximity is based upon a first time difference between the first time and the second time, the second proximity is based upon a second time difference between the first time and the third time. The processor in such examples is further configured to: determine the first event is associated with the second event based upon the first time difference being below a time threshold; and determine the first event is not associated with the third event based upon the second time difference being above the time threshold; receive a fourth event report indicating a fourth event associated with a fourth device associated with the electrical distribution system, the fourth event being different from the first event, the second event and the third event; receive a fifth event report event indicating a fifth event associated with a fifth device associated with the electrical distribution system, the fifth event being different from the first event, the second event, the third event and the fourth event; determine that the first event is associated with the fourth event based upon a determination that a distance between the first device and the fourth device is below a distance threshold; determine that the first event is not associated with the fifth event is based upon a determination that a distance between the first device and the fifth device is below the a distance threshold. The processor in such examples is further configured to create the presentation to further indicate that the first event is related to the fourth event and is not related to the fifth event.

In some examples, the first event report is sent by a first device, the second event report is sent by a second device different from the first device, and the third event report is sent by a third device separate from the first device and the second device, wherein the first proximity is based upon a first distance between the first device and the second device, wherein the second proximity is based upon a second distance between the first device and the third device. The processor is also further configured to: determine the first event is associated with the second event based upon the first distance being below a threshold, and determine the first event is not associated with the third event based upon the second distance being above the threshold. In some examples, the first distance and the second distance are each a respective distances according to one or both of electrical power line routings or respective geographic locations associated with each respective event in the first event, the second event and the third event.

Further disclosed is a computer program product for determining events that are associated with one another where the computer program product includes a computer readable storage medium having computer readable program code embodied therewith. In an example, the computer readable program code comprising instructions for receiving a first event report indicating a first event associated with an electrical distribution system, receiving a second event report indicating a second event different from the first event, the second event being associated with the electrical distribution system, receiving a third event report indicating a third event different from the first event and the second event, the third event being associated with the electrical distribution system, determining, based upon data associated with the first event and the second event, that the first event is associated with the second event. The computer readable program code also includes instructions for determining, based upon data associated with the first event and the third event, that the first event is not associated with the third event, creating a presentation indicating that the first event is related to the second event and that the first event is not related to the third event, and providing the presentation to a different process.

In an example, the computer readable program code further include instructions for: receiving a selection of a selected event from within a plurality of events indicated by a respective plurality of event reports, and defining, based on the selection, the selected event as the first event. In some examples, the first event occurs at a first time, the second event occurs at a second time, and the third event occurs at a third time, wherein the determining the first event is associated with the second event is based upon a first time difference between the first time and the second time. In some examples, determining the first event is not associated with the third event is based upon a second time difference between the first time and the third time. In some examples, the instructions for determining the first event is associated with the second event determine the first event is associated with the second event based upon the first time difference being below a threshold, and the instructions for determining the first event is not associated with the third event determine the first event is not associated with the third event based upon the second time difference being above the threshold.

In some examples, the first event report is sent by a first device, the second event report is sent by a second device different from the first device, and the third event report is sent by a third device separate from the first device and the second device, the determining the first event is associated with the second event is based upon a first distance between the first device and the second device, the determining the first event is not associated with the third event is based upon a second distance between the first device and the third device. In some examples, the instructions for determining the first event is associated with the second event determine the first event is associated with the second event based upon the first distance being below a threshold, and the instructions for determining the first event is not associated with the third event determine the first event is not associated with the third event based upon the second distance being above the threshold.

Figure 9:
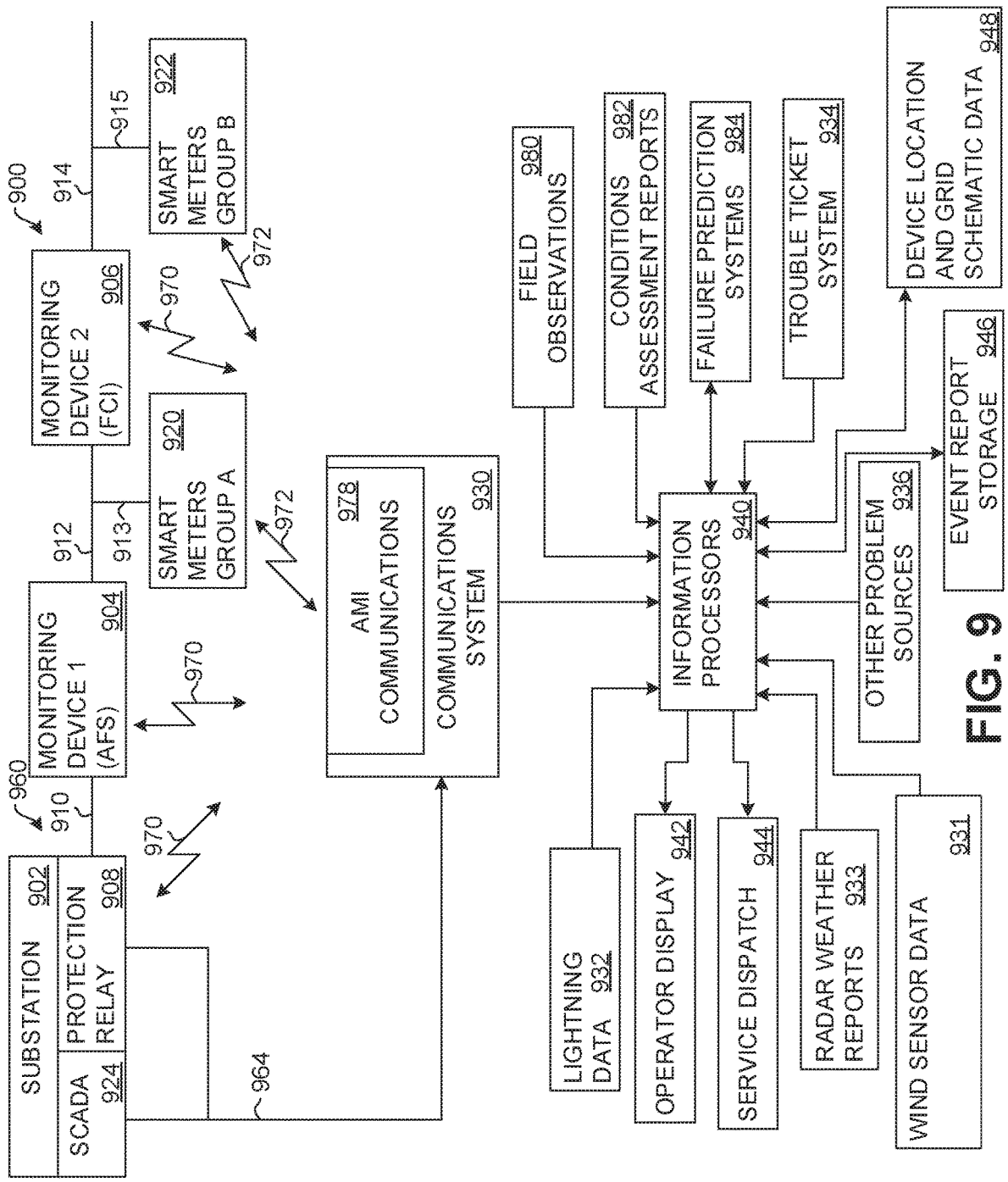
FIG. 9 illustrates another electrical distribution system event processing system, according to an example.

FIG. 9 illustrates another electrical distribution system event processing system 900, according to an example. The electrical distribution system event processing system 900 is similar to the electrical distribution system event processing system 100 of FIG. 1. The electrical distribution system event processing system 900 is an example of a system that performs various methods to receive indications of events, determine events that are associated with one another, and produces sets of indications of associated events that have occurred. Moreover, in an example, the electrical distribution system event processing system 900 could be implemented with monitoring devices that monitor operations of elements a utility distribution system (e.g., illustrated as an example electrical distribution system 960) as well as computing devices (e.g., servers, workstations, routers, etc.) that receive and analyze information provided from the monitoring devices and external sources, as explained herein.

The electrical distribution system event processing system 900 depicts the example electrical distribution system 960. The example electrical distribution system 960 is a simplified illustration of some of the components of electrical distribution systems that are used to support the operations of the below described systems and methods. This simplified illustration is used to provide a more clear and concise description of the relevant aspects of the below described systems and methods. It is clear that the principles and techniques described herein are applicable to any electrical distribution system or other similar systems. As is described in further detail below, some components of the example electrical distribution system 960 detect events and report those events to various information processors 940 via various components of a communications system 930.

The electrical distribution system 960 includes a substation 902 that has a protection relay 908 and Supervisory Control and Data Acquisition (SCADA) equipment. As is generally understood, the substation 902 in an example receives electrical power from an electrical transmission or distribution system (not shown) and provides electrical power for distribution. In the simplified illustration, the substation 902 provides electrical power through the protection relay 908, which in an example is a feeder breaker. The electrical distribution system 960 in this simplified example includes a first feeder line section 910 that receives power through the protection relay 908 and provides power to a monitoring device 1 904. The monitoring device 1 904 in this simplified example is an Automated Feeder Switch (AFS) that provides electrical power to a second feeder line section 912. In the illustrated example, the second feeder line section 912 provides electrical power to a first lateral line 913 and is also connected to a third feeder line section 914 by a switch adjacent to a monitoring device 2 906, which in this example is a Fault Current Indicator (FCI). The monitoring device 2 (an FCI) is attached to a bare wire and takes readings (e.g., current and/or voltage readings) of power transmitted through the bare wire. The illustrated example depicts that the third feeder line section 914 provides electrical power to a second lateral line 915 and continues on to provide electrical power to other elements (not shown). As is generally understood, substations in various distribution systems are able to provide electrical power to any number of feeder lines, which in turn are able to be connected to and provide electrical power to any number of lateral distribution lines.

In various examples, the monitoring device 1 904 and the monitoring device 2 906 in further examples are able to be any device that monitors events that occur on the electrical distribution lines to which they are connected. In some examples, such monitoring devices are part of, or operate in association with, protection devices for the electrical distribution system 960. Such protection devices are able to include, for example, any one or more of reclosers, Automated Feeder Switches (AFSs), Automated Lateral Switches (ALSs), any protection device, or combinations of these. Further, monitoring devices are able to include any type of monitoring device, such as Fault Current Indicators, various SCADA monitoring and data acquisition equipment, any other type of monitoring device, or combinations of these. In some examples, such monitoring devices are able to be any device that monitors any type of condition associated with an electrical transmission line the respective monitoring device is monitoring. In some examples, monitoring devices monitor conditions associated with all or part of the electrical distribution system 960. In some examples, the various monitoring devices send reports of events that indicate their status, such as whether a protection device has opened due to a detected over-current condition. An event report that indicates the status of such a device is an example of a status event of a piece of equipment in an electrical distribution system (e.g., a grid element).

The electrical distribution system 960 includes a smart meters group A 920 connected to the first lateral line 913 and a smart meters group B 922 connected to the second lateral line 915. As is generally understood, each of these smart meter groups in an example contain a number of smart meters that are each located at various customer facilities. Each smart meter in each of these smart meter groups operate to measure electrical consumption by those customer facilities and to also monitor and automatically report various other conditions, such as loss of electrical power, voltage abnormalities, other events, or combinations of these.

The various monitoring devices, such as the above described substation SCADA equipment 924, protection relay 908, monitoring device 1 904, which is an Automated Feeder Switch (AFS), monitoring device 2 906, which is a Fault Current Indicator, and smart meters group A 920 and smart meters group B 922, communicate via various components of the communications system 930 and onto the information processors 940. In the illustrated example, smart meters group A 920 and smart meters group B 922 communicate via Advanced Metering Infrastructure (AMI) communications elements 978. In particular, the substation SCADA equipment 924 and the protection relay 908 communicate via a hard wired substation communications link 964 to the communications system 930 and onto the information processors 940. Monitoring device 1 904, which is an AFS, and monitoring device 2 960, which is a Fault Current Indicator (FCI), communicate via a first AMI communications link 970 with the AMI communications elements 978 which are part of the communications system 930 in this example, and onto the information processors 940. In the illustrated example, the smart meters group A 920 and the smart meter group B 922 communicate via a second AMI communications link 972 with the AMI communications elements 978.

The information processors 940 receives wind sensor data 931 that characterizes a wind speed detected by a number of wind sensors. In an example, the number of wind sensors are able to be located around the geographical area of the electrical distribution system 960. In general, the wind sensors are able to detect and report high wind speeds ("high winds"), particularly wind speeds that exceed a threshold level (e.g., about 50 kilometers per hour (kph) or more). The wind sensors can include, for example an anemometer. The wind sensor data 931 characterize the wind speed detected by the wind sensors distributed throughout the geographical area of the electrical distribution system 960. The information processors 940 also receive lightning data 932 detected by electromagnetic (EM) sensors. The EM sensors are also able to be located around the geographical area of the electrical distribution system 960. The EM sensors detect and report lighting strikes around the geographical area of the electrical distribution system 960. A lightning strike detected by an EM sensor identified in the lightning data 932 and the high winds identified in the wind sensor data 931 are examples of an environmental event. It is understood that these examples are not meant to be limiting. In other examples, other techniques and/or sensors are employable (e.g., by an external vendor) to generate the wind sensor data 931 and/or the lightning data 932.

Additionally as noted, it is considered that in some examples, the wind sensors corresponding to the wind sensor data 931 and the EM sensors corresponding to the lightning data 932 may be implemented by an external system controlled by an external vendor operating independently of the electrical distribution system event processing system 900. For instance, the wind sensors and/or the EM sensors could be operated and maintained by a weather service or other vendor, such as the National Weather Service and/or Schneider Electric. In such a situation, reports such as the lightning data 932 characterizing the lightning strikes and the wind sensor data 931 characterizing wind speeds can be provided to the information processors 940.

Furthermore, the electrical distribution system event processing system 900 receives radar weather reports 933 from an external service (e.g., the National Weather Service) operating independently from the electrical distribution system 960, the information processors 940 or a combination thereof. The radar weather reports 933 characterize radar weather events. As used herein, the term "radar weather event" describes a type of environmental event that is detectable by a radar weather system. Examples of radar weather events include precipitation (e.g., rain, snow, sleet and hail) and atmospheric weather events (e.g., cloud coverage, hurricanes, tornadoes). The radar weather events are provided to the information processors 940 via the communications systems 930.

In various examples, the communications system 930 is able to include one or more communications technologies that allow the various monitors to communicate data with remote devices. In various examples, the communications system 930 is able to include any combination of one or more of wired communications circuits, wireless communications circuits, other communications circuits, or any combination of these. In an example, the communications system 930 is able to include cellular data communications links, wired data communications links, Advanced Metering Infrastructure (AMI) communications elements 978, other elements or links, or any combination of these. In general, the components or elements of the communications system 930 are able to be arranged, connected, interconnected, and operated in concert with or separately from each other according to any suitable design.

As illustrated for the electrical distribution system event processing system 900, equipment within the substation 902, including the protection relay 908, monitoring device 1 904, monitoring device 2 906, the smart meters in both smart meter group A 920 and smart meter group B 922 communicate via the communications system 930. Although wireless communications links are shown in the illustrated example, such communications lines are able to be implemented in various examples via, for example, any combinations of wired links, wireless links, other links, or combinations of these.

The electrical distribution system event processing system 900 includes information processors 940. The information processors 940 in an example include various processors that perform various processing of data. By way of example and without limitation, the information processors 940 in various examples are able to include any combination of multiple processes execution within one or more physical processors, a number of physical processors that are able to be located at one or more physical locations, any distribution of processing functions, or any combination of these.

The communications system 930 in an example provides data received from the various monitors and other systems to information processors 940. In an example, all reports of events received from any monitor associated with the electrical distribution system 960 are stored in an event report storage 946. In an example, the event report storage 946 stores event histories for various events that occur within the electrical distribution system 960, such as event histories of known electrical power outages that have occurred. In an example, processing performed by the information processors 940 accesses and processes previously received reports of events that are stored in the event report storage 946 in order to determine events that are associated with each other.

In an example, a device location and grid schematic data storage 948 stores geographical locations of all devices that report events to the information processors 940. In various examples, the device location and grid schematic data storage 948 stores the geographical location, such as in the form of latitude and longitude values, of each device that is able to report events. The device location and grid schematic data storage 948 in some examples further stores descriptions of electrical lines that interconnect each device to other devices in the electrical distribution system. Such interconnection data supports integrating the topology of electrical power interconnections of devices within the electrical distribution grid into analyses of whether events are related to one another. In an example, the device location and grid schematic data storage stores data describing the lengths of conductors connecting various reporting devices in order to support determining the distance along conductors between two devices that report events.

A trouble ticket system 934 creates and manages service trouble tickets used to support and manage operations and repairs of the electrical distribution system 960. As is generally known, trouble tickets are able to be created based upon various inputs, such as customer complaints of a lack of electrical power or of electrical power service irregularities. The information processors 940 in an example receive information regarding trouble tickets, such as listings of open trouble tickets, trouble tickets that indicate occurrences of various events, other information within trouble tickets, or combinations of these. The information processors 940 in an example determine events indicated by various trouble tickets and determines whether such events are related to other events reported by other sources to the information processors 940. In some systems, the information processors 940 are able to include processing to modify, create, or perform other actions with trouble tickets maintained by the trouble ticket system 934. In an example, processing by the information processors 940 is able to determine events associated with a trouble ticket maintained by the trouble ticket system 934 and modify that trouble ticket to indicate that the event or events determined to be associated with the trouble ticket are the cause of the event indicated by that trouble ticket.

A field observations reporting system 980 communicates information regarding observations reported by, for example, service crews or customers regarding various conditions related to electrical distribution equipment. In an example, the field observations reporting system 980 includes reports received from service crews, other persons such as customers, or other sources, regarding growth of vegetation such as palm trees, bamboo shoots, vines, other growths, or combinations of these.

Other event reporting systems 936 includes other systems that report events associated with the operation, maintenance, other aspects, or combinations of these, of the electrical distribution system 960. The information processors 940 receive or access data associated with events reported by or available via the other event reporting systems 936. The data associated with events reported by or available via the other event reporting systems 936 is processed by the information processors 940 in an example to determine which of those events are associated with each other, are associated with other events reported by various systems, to support other processing, or combinations of these. Events reported by the other event reporting systems are examples of electrical distribution system related events.

In some examples, related events are able to be determined from events and other data stored in any number of suitable systems. In various examples, data regarding events and other conditions is able to be obtained from one or more systems and presented to an operator for analysis or other purposes. Manual review and evaluation of the large number of data items that are stored in each of a large number of event storage systems is often very time consuming and not practical when working under strict time constraints to restore electrical power or resolve other underlying problems in an electrical distribution system. Examples of systems from which data is able to be obtained include, but are not limited to:

1) Fault maps data from automated fault map generation systems that estimate locations of detected line faults based on device readings, in an example this is an automatic process that is performed whenever such events occur.

2) Wind sensor data 931 and/or wind data reports generated from the wind sensors and provided from external sources (e.g., vendors) organized by various time durations, such as by each day, year, or by other durations, obtained from various sources, including external weather data sources.

3) Lightning data 932 and/or lightning reports generated from the EM sensors and provided from external sources (e.g., vendors) indicating lightning activities over a particular time duration, such as year-to-date, obtained from various sources, including external weather data sources.

4) Radar weather data included in radar weather reports 933 provided from external sources (e.g., vendors) that characterizes radar weather events.

5) Information gathered in the field regarding vegetation conditions in the field, which is able to be emailed in from users in the field and stored in a database.

6) Vegetation data that is able to be obtained from various sources such as aerial photography, street/ground based photography, other sources, or combinations of these.

7) Open condition assessments from condition assessment data maintenance systems with data obtained from, for example, users in the field that note conditions that need attention.

8) Customer complaint data is gathered through customer service systems and stored in various databases. Such complaints are able to originate from actual logged customer complaints.

9) FCI (Fault Current Indicator) Fault data is retrieved from operations related databases that contain, for example, recordings from the smart devices in the field.

10) AFS (Automated Feeder Switch) Fault data is retrieved from operations related databases that contain, for example, recordings from smart devices in the field.

11) Trouble ticket data is sourced from the operations related trouble ticket systems.

12) The open equipment log data is sourced from, for example, operations related databases and represents equipment that is in need of replacement or repair.

13) Information regarding known momentary power outages or feeder outages is obtained from various databases and based on actual feeder outage events; or any combination of these.

The condition assessment reports system 982 stores and provides reports indicating condition assessments that are reported by various sources from the field, such as field inspection crews. Condition assessment reports in an example are received and stored in the condition assessment reports system 982 in order to support operations of the electrical distribution system 960. In some examples, the information processors 940 receive the condition assessment reports from the condition assessment reports system 982 and process those reports to determine events that the condition assessment reports may indicate. The events indicated by these received condition assessment reports are then evaluated by the information processors 940 relative to other received events in order to determine whether they are related to other reported events.

A failure prediction system 984 in an example provides estimations of predicted future times of failure for presently operating equipment. In some examples, the failure prediction system 984 receives reports of equipment operations, such as automatic recloser operations, protection relay operations, other operations, or combinations of these, and estimates when a particular piece of equipment is likely to fail. In an example, the failure prediction system 984 tracks and analyzes the Mean Time Between Failure (MTBF) of various electrical distribution system components or system component health, such as by tracking amount of high $I^2T$ exposure for a particular device. In such an example, the failure prediction system 984 may generate a failure prediction system report that, for example, identifies a device that is statistically close to failing and send that predication as an event to the information processors 940. The predicted failure of that device may then be determined to be associated with other reported events and may serve as an indication that failure of that device is a cause of the other reported events. In one example, in addition to determining associated events among reported event, further processing is able to evaluate reported events along with predicted failures of one or more components of the electrical distribution system 960 in order to more completely provide an operator or other processor with a more complete set of information. In such an example, the component predicted to fail may be an underlying cause of other events being reported by monitors within the electrical distribution system.

An operator display 942 in an example presents presentations of data depicting events that are determined to be associated with one another. In various examples, the operator display 942 is able to present lists of indications of events that are determined to be associated with each other, present graphical presentations that indicate relative geographical locations and/or schematic diagrams of events that are determined to be associated with one another, present any other type of display of relevant information to support analyses of multiple events that may be associated with one another, or combinations of these. In some examples, the operator display 942 includes various user interface facilities such as a graphical user interface (GUI) that present information to a user, receive inputs from a user, or both. In an example, the operator display 942 includes user input facilities that allows a user to specify a selection of a particular event to be used as a selected event.

In an example, as is described in further detail below, environmental events, including radar weather events that are related to that selected event are determined based on various processing. In an example, receiving an input from a user, via the user input facilities of the operator display 942, initiates processing to determine reported events that are related to the selected event specified by the received user's input. Moreover, the information processors 940 can overly a visual indicator characterizing radar weather events and/or other environmental events onto a map included in a graphical user interface (GUI) that is by operator display 942. For example, in response to a fault event, the information processors 940 may determine that heavy precipitation is associated with the fault event. In such a situation, the information processors 940 overlays visual indicator representing the heavy precipitation on the map output at the operator display 942 in a manner described herein.

A service dispatch component 944 in an example allows processing within the information processors to initiate service operations on the electrical distribution system. In some examples, at least some of the operations of a service dispatch component 944 are able to be performed via the trouble ticket system 934. In other examples, the service dispatch component is able to support different or additional exchanges of information with service personnel than are supported by the trouble ticket system 934.

Figure 10:
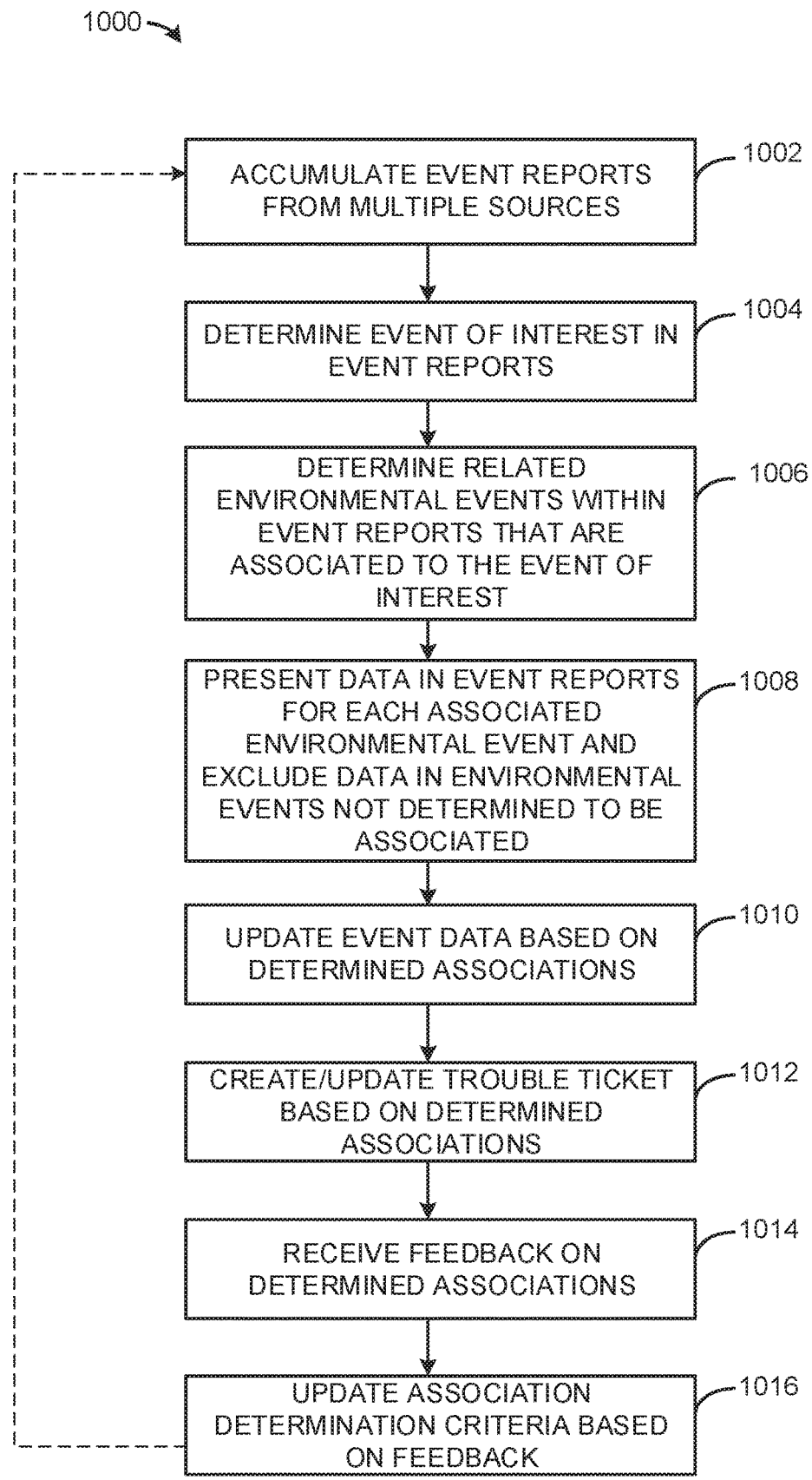
FIG. 10 illustrates another associated event determination process, according to an example.

FIG. 10 illustrates an associated event determination process 1000, according to an example. The associated event determination process 1000 is an example of a process that determines and identifies environmental events that are associated with another event. The event determination process 1000 could be run in concert with the event determination process 200 of FIG. 2. Alternatively, the determination process 1000 could be run indecently from other processes. In the illustrated example, the associated event determination process 1000 depicts determining environmental events that are associated with an event of interest. The illustrated processing depicts determining environmental events that are associated with one event of interest in order to simplify the description of relevant aspects of this processing. In further examples, similar processing is able to determine associated events for any number of reported events, including determining associated events for all events.

The following description of the associated event determination process 1000 refers to the components described above with regards to the electrical distribution system event processing system 900. The associated event determination process 1000 is an example of a process that is performed on the information processors 940 based upon data received from multiple sources, such as by reporting devices sending reports via the communication system, from other systems such as from the trouble ticket system 934, from other systems or sources, or combinations of these.

The associated event determination process 1000 begins by accumulating event reports from multiple sources, at 1002. In various examples, reports indicating various events are received from various sources through the communication system 130 discussed above. These received reports in an example are stored in the event report storage 946. In various examples, accumulating event reports is able to include retrieving event reports from the event reports stored in the event report storage 946, include processing event reports as they are received from various devices, any other receiving or retrieving of event reports, or combinations of these. Additionally, indications of events in various examples are able to be received from any source. Accumulating event reports is an example of receiving a first event report indicating a first event, a second event report indicating a second event that is different from the first event, and receiving a third event report indicating a third event that is different from the first event and the second event. In some examples, at least one of the events indicated by an event report is able to be at least one of a status event of a piece of equipment of the electrical distribution system, an environmental event (including a radar weather event); or an electrical distribution system related event.

An event of interest in one example is determined, at 1004. Determining an event of interest is able to be performed by any suitable technique. For example, an operator is able to select one event as an event of interest from among various events that are reported. Receiving a selection from an operator of an event and using that selected event as an event of interest is an example of receiving a selection of a selected event from within a plurality of events indicated by a respective plurality of event reports, and defining, based on the selection, the selected event as the first event.

In some examples, an event of interest is able to be determined based upon a type of an event that was received. For example, a process may be configured to determine that certain types of reports are indications of events of interest. In an example, a report that a protection relay opened due to an over-current at a substation is able to be defined as an indication of an event of interest. When a report that a protection relay has opened, the associated event determination process 1000 responds by determining that the opening of the protection relay is an event of interest.

The associated event determination process 1000 continues by determining, at 1006, environmental events within the received event reports that are associated with the event of interest. Determining which environmental events are associated with the event of interest is able to be performed by any one or by any number of suitable techniques or criteria. In some examples, environmental events associated with the event of interest are determined by comparing data describing environmental events that are described in received reports to data describing the event of interest.

The comparisons in various examples are able to be based on various criteria. In some examples, associated events are able to be defined as any environmental event (including radar weather events) that occurred within a specified time period of the event of interest and that are also within a certain geographic or schematic distance of the event of interest based on a location associated with the event of interest and associated with the event being evaluated. In some examples, an environmental event is determined to be associated with the event of interest if the environmental event is within a certain distance along electrical distribution lines (e.g., schematic distances or geographical distances) that is associated with the event of interest. In some examples, environmental events are able to be determined to be associated with the event of interest based upon combinations of relationships, such as proximity between the environmental events and the event of interest in one or more of either time, distance, or combinations of these.

In an example, environmental events may be determined to be associated with the event of interest based on both time differences and distances between the particular environmental events and the event of interest both being below respective thresholds. In that same example, the event of interest may be determined to not be associated with another environmental event where the time differences between the event of interest and the other environmental event is below a time difference threshold, but the distance between the event of interest and the other environmental event is greater than a distance threshold.

In some examples, the associated event determination process 1000 is able to determine whether events are associated with one another, at 1006, based on different criteria. In an example, events are determined to be associated with one another if they are within a certain geographic area and occur within one minute of each other. In another example, events are determined to be associated with one another if they are within a certain geographic area and occur within one hour or other specified time interval of each other. In some examples, determining events associated with the event of interest determines environmental events that occur within a specified time interval before the event of interest.

In some examples, a given environmental event and the event of interest are able to be determined to be associated with one another based upon relationships between the given environmental event and the event of interest, and another environmental event that is separate from the given environmental event and the event of interest. Such an association is able to be determined in an instance where an initial analysis of the data associated with the given environmental event and the event of interest would indicate that the given environmental event and the event of interest are not associated with one another. In an example, a given environmental event and the event of interest based upon a determination of an association between the given environmental event and the other environmental event, and further based upon a determination of an association between the event of interest and the other environmental event.

Data in events reports for each of the determined associated environmental events is presented, at 1008, while the presentation excludes data in environmental events that were determined to not be associated. The presentation in various examples includes visual presentations, providing data to another process for further processing, assembling statistics, providing the data to any data recipient process or display, any other type of presentation, or combinations of these. In some examples, data is graphically presented in a manner that indicates a geographical relationship or schematic relationship between and among the event of interest and the determined associated environmental events. In an example, this grouping allows a visual analysis of the interrelationships among the environmental events that are determined to be associated with the event of interest.

In an example, data about the reported events is updated, at 1010. In various examples, further data about a particular event is able to be determined based upon characteristics of events that are determined to be associated with that particular event. For example, if data within a radar weather report characterizing a radar weather event indicates heavy precipitation (e.g., rain, sleet or snow) within a time interval before and geographically near a reported line fault supports an inference that the heavy precipitation likely caused the reported line fault. In such an example, a report of the line fault, is able to be updated to include information characterizing the heavy precipitation (e.g., a boundary, a type of precipitation, a severity and/or a time), which may have caused of the reported line fault.

In another example, analysis of data within a report of an occurrence of a lightning strike that occurs within a time interval before and geographically near a reported power outage event supports an inference that the lightning strike likely caused the reported power outage. In such an example, a report of the power outage is able to be updated to reflect that the lightning strike was likely the cause of the reported power outage. Additionally, the report is able to be updated to include information characterizing the lightning strike (e.g., location and/or time).

In an example, a trouble ticket is able to be created or updated based on the determined associations, at 1012. In an example as described above of heavy precipitation that occur within a specified time interval prior to a report of a line fault on a feeder line that geographically near the heavy precipitation, a trouble ticket for the line fault is able to be created to repair the line fault. In an example, trouble ticket created for the line fault is able to be augmented/updated to indicate that the line fault is likely caused by the heavy precipitation in an area of the feeder line that experienced the heavy precipitation.

In an example, feedback is received, at 1014, on the determined associations. In some examples, feedback is able to be received in various forms. In some examples, an operator is able to provide feedback that specifies whether an environmental event that was determined to be associated with the event of interest is not really associated, or whether an environmental event that was determined to not be associated should have been determined to be associated with the event of interest. In another example, a user of the presented data is able to, for example, associate some environmental events as being more closely related to the event of interest. In some examples, an operator is able to identify that the event of interest was at least in-part caused by another reported environmental event. For example, an event of interest may be a loss of power, and associated environmental event may be high winds the geographical area of the loss of power. In such an example, an operator may judge that the high winds are at least partially a cause for the nearby loss of electrical power.

Based upon this received feedback in some examples, criteria for determining associated events are updated, at 1016. For example, criteria such as the maximum geographical distance between two associated events is able to be adjusted based on the geographic distance between two events that received feedback indicates are associated with each other. Similarly, the maximum time differences between events that are to be determined to be associated with one another are able to be adjusted based on time differences between events that feedback indicates are associated with one another.

In an example, the associated event determination process 1000 returns to accumulating event report from multiple sources, at 1002. In various examples, iterations of the associated event determination process 1000 are able to be executed where different events of interest are able to be determined, such as being selected by an operator, and events associated with those different events of interest are then identified. The above described processing is then re-iterated. In other examples, event determination process 1000 can end.

Figure 11:
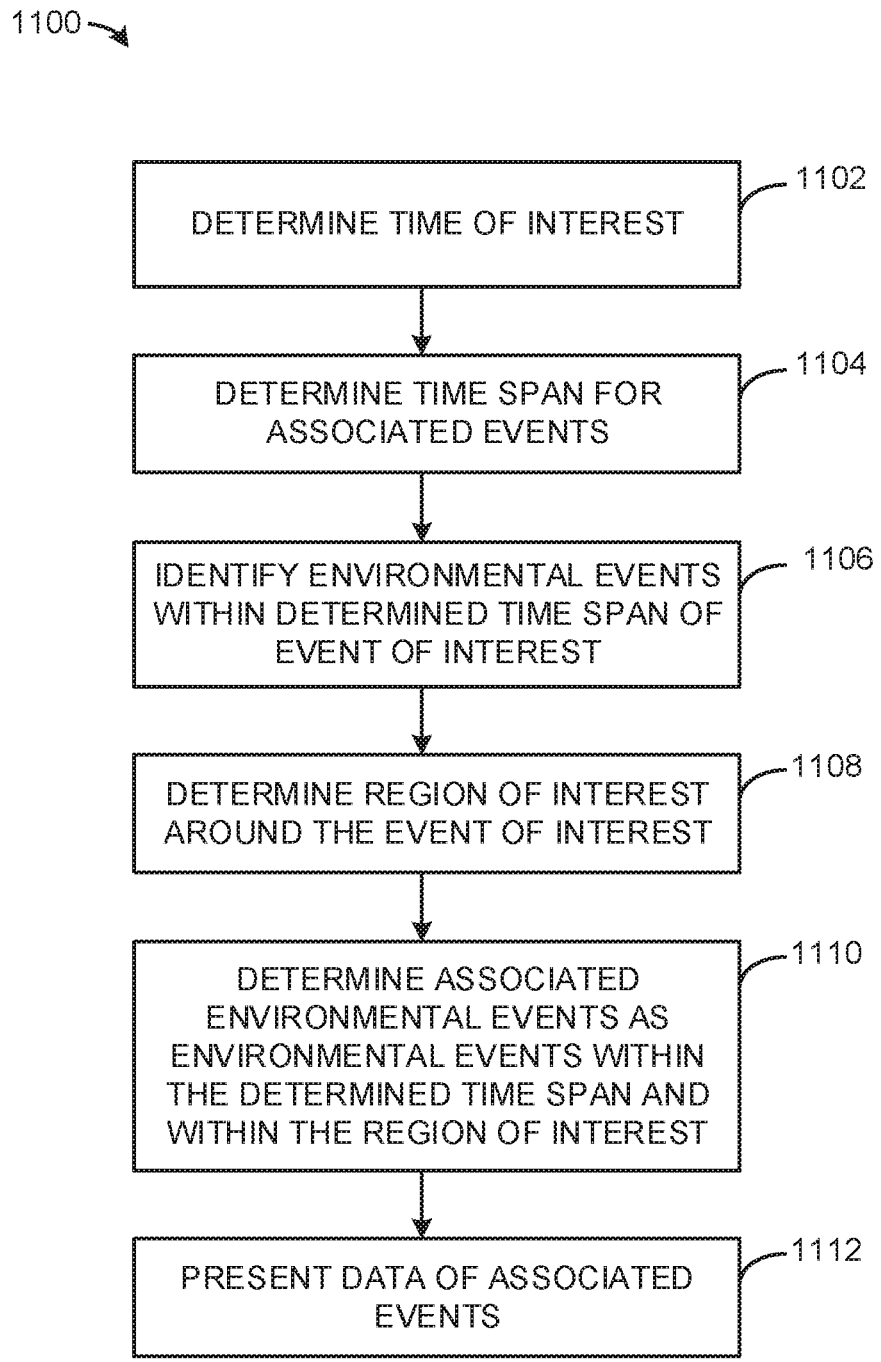
FIG. 11 illustrates another time and location associated event determination process, according to an example.

FIG. 11 illustrates a time and location associated event determination process 1100, according to an example. The time and location associated event determination process 1100 is an example of a process performed as part of the above described associated event determination process 1000. With reference to the above description, the time and location associated event determination process 1100 is an example of processing included in determining related events within event reports that are associated with events of interest 1006.

The time and location associated event determination process 1100 determines, at 1102, a time associated with the event of interest. As described above, the event of interest is able to be determined by any suitable technique. In some examples, the event of interest is specified by an operator or by another automated process controlling the operation of processes that determine associated events. In various examples, a report of an event that is determined to be the event of interest specifies a time associated with the event. In some examples, this time is a time at which the event occurred. In further examples, this time is a time during which the event occurred, a time at which the event stopped, any other time associated with the event of interest, or combinations of these. In some examples, a time of an event of interest is able to specify a time span over which the event of interest occurred, a time span over which the event of interest affected operations of any system, other time spans, or combinations of these.

A time span for related environmental events is determined, at 1104. The time span for associated environmental events in an example is the time span over which to search for events that may be associated with the event of interest. In some examples, a determined time span is able to be one minute, one hour, one day, another interval of time, or any combination of these. In an example, environmental events occurring outside this time span are determined to be not associated with the event of interest. In some examples, the time span is determined based upon a specification by an operator of the time span of interest around the determined event of interest that may contain events of interest. In some examples, this time span is able to be based upon the type of event that is determined to be an event of interest. For example, time spans for events associated with an event of interest such as a lightning strike may be one minute, while time spans for events associated with an event of interest such as a particular trouble ticket that indicates a facility does not have power may be longer, such as ten (10) minutes, one hour, other intervals, or combinations of these. In some examples, the time span is able to be a time interval of the determined duration that occurs before the above determined time associated with the event of interest, a time interval of the determined duration that occurs after the above determined time associated with the event of interest, a time interval that spans both before and after the above determined time associated with the event of interest, a time interval that has any temporal relationship to the above determined time associated with the event of interest, or any combination of these.

Environmental events that occur within the determined time span (e.g., a threshold time difference) of the event of interest are identified, at 1106. In an example, such events are identified by examining received reports of events and identifying each environmental event that occurred within the determined time span. In some examples, times associated with events are specified or otherwise indicated within the received reports for various events.

A region of interest around a location associated with the event of interest is determined, at 1108. The size (boundary) of a region of interest around locations associated with an event of interest (e.g., a threshold distance) is able to be determined based on any criteria. In some examples, the region of interest is specified as a geographic area around the event of interest. In some examples, that geographic area is able to have its boundaries specified by any suitable technique, such as by the latitude and longitude values of those boundaries. In some examples, the region of interest is specified according to distances along an electrical distribution line (e.g., schematic distances or geographic distances), that connect to the device reporting the event of interest by less than a specified length.

In an example, associated environmental events are determined, at 1110, where the associated environmental events are environmental events that are reported to have occurred within the determined time span and within the region of interest. In some examples, environmental events are determined to be associated or not associated based on proximities of the events to one another, where the proximity is able to be one or more of a time difference, schematic distance, a geographic distance, or combinations of these. In an example, determining associated environmental events consists of processing each report of environmental events that are received from all reporting systems and excluding environmental events that occurred outside of the determined time span (e.g., a threshold time difference) and outside of the determined geographic area. In some examples, environmental events that are within the determined geographic area are determined based upon identifying a location within the electrical distribution system of the device that reported the event of interest, and then identifying reports of candidate environmental events that are received from devices connected along electrical distribution lines to the device that reported the event of interest by less than a specified distance (e.g., a threshold distance). In various examples, the specified distance is able to be specified by any suitable technique, which may include a number and/or type of intervening devices or grid elements, or the length of the conductors of the electrical distribution system that are between the candidate environmental event and the device reporting the event of interest.

Distances along conductors connecting devices in the electrical distribution system are referred to herein as distances according to the electrical power line routings. In an example, these conductors are also able to connect with other devices that also report events. In an example, environmental events that are reported, which are near (in either direction) conductors of the electrical distribution systems, e.g., devices that are either upstream or downstream of the device reporting the event of interest, are considered.

The data of the associated environmental events is then presented, at 1112. This presentation is an example of the presenting data event reports, at 1008, as described above with respect to FIG. 10. This presentation is able to include any action conveying any data associated with the determined associated events, including visual presentation, electronic communication of any data associated with determined associated events to another process or device, any other communications of any data associated with determined events, or any combination of these. The time and location associated event determination process 1100 then ends.

Figure 14:
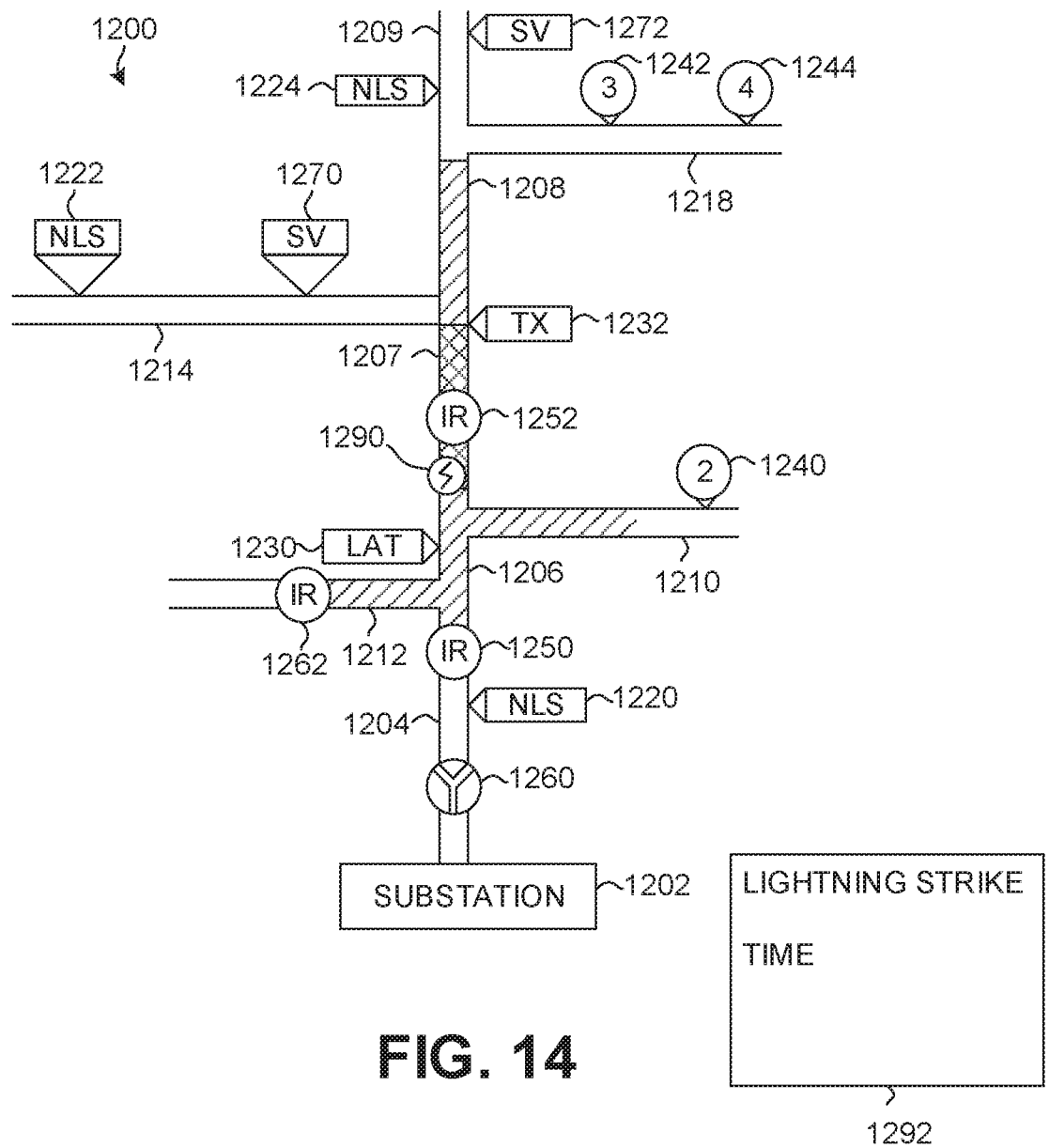
FIG. 14 illustrates an example user interface of a schematic view of an electrical power distribution system that includes a visual indicator for a lightning strike, according to an example.

FIG. 14 illustrates an example user interface 1200, according to an example. The example user interface 1200 illustrates a schematic view of portions of a simplified electrical distribution system and reported events that have been determined to be associated with one another. The example user interface 1200 depicts associated reported events and components of the portion of the electrical distribution system that are within the geographic bounds at the edges of the example user interface 1200. The example user interface 1200 is an example of a display presented to, for example, a user on a workstation such as the above described operator display 942 of FIG. 9. The example user interface in an example is produced by the above described information processors 940 of FIG. 9 based on various reported events that are obtained from any of a variety of sources. The example user interface 1200 depicts a subset of those reported events that have been filtered based on various criteria to determine which events are related to one another. As described above, such filtering is able to be based on a time frame of when the events occurred, distances between the events, other criteria, or combination of these.

The example user interface 1200 depicts a simplified electrical distribution network that includes a substation 1202, various portions or segments of a single feeder line that receives electrical power from the substation, and several lateral lines that are connected to and that receive power from that feeder line. In further examples, a similar user interface is able to present the relevant elements of the electrical distribution system being monitored or analyzed, which often include multiple feeder lines and many lateral lines.

The example user interface 1200 includes indications of likelihoods that a detected fault condition is located at various portions of the depicted feeder line and lateral lines. In an example, the detected fault may be a reason why an operator would choose to view related events. In an example, a particular event within all reported events, such as the operation of an Automated Feeder Switch ("AFS") that indicates a line fault, is able to be selected by an operator and all events related to that selected event are depicted on the user interface. In general, analysis of occurrences and causes of any condition, such as any type of line fault, any type of distribution system abnormality, other condition, or combinations of these, is able to be facilitated by use of a user interface similar to the depicted example user interface 1200.

The substation 1202 in this example provides electrical power to a first feeder line segment 1204. The first feeder line segment 1204 has a first fault current indicator 1260. The Fault Current Indicator (FCI) 1260 monitors the electrical current that flows through that device and processes data measured during detected overcurrent events to estimate a location of an electrical fault that may have caused the detected overcurrent event. The first feeder line segment 1204 further has an indication of a first trouble ticket 1220, which reads "NLS" to indicate it is a "No Loss of Service" trouble ticket. A first "Automated Feeder Switch" ("AFS") or "IntelliRupter" ("IR") 1250 is depicted as connecting the first feeder line segment 1204 to a second feeder line segment 1206.

In this example, automated processing of overcurrent events processes data contained in event reports that was collected in association with detected faults to estimate the location of that detected fault. Estimated fault location data in some examples provide probability values that indicate, at various points along conductors of an electrical distribution system, whether the detected fault had occurred at that particular point. The example user interface 1200 depicts, as is described in further detail below, a composite fault map for the portion of the electrical distribution system that it depicts. In an example, the depicted composite fault map indicates a respective composite line fault likelihood value for each displayed point or line segment. In the example user interface 1200, displayed portions of the electrical distribution system include single crosshatched portions to indicate segments with a medium likelihood of being the location of a detected line fault. The example user interface 1200 also includes double crosshatched portions to indicate segments with a high likelihood of being the location of a detected line fault. Areas without crosshatching indicate segments with a low likelihood of being the location of a detected line fault.

In various examples, as is also described in further detail below, such portions of the fault maps, including composite fault maps, of an electrical distribution system are able to be depicted with different colors, such as portions of distribution lines in red indicating an extremely high likelihood of a fault, portions in orange indicating a very high likelihood of a fault, portions in yellow indicating medium high likelihood of a fault, and lines with a low likelihood of being a location of a fault being depicted in different colors. In some examples, different portions of distribution lines that are determined to have a low likelihood of being a location of a detected fault are depicted in various different colors to allow a viewer to easily visualize and distinguish different lines, such as different feeder line segments or lateral lines, according to the geographical layout and design and of the particular electrical distribution system.

The second feeder line segment 1206 depicted in the example user interface 1200 is depicted as having a single cross hatch pattern and is show to be connected to, and thus able to provide electrical current to, a first lateral line 1212 and a second lateral line 1210. The first lateral line 1212 is also depicted with a single crosshatch to indicate that there is a medium likelihood that a detected fault is located on the first lateral line 1212. The first lateral line 1212 further includes a second AFS 1262.

A portion of the second lateral line 1212 is depicted with a single crosshatch to also indicate that there is a medium likelihood that a detected fault is located on the second lateral line 1212. A second trouble ticket 1230, which reads "LAT" to indicate it is a "lateral" trouble ticket, is depicted near the junction of the second feeder line segment 1206 and the second lateral line 1212. The second lateral line 1212 also includes a first condition assessment 1240, which indicates that an inspection of the second lateral line 1210 produced an assessed condition severity of "2."

A third feeder line segment 1207 is depicted with a double crosshatch to indicate that there is a high likelihood that a detected fault occurred in this portion of the feeder line. The third feeder line segment 1207 further includes a third AFS or "IntelliRupter" 1252, which operates in a manner similar to that of a recloser. The third feeder line segment 1207 in this example extends to a junction of a third lateral line 1214, where the feeder line continues as a fourth feeder line segment 1208.

The fourth feeder line segment 1208 is depicted with a single crosshatch to indicate a medium likelihood that a detected fault has occurred in this segment of the feeder line. A third lateral line 1214 is depicted as having no crosshatching, thus indicating that there is a low likelihood of the detected fault having occurred in the third lateral line 1214.

In the illustrated example user interface 1200, a depiction of a composite fault map that shows a medium or high likelihood that a line fault occurred in the second feeder line segment 1206, the first lateral line 1212, the second lateral line 1210, the third feeder line segment 1207, and the fourth line feeder segment 1208. These segments are depicted in this example with crosshatching indicating either a medium or high likelihood that a detected fault has occurred in those segments. In some examples, the other depicted segments that are not shown with crosshatching are also part of a composite fault map but are depicted to indicate a low, but not necessarily zero, probability that a detected line fault has occurred in those segments.

A third trouble ticket 1232 is located near the intersection of the third lateral line 1214 and the feeder line. The third trouble ticket 1232 reads "TX," which indicates it is a transformer trouble ticket. The third lateral line 1214 also has a fourth trouble ticket 1270 which reads "SV," indicating that it is a "Service" ticket, and an fifth trouble ticket 1222 which reads "NLS" indicating it is a "No Loss of Service" trouble ticket.

A fifth feeder line segment 1209 is depicted without crosshatching to indicate a low likelihood that the detected fault occurred in this segment of the feeder line. The fifth feeder line segment 1209 includes a fifth trouble ticket 1224 that reads "NLS" to indicate it is a "No Loss of Service" trouble ticket, and also has a sixth trouble ticket 1272 that reads "SV" indicating it is a "Service" ticket. A fourth lateral line 1218 is connected to, and thus received electrical power from, the fifth feeder line segment 1209. The fourth lateral line 1218 has a second condition assessment 1242, which indicates a severity of "3," and a third condition assessment 1244, which indicates a severity of "4."

The user interface 1200 also includes a visual indicator 1280 that depicts a radar weather event that is determine to be associated with the fault that may be present at the third feeder segment 1207. The visual indicator 1280 covers a schematic area corresponding to a geographic area of a radar weather event (e.g., precipitation, a tornado, a hurricane, etc.) characterized in a radar weather report 933 of FIG. 9. In some examples, trouble tickets that are within or near the area overlaid by or in proximity with the visual indicator 1280 may be augmented to add data that characterizes the radar weather event (e.g., time, type, severity, location (a boundary), etc.). For instance, in the user interface 1200, the trouble tickets 1270, 1232 and/or 1222 may be edited (augmented) to add data identifying the radar weather event corresponding to the visual indicator 1280. In this manner, a service crew dispatched to remedy the fault corresponding to a trouble ticket can initially search a smaller region that has an increased likelihood of a fault due to the heavy precipitation characterized by the visual indicator 1280. In an example, a feeder may be configured to provide power to a region that is about 20 kilometers (12 miles) long. In such a situation, a fault event for the feeder includes a timestamp of 1 Dec. 2017 at 6:30 a.m. Augmentation of the trouble ticket for the feeder that includes a location of the precipitation reduces the area of service for the trouble ticket from the length of the feeder (20 km/12 miles) to a relatively small zone (e.g., less than about 2 kilometers).

The user interface 1200 also includes a text box 1282. The text box 1282 outputs information characterizing the radar weather event. The information in the text box 1282 can include a type (e.g., rain, sleet, snow, hail, tornado, hurricane, etc.) of the radar weather event. The information can also include a severity (e.g., light, medium, heavy or other characterization) of the radar weather event. The information in the text box 1282 can also include a time that the radar weather event is reported in the radar weather report 933 of FIG. 9.

Figure 12:
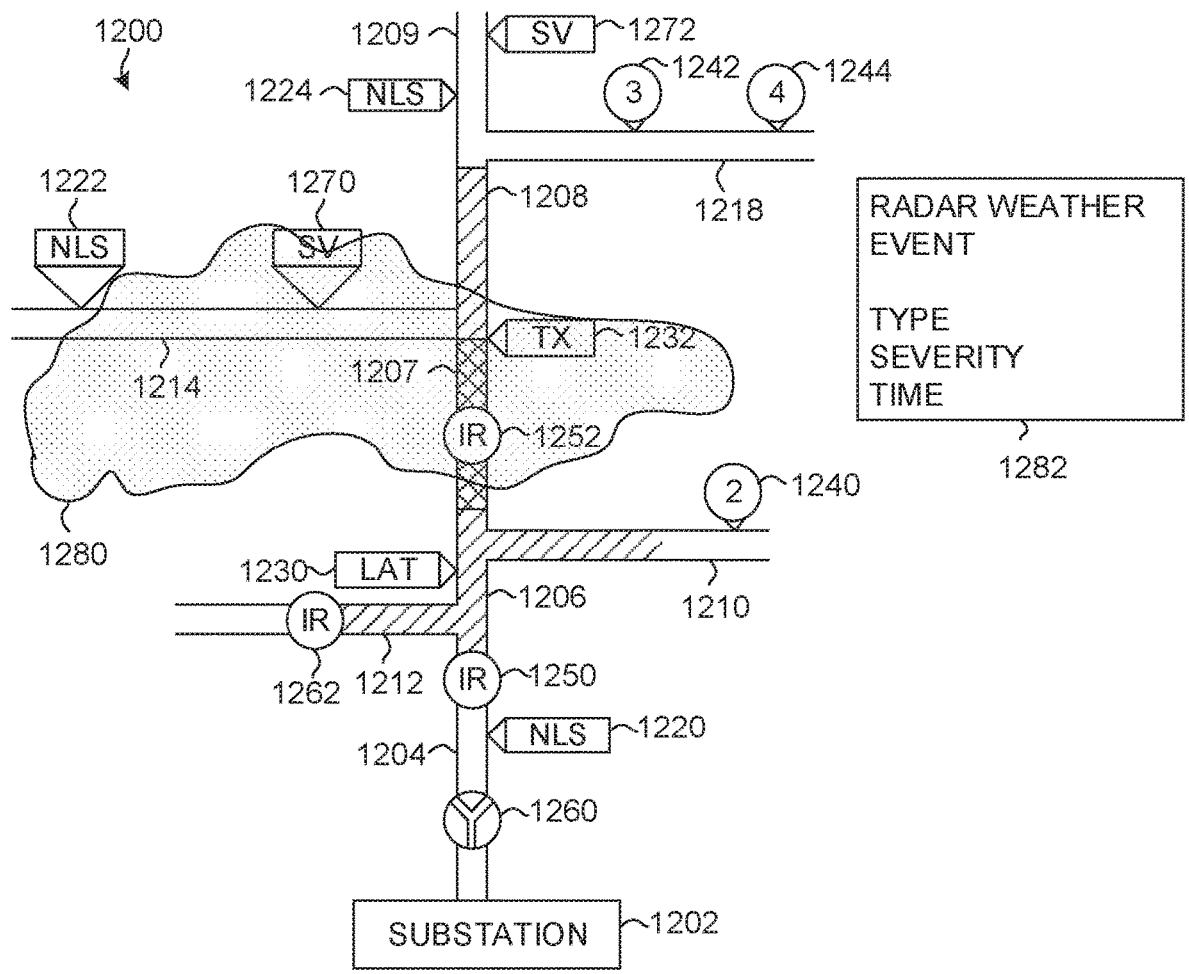
FIG. 12 illustrates an example user interface of a schematic view of an electrical power distribution system that includes a visual indicator for a radar weather event, according to an example.
Figure 13:
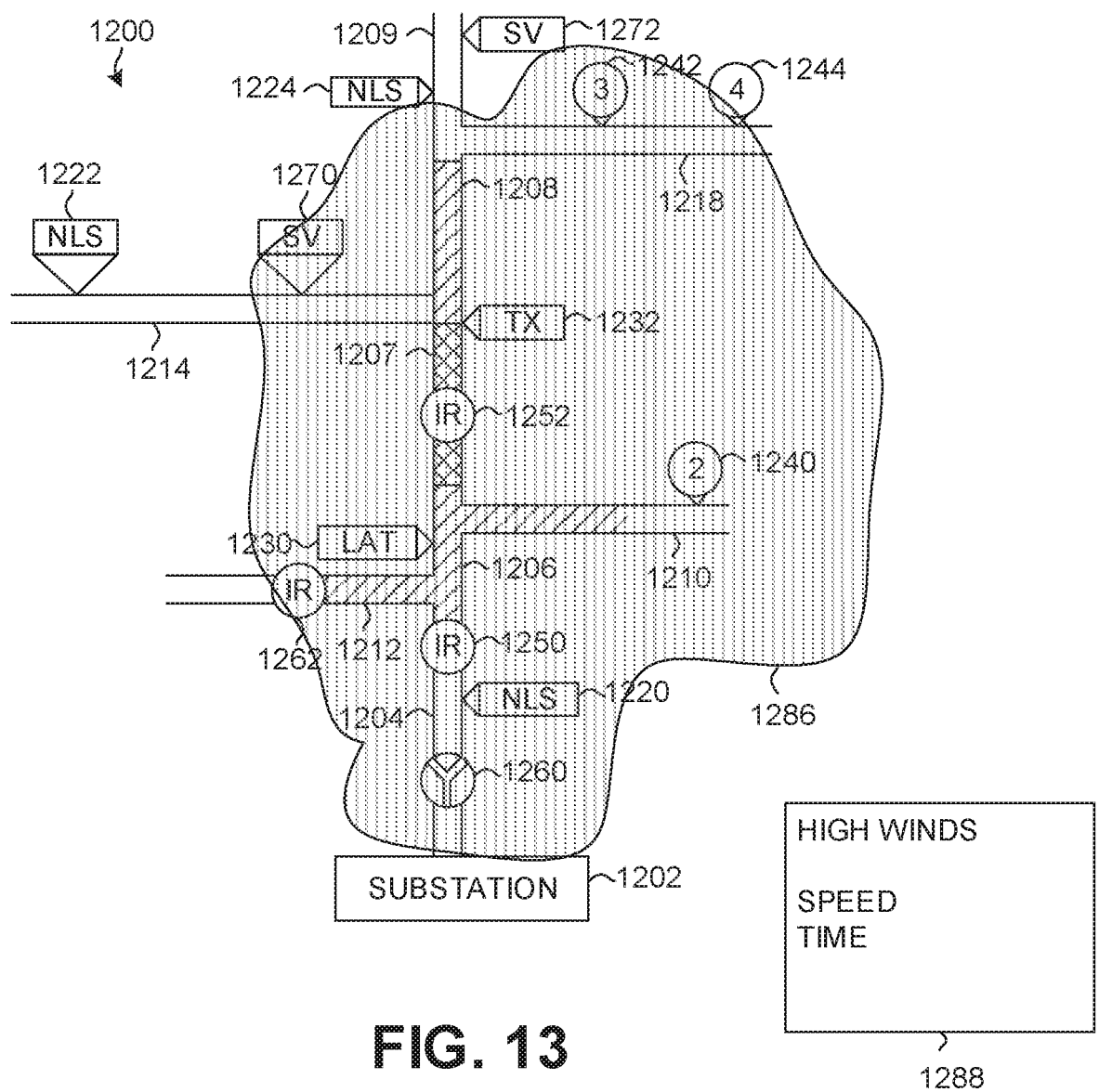
FIG. 13 illustrates an example user interface of a schematic view of an electrical power distribution system that includes a visual indicator for high winds, according to an example.

FIG. 13 illustrates the user interface 1200 of FIG. 12, wherein a visual indicator 1286 depicting an area with high winds reported by the wind sensor data 931 of FIG. 9 overly a portion of the electrical distribution system. In such a situation, the trouble tickets that are within the area overlaid by or in proximity with the visual indicator 1280 may be augmented to add data that characterizes the wind event (e.g., time, wind speed, location (a boundary), etc.). For instance, in the user interface 1200 of FIG. 13, the trouble tickets 1220, 1230, 1232 and/or 1270 may be edited to add data identifying the high wind event characterized by the visual indicator 1286. In this manner, a service crew dispatched to remedy the fault corresponding to a trouble ticket can initially search a smaller region that has an increased likelihood of a fault due to the high wind event.

The user interface 1200 also includes a text box 1288. The text box 1288 outputs information characterizing the high winds. The information in the text box 1288 can include a speed of the high winds. The information in the text box 1282 can also include a time that the high winds are detected by the wind sensor data 931 of FIG. 9.

FIG. 14 illustrates the user interface 1200 of FIG. 12, wherein a visual indicator 1290 (e.g., an icon) depicting a location of a lighting strike reported by the lightning data 932 of FIG. 9 overlays a portion of the electrical distribution system. In such a situation, the trouble tickets that are within proximity of the visual indicator 1290 may be augmented to add data that characterizes the lighting strike (e.g., time, location, etc.). For instance, in the user interface 1200 of FIG. 14, the trouble tickets 1230 and 1232 may be edited to add data identifying the lighting strike characterized by the visual indicator 1290. In this manner, a service crew dispatched to remedy the fault corresponding to a trouble ticket can initially search a smaller region that has an increased likelihood of a fault due to the lightning strike.

The user interface 1200 also includes a text box 1292. The text box 1292 outputs information characterizing the high winds. The information in the text box 1292 can include a speed of the lightning strike. The information in the text box 1292 can also include a time that the lightning strike is reported by the lightning data 932 of FIG. 9.

Figure 15:
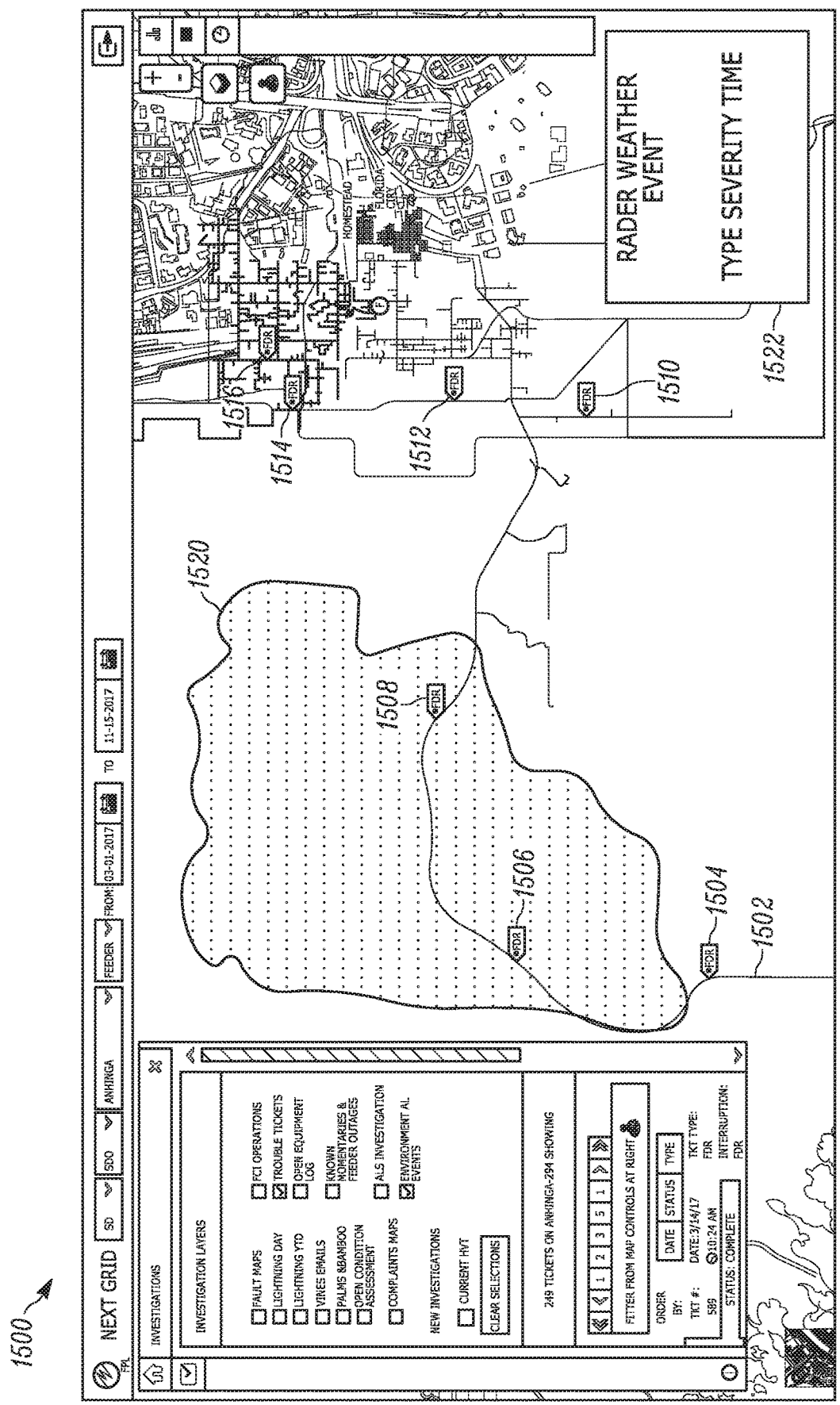
FIG. 15 illustrates an example user interface of a geographical view of an electrical power distribution system that includes a visual indicator for a radar weather event, according to an example.

FIG. 15 illustrates another user interface 1500, according to an example. The example user interface 1500 illustrates a geographical view of portions of a simplified electrical distribution system and reported events that have been determined to be associated with one another. The example user interface 1500 depicts associated reported events and components of the portion of the electrical distribution system that are within the geographic bounds at the edges of the example user interface 1500. The example user interface 1500 is another example of a display presented to, for example, a user on a workstation such as the above described operator display 942 of FIG. 9. It is understood that in some examples, the user of the workstation could switch between a schematic view of the electrical distribution system, as illustrated in FIGS. 12-14 and the geographical view of the electrical distribution system, as illustrated in FIG. 15.

The example user interface in an example is produced by the above described information processors 940 of FIG. 9 based on various reported events that are obtained from any of a variety of sources. The example user interface 1500 depicts a subset of those reported events that have been filtered based on various criteria to determine which events are related to one another. As described above, such filtering is able to be based on a time frame of when the events occurred, distances between the events, other criteria, or combination of these.

In particular, the user interface 1500 includes a geographical layout of a feeder 1502. The user interface 1500 also includes first-seventh trouble tickets 1504, 1506, 1508, 1510, 1512, 1514 and 1516. The user interface 1500 also includes visual indicator 1520 for a radar weather event (e.g., precipitation, a tornado, a hurricane, etc.). The visual indicator 1500 overlays the geographical layout of the feeder 1502 with a border corresponding to the geographical coordinates of the radar weather event.

In the example illustrated, it is presumed that the first trouble ticket 1504, the second trouble ticket 1506 and the third trouble ticket 1508 have been determined to be associated with the radar weather event. The visual indicator 1500 could be output in the user interface 1500 in response to selection of the first trouble ticket 1504, the second trouble ticket 1506 and/or the third trouble ticket 1508. In such a situation, the first trouble ticket 1504, the second trouble ticket 1506 and/or the third trouble ticket 1508 can be augmented to include information characterizing the radar weather event (e.g., type, location (boundary), severity and time).

The user interface 1500 also includes a text box 1522 that characterizes information related to the radar weather event corresponding to the visual indicator 1520. The information in the text box 1522 can include a type (e.g., rain, sleet, snow, hail, tornado, hurricane, etc.) of the radar weather event. The information can also include a severity (e.g., light, medium, heavy or other characterization) of the radar weather event. The information in the text box 1522 can also include a time that the radar weather event is reported in the radar weather report 933 of FIG. 9.

Figure 16:
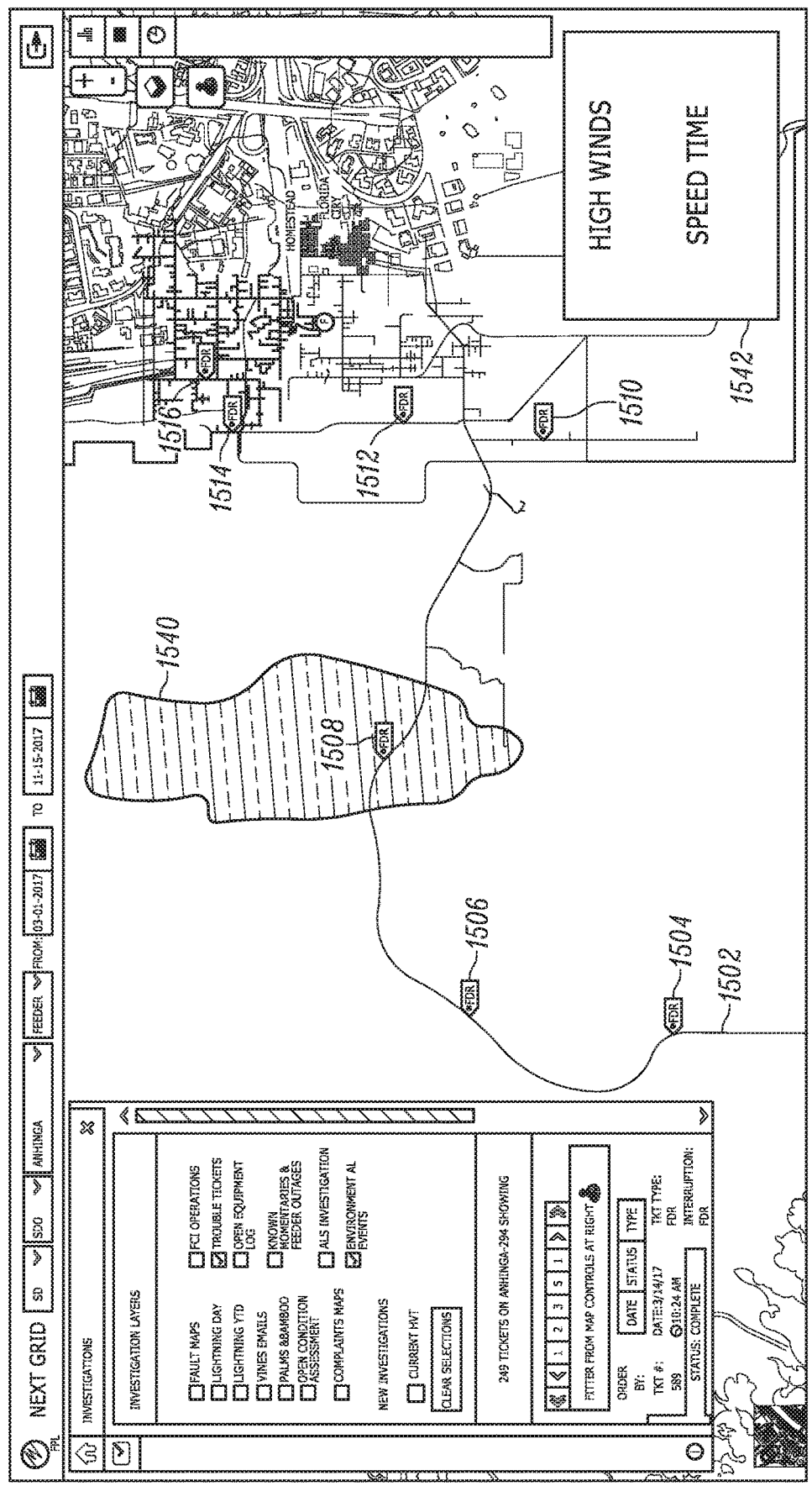
FIG. 16 illustrates an example user interface of a geographical view of an electrical power distribution system that includes a visual indicator for high winds, according to an example.

FIG. 16 illustrates the user interface 1500 of FIG. 15, wherein a visual indicator 1540 depicting an area with high winds reported by the wind sensor data 931 overlays a geographic region serviced by the electrical distribution system. In such a situation, the trouble tickets that are within the area overlaid by or in proximity with the visual indicator 1540 may be augmented to add data that characterizes the wind event (e.g., time, wind speed, location (a boundary), etc.). For instance, in the user interface 1500 of FIG. 16, the trouble ticket 1508 may be edited to add data identifying the high wind event characterized by the visual indicator 1540. In this manner, a service crew dispatched to remedy the fault corresponding to a trouble ticket can initially search a smaller region that has an increased likelihood of a fault due to the high wind event.

The user interface 1500 also includes a text box 1542. The text box 1542 outputs information characterizing the high winds. The information in the text box 1542 can include a speed of the high winds. The information in the text box 1542 can also include a time that the high winds are detected by the wind sensors corresponding to the wind sensor data 931 of FIG. 9.

Figure 17:
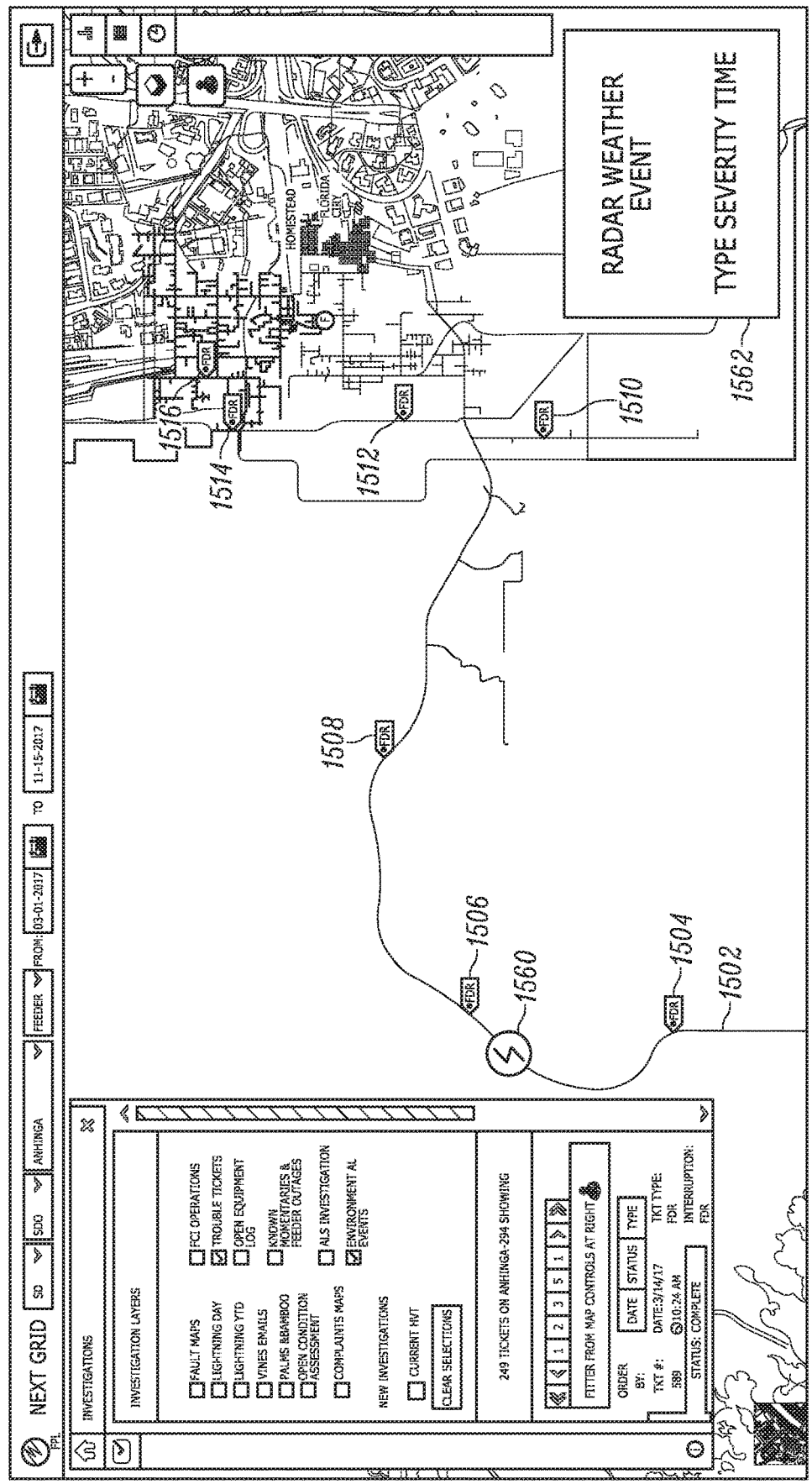
FIG. 17 illustrates an example user interface of a geographical view of an electrical power distribution system that includes a visual indicator for a lightning strike, according to an example.

FIG. 17 illustrates the user interface 1500 of FIG. 15, wherein a visual indicator 1560 (e.g., an icon) depicting a location of a lighting strike reported by the lightning data 932 overlays a portion of the electrical distribution system. In such a situation, the trouble tickets that are within proximity of the visual indicator 1560 may be augmented to add data that characterizes the lighting strike (e.g., time, location, etc.). For instance, in the user interface 1500 of FIG. 17, the first trouble ticket 1504 and/or the second trouble ticket 1506 may be edited to add data identifying the lighting strike characterized by the visual indicator 1560. In this manner, a service crew dispatched to remedy the fault corresponding to a trouble ticket can initially search a smaller region that has an increased likelihood of a fault due to the lightning strike.

The user interface 1500 also includes a text box 1562. The text box 1562 outputs information characterizing the lightning strike. The information in the text box 1562 can include a time that the lightning strike is detected by the lightning data 932 of FIG. 9.

Referring back to FIG. 9, by employing the electrical distribution system event processing system 900 environmental events (including radar weather events) that are associated with a fault (e.g., a line fault) or other event can be depicted on the operator display 942. In this manner, a viewer (e.g., a user) of the operator display 942 can quickly ascertain a likely location of the fault.

Moreover, as described, trouble tickets can be augmented by the trouble ticket system 934 to include information characterizing the environmental event associated with the fault or other event. In this manner, service crews can be dispatched by the service dispatch in an efficient manner. In particular, information regarding the location of environmental events (e.g., lightning strikes, heavy precipitation, high winds, etc.) may assist a dispatched service crew in finding and remedying a problem that caused the fault or other event.

Additionally, as noted each event can be stored in the event report storage 946. Thus, in some examples, a user of the GUI output at the operator display 942 can request a fault history for a given electrical element of the electrical distribution system 960 that includes a list of fault events and the environmental events that have been determined to be associated with each of the fault events. In this manner, the information processors 940 can output multiple maps in the operator display (schematic and/or geographic maps) with different environmental events for different fault events. From such a view, the user of the operator display 942 ascertain how the grid elements react to particular environmental events.

NON-LIMITING EXAMPLES

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A method for overlaying a visual indicator of a radar weather event onto a map comprising:

determining a location probability distribution for a location of a line fault along an electrical line of an electrical distribution system;
outputting the location probability distribution in a graphical user interface (GUI) comprising a map of the electrical distribution system;
identifying a radar weather event associated with the line fault based on a radar weather report;
augmenting a trouble ticket for the line fault with information characterizing the identified radar weather event; and
overlaying a visual indicator representing the radar weather in map of the GUI.

2. The method of claim 1, wherein the radar weather event corresponds to at least one of precipitation, a hurricane and a tornado.

3. The method of claim 1, wherein the information characterizing the radar weather event comprises a boundary for the identified radar weather event.

4. The method of claim 3, wherein the information characterizing the radar weather event further comprises a severity of the radar weather event.

5. The method of claim 1, wherein the radar weather report indicates that the radar weather event is detected prior to the line fault.

6. The method of claim 1, wherein the map in the GUI comprises a schematic view of a portion of an electrical power distribution system.

7. The method of claim 1, wherein the map in the GUI comprises a geographical view of a portion of an electrical power distribution system.

8. A composite fault map processor, comprising:
a processor;
a memory communicatively coupled to the processor;
the processor, when operating, being configured to:
 determine a composite location probability distribution for the location of a line fault along an electrical line of an electrical distribution system;
 output a graphical user interface (GUI) that provides the composite location probability distribution;
 identify an environmental event associated with the line fault based on report data received at the processor;
 overlaying visual indicator representing the environmental event in the GUI; and
 augment a trouble ticket associated with the line fault for dispatch of a service crew to include information characterizing the environmental event.

9. The composite fault map processor of claim 8, wherein the environmental event comprises a lightning strike.

10. The composite fault map processor of claim 8, wherein the environmental event comprises high winds.

11. The composite fault map processor of claim 8, wherein the environmental event comprises a radar weather event identified in a radar weather report provided to the processor.

12. The composite fault map processor of claim 11, wherein the radar weather event comprises one of rain, snow and sleet.

13. The composite fault map processor of claim 8, wherein the map in the GUI comprises a schematic view of a portion of an electrical power distribution system.

14. The composite fault map processor of claim 8, wherein the map in the GUI comprises a schematic view of a portion of an electrical power distribution system.

15. The composite fault map processor of claim 8, wherein the processor is further configured to output an event history for a selected electrical element of the electrical distribution system in the GUI, wherein the event history for the selected electrical element identifies a list of faults and associated environmental events for the selected electrical element.

16. A method for overlaying a visual indicator of an environmental event onto a map comprising:
determining a location probability distribution for a location of a line fault along an electrical line of a power distribution system;
outputting the location probability distribution in a graphical user interface (GUI) comprising a map depicting a portion of the power distribution system;
identifying an environmental event associated with the line fault based on a report;
overlaying a visual indicator representing the environmental event in the map of the GUI; and
augmenting a trouble ticket for dispatch of a service crew for the line fault with information characterizing the identified environmental event.

17. The method of claim 16, wherein the environmental event is a lightning strike and the trouble ticket associated with the line fault includes a location of the lightning strike.

18. The method of claim 16, wherein the report indicates that the lightning strike is within a threshold distance of the location of the line fault.

19. The method of claim 16, wherein the map comprises one of a schematic view and a geographical view of the portion of the electrical power distribution system.

* * * * *